(12) United States Patent  
Seale et al.

(10) Patent No.: US 6,208,497 B1  
(45) Date of Patent: Mar. 27, 2001

(54) SYSTEM AND METHOD FOR SERVO CONTROL OF NONLINEAR ELECTROMAGNETIC ACTUATORS

(75) Inventors: Joseph B. Seale, Gorham, ME (US); Gary E. Bergstrom, Moreland Hills, OH (US)

(73) Assignee: Venture Scientifics, LLC, Bedford, NH (US)

( * ) Notice: Subject to any disclaimer, the term of this patent is extended or adjusted under 35 U.S.C. 154(b) by 0 days.

(21) Appl. No.: 08/882,945

(22) Filed: Jun. 26, 1997

(51) Int. Cl.[7] .................................................. H01H 47/00
(52) U.S. Cl. ................................. 361/160; 361/154
(58) Field of Search ................................. 361/152, 154, 361/160

(56) References Cited

U.S. PATENT DOCUMENTS

| | | | |
|---|---|---|---|
| 2,399,065 | 4/1946 | Schleicher | 175/341 |
| 3,153,229 | 10/1964 | Roberts | 340/347 |
| 3,324,356 | 6/1967 | Kussy | 317/155.5 |

(List continued on next page.)

Primary Examiner—Fritz Fleming

(74) Attorney, Agent, or Firm—McDermott, Will & Emery

(57) ABSTRACT

Servo control using ferromagnetic core material and electrical windings is based on monitoring of winding currents and voltages and inference of: magnetic flux, a force indication; and magnetic gap, a position indication. Third order nonlinear servo control is split into nested control loops: a fast nonlinear first-order inner loop causing flux to track a target by varying a voltage output; and a slower almost linear second-order outer loop causing magnetic gap to track a target by controlling the flux target of the inner loop. The inner loop uses efficient switching regulation, preferably based on controlled feedback instabilities, to control voltage output. The outer loop achieves damping and accurate convergence using proportional, time-integral, and time-derivative gain terms. The time-integral feedback may be based on measured and target solenoid drive currents, adjusting the magnetic gap for force balance at the target current. Incorporation of permanent magnet material permits the target current to be zero, achieving levitation with low power, including for a monorail deriving propulsion from the levitation magnets. Linear magnetic approximations lead to the simplest controller, but nonlinear analog computation in the log domain yields a better controller with relatively few parts. When servo controlled solenoids provide actuation of a pump piston and valves, electronic LC resonance measurements determine liquid volume and gas bubble volume.

48 Claims, 14 Drawing Sheets

U.S. PATENT DOCUMENTS

| | | | |
|---|---|---|---|
| 3,671,814 | 6/1972 | Dick | 317/123 |
| 3,754,154 | 8/1973 | Massie | 310/30 |
| 3,846,682 | 11/1974 | Massie | 318/138 |
| 3,932,792 | 1/1976 | Massie | 318/119 |
| 4,150,653 | 4/1979 | Grancoin | 123/148 E |
| 4,368,501 | 1/1983 | Gingrich | 361/152 |
| 4,434,450 | 2/1984 | Gareis | 361/152 |
| 4,450,427 | 5/1984 | Gareis | 338/32 H |
| 4,479,162 | 10/1984 | Offutt et al. | 361/210 |
| 4,578,604 | 3/1986 | Eilertsen | 310/30 |
| 4,608,620 | 8/1986 | Hines | 361/154 |
| 4,638,279 | 1/1987 | Brisson et al. | 335/257 |
| 4,656,400 | 4/1987 | Pailthorp et al. | 318/135 |
| 4,659,969 | 4/1987 | Stupak | 318/128 |
| 4,665,348 | 5/1987 | Stupak | 318/135 |
| 4,700,165 | 10/1987 | Brisson et al. | 335/255 |
| 4,710,740 | 12/1987 | Dennisin | 335/248 |
| 4,793,263 | 12/1988 | Basic et al. | |
| 4,868,708 | 9/1989 | Bohn | 361/144 |
| 4,910,633 | 3/1990 | Quinn et al. | 361/144 |
| 4,978,865 | 12/1990 | Hartmann et al. | 307/140 |
| 5,053,911 * | 10/1991 | Kopec et al. | 361/154 |
| 5,093,754 | 3/1992 | Kawashima | 361/144 |
| 5,128,825 | 7/1992 | Hurley et al. | 361/154 |
| 5,264,982 | 11/1993 | Cox et al. | 361/144 |
| 5,267,091 | 11/1993 | Chen | 359/872 |
| 5,359,490 | 10/1994 | Oguro | 361/144 |
| 5,381,297 | 1/1995 | Weber | 361/153 |
| 5,406,440 | 4/1995 | Wieloch | 361/154 |
| 5,442,515 | 8/1995 | Wallaert | 361/187 |
| 5,442,671 | 8/1995 | Wollschlager et al. | 377/55 |
| 5,467,244 | 11/1995 | Jayawant et al. | 361/144 |
| 5,539,608 * | 7/1996 | Hurley et al. | 361/152 |
| 5,546,268 | 8/1996 | Hurley et al. | 361/154 |
| 5,602,711 | 2/1997 | Curtis et al. | 361/139 |
| 5,621,603 | 4/1997 | Adamec et al. | 361/154 |
| 5,673,165 * | 9/1997 | Kuhn et al. | 361/154 |
| 5,724,223 * | 3/1998 | Feuser et al. | 361/152 |

* cited by examiner

SYSTEM AND METHOD FOR SERVO CONTROL OF NONLINEAR ELECTROMAGNETIC ACTUATORS

BACKGROUND

1. Field of the invention

The present invention relates to systems and methods for controlling the movement of mechanical devices. More particularly, the present invention relates to the servo control of electromagnetic devices. Still more particularly, the present invention relates to the servo control of solenoids using the measurement of position and the approximation of position of the solenoid's armature to regulate movement of that armature. The present invention may be used in a variety of areas where lifting and/or propulsion is desired with minimum energy consumption.

2. Description of the Prior Art

A solenoid is a linear motor, inherently capable of efficient conversion of electrical to mechanical energy. In rotary motors, experience teaches that large size favors efficiency, and for a given size motor, the highest efficiency is obtained when there are very close clearances between stator and rotor parts and when operation is at high RPMs. Electrically speaking, a high frequency of magnetic reversals translates into a high rate of transfer of electromagnetic power. At low frequencies, resistive power losses wipe out efficiencies, while at constant magnitudes of peak magnetic flux, higher frequency translates into higher power transfer without significant increase in $I^2R$ resistive power loss. To avoid the eddy current losses associated with high frequency magnetic fields, rotary motors employ laminations in magnetic steels, or high-resistivity ferrite parts. Steels have a large advantage over ferrites at moderately low frequencies (particularly below 1 KHz) in their ability to handle flux densities up to about 2 Teslas, compared to ferrites at up to about 0.5 Teslas. The 4-to-1 advantage in flux density translates into a 16-to-1 advantage in energy density and magnetic force. Translating the rotary motor rules into the realm of solenoids, one can expect that efficient operation is fast operation. A fast solenoid must have a low shuttle mass, or alternatively, shuttle inertia may be cancelled by resonating its mass with a spring at the design operating frequency (as is done, e.g., in tuned magnetic vibrators for aquarium diaphragm pumps and barber clippers). As the counterpart of close clearances in rotary motors, solenoids operate efficiently at very short operating strokes, relying on high force and high frequency of operation to raise the power/weight ratio. Short strokes are effective only if, at the end of a power stroke, the entire magnetic circuit closes with minimal air gaps—a matter of efficient design. For a solenoid shuttle in non-resonant operation, a short stroke translates into a short stroke time, amounting to operation at high frequency and a high rate of change of magnetic flux, "$\Phi$," as the magnetic gap closes. A high rate of change of flux, i.e., a large "$d\Phi/dt$," translates into a high induced magnetic voltage in relation to resistive voltage. Induced voltage represents conversion between electrical and mechanical energy, while resistive voltage represents energy loss, so a large "$d\Phi/dt$" translates into high efficiency.

There are and will always be solenoids designed for utilitarian binary control operations, e.g., unlocking the downstairs front door: contexts where power efficiency is of minor importance and stroke length is a matter of feasibility and convenience, rather than a matter of efficient motor design. Magnetic steel solenoid parts are typically solid rather than laminated, because eddy current losses in dynamic operation are not a design consideration. Moving from the context of infrequent operation of a door latch to the very frequent operation of a print wire driver in a dot matrix print head, repetitive impact and consequent work hardening of the magnetic steel in a solenoid becomes a serious consideration. Magnetic materials for solenoids should ideally exhibit a low coercive force, i.e. a low inherent resistance to change in magnetic flux. In magnetic steels, low coercive force correlates with a large crystalline structure, attained through high temperature annealing to allow growth of large crystals. Annealed steels are mechanically soft and ductile, and their low-coercive-force property is described as magnetically soft. Repetitive stress and shock break up large crystals in steel, yielding a finer grain structure that is mechanically work-hardened and magnetically harder. Permanent magnets are optimized for high coercive force, or high magnetic hardness: the ability to retain magnetization against external influences. In solenoids, the mechanical work hardening of the steel takes place in a strong magnetizing field, leaving permanent magnetism in the solenoid circuit. The result is to cause the solenoid to stick in its closed position after external current is removed. This is a failure mode for print wire solenoids. A standard approach to keep solenoid parts from sticking is to cushion the landing at full closure, leaving an unclosed magnetic gap, typically through the thickness of the cushion material. This residual gap generates resistance to residual flux after power removal, reducing the tendency of the shuttle to stick closed. Residual magnetic gaps compromise efficiency in two ways: because the most efficient part of the magnetic stroke is approaching full gap closure, where the ratio of force to electric power dissipation is high; and because currents for maintaining extended closure must be made substantially higher to overcome the magnetic resistance of gaps.

Prior art techniques for servo control of solenoid motion and, more generally, magnetic actuation, are summarized well in the introductory section of U.S. Pat. No. 5,467,244, issued to Jayawvant et al: "The relative position of the object is the separation or gap between the control electromagnet and the object being controlled and in prior art systems is monitored by a transducer forming part of the control signal generator for the feedback loop. Such transducers have included devices which are photocells (detecting the interruption of a light beam by movement of the object); magnetic (comprising a gap flux density measurement, e.g. Hall plate); inductive (e.g. employing two coils in a Maxwell bridge which is in balance when the inductance of the coils is equal); I/B detectors (in which the ratio of the electromagnet coil current and magnetic flux is determined to provide a measure of the gap between electromagnet and object; for small disturbances the division may be replaced by a subtraction); and capacitative (employing an oscillator circuit whose output frequency varies with suspension gap)." Dick (U.S. Pat. No. 3,671,814) teaches magnetic sensing with a Hall sensor. In the succeeding description of "Apparatus for the Electromagnetic Control of the Suspension of an Object" Jayawant et al derive, from a generalized nonlinear electromagnetic model, a linearized small perturbation model for use in magnetic suspension of an object in the vicinity of a fixed target position. Specifically, they make use of what they call "I/B detectors" (see above quote) wherein the ratio of current "I" divided by magnetic field strength "B" provides an approximately linear measure of the magnetic gap. In text to follow, the ratio "I/$\Phi$" will be used in preference to "I/B" since inductive voltage measurements lead to a determination of the total flux "$\Phi$" rather than a local flux density "B." Specifically, as noted by Jayawant et al, the time derivative "n·dΦ/dt" equals the voltage electromagnetically induced in a winding of n turns linked by the magnetic flux "Φ." Thus, time integration of the voltage induced in a coil yields a measure of the variation in "Φ," and additional direct measurement or indirect inference of "I" leads to a determination of the ratio "I/Φ" used to close the servo loop. Where electrical frequency is substantially higher than the frequency associated with solenoid mechanical motion, the ratio "I/Φ" is also the ratio of the time derivatives "(dI/dt)/(dΦ/dt)," so that a measurement of the high frequency change in current slope "dI/dt," divided by the corresponding measured change in induced voltage across n windings, "V=n·dΦ/dt," again leads to a measure of position. One recognizes, in this latter ratio measurement, a measure of the inductance of a solenoid. It is well known that inductance can be measured by determining the natural frequency of an LC resonator having a known capacitance "C," a technique identified in the final part of the quotation from Jayawant et al, above. By either ratio technique, i.e. involving either a time integral of induced voltage or a time derivative of current, one determines position without the use of sensors apart from means to extract measures of current and induced voltage from the coil or coils employed as part of the actuation device. While these relationships are needed building blocks in the conception of the instant invention, they are not an adequate basis for a servo system generating large mechanical motions and correspondingly large changes in solenoid inductance. First, there are limitations to the linearized small-perturbation models taught by Jayawant et al for controlling large solenoid motions. Second, dynamic stability problems would remain even with a more complicated and costly servo implementation using non-linear circuit models, e.g., computing position as the ratio of current/flux and force as the square of flux, instead of Jayawant's tangential linear approximations of the ratio and square law relations. Where solenoid control is based on driving a winding with a voltage V in order to control a position X, the system to be controlled is fundamentally third-order, involving a nonlinear first order system to get from voltage to change in magnetic force (since voltage controls the first derivative of current in an inductive solenoid, and current change generates force change without significant delay), coupled to a second order system to make the two hops force to change in velocity and from velocity to change in position. It is understood that servo control over a third order system is prone to instability since phase shifts around the control loop, tending toward 270 degrees at high frequencies, readily exceed 180 degrees over the bandwidth for which control is desired. Phase-lead compensation as taught by Jayawant et al adds 90 degrees of phase margin, bringing at best marginal stability to an efficient electromechanical system. If electromagnetic efficiency is very low, so that resistance R dominates over inductive impedance ωL up to the servo control bandwidth of ω, then the third order nature of the system is not manifest where gain exceeds unity, and phase-lead compensation provides an ample stability margin. An example of such a low-efficiency system is found in Applicant's "Bearingless Ultrasound-Sweep Rotor" system (U.S. Pat. No. 5,635,784), where a combination of extreme miniaturization and lack of a soft ferromagnetic core places the transition from resistive to inductive behavior well into the kilohertz range. For the efficient actuation systems taught in the instant invention, the transition from resistive to inductive impedance can fall below 100 Hz. "Tight" servo control implies a relatively high loop gain over the bandwidth of significant mechanical response, implying a loop gain-bandwidth product well in excess of the bandwidth of significant mechanical response. A combination of high efficiency and tight control spell problems for loop stability, for even with single-pole phase lead compensation, minor resonances, e.g., from mechanical flexure, can throw the servo system into oscillation.

While Jayawant et al describe closed-loop servo control techniques applicable where perturbations in position from a fixed target position are small, Wieloch (U.S. Pat. No. 5,406,440) describes an open-loop control technique for reducing impact and mechanical bounce in solenoids used in electrical contactors. Prior art actuation had consisted of instantaneously applying to the solenoid winding the full voltage needed to close the contacts under all operating conditions, taking into account manufacturing variations in the spring preload holding the contacts open. The fixed actuation voltage was usually well in excess of the minimum requirement, and the result was actuation with excessive force and resulting severe contact bounce. Wieloch teaches to ramp the solenoid current up slowly so that when the magnetic force is just sufficient to overcome spring preload force and initiate motion, there will be little additional increase in average actuation voltage before the solenoid stroke is complete. Efficient current ramping is accomplished via a switching regulator, which applies a steadily increasing voltage duty cycle to the solenoid winding while winding current recirculates through a diode during intervals between driving voltage pulses. At a sufficiently high switching frequency, the inductance of the solenoid effectively smoothes the current waveform into a ramp. Similar switching regulation is found in preferred embodiments of the instant invention, but with greater control in order to overcome limitations in Wieloch's soft landing design. When a solenoid begins to close, the resulting "back EMF" due to armature motion tends to reduce electric current, in relation to gap, to maintain a constant magnetic flux, with the result that increases in force with gap closure are only moderate. (The simplified model of Jayawant et al, equation 9, implies no change at all for force as a function of gap closure at constant magnetic flux. In the specification below, Eq. 42 corresponds to equation 9 except for the slope function "$dx_{eff}/dx$," which Jayawant takes to be unity and which departs significantly from unity for moderate to large magnetic gaps, as indicated, e.g., in the approximate formulation of Eq. 20 of the following specification.) If a constant average voltage is applied to the winding (e.g., via constant duty cycle voltage switching at high frequency) and current begins to decrease with gap closure, then the current-limiting effect of resistance is reduced as current is reduced, so that the magnetic flux begins to rise. This can lead to an acceleration of a solenoid armature toward impact at full closure, depending on inductive time constants, mechanical inertia, and spring rate. Even under conditions where sufficiently soft landing is achieved, it is at the cost of a substantial excess energy consumption to generate a long ramp of pulse duty cycle and current, only the middle portion of which causes actuation. Adaptive adjustment of a pulse width or a pulse duty cycle during solenoid closure will be shown (below) to achieve soft landing under variable conditions with nearly the minimum net expenditure of electrical energy dictated by the given operating conditions.

Hurley et al (U.S. Pat. No. 5,546,268) teach an adaptive control device that regulates electric current to follow a predetermined function of the measured solenoid gap, in order to achieve a predetermined pull curve of the electromagnet. Though such a system responds to some of the limitations of Wieloch, it is not readily adaptable to an actuation system that must respond to changing conditions of starting position and the load force curve while achieving quiet, impact-free, efficient operation.

Both for controllability and energy efficiency, some solenoids have been designed with a region of operation in which stator and armature components have closely spaced parallel surfaces and the armature moves in-plane through a region of changing overlap, yielding a region of relatively constant actuation force at constant current. Eilertsen (U.S. Pat. No. 4,578,604) teaches such a geometry in a dual-coil device for linear mid-range actuation and a strong holding force at either end of the actuation stroke. Rotary actuation designs accomplish similar linearity properties using rotary overlap of parallel magnetic plates. The touchdown region where magnetic parts close in contact is commonly avoided in servo control contexts. Magnetic characteristics in this region have presumably been considered too nonlinear for practical control. In particular, the region of operation approaching full closure and contact of mating magnetic surfaces presents a very steeply changing inductance and correspondingly steep change in the sensitivity of force to change in coil current. For a solenoid operated below core saturation, the variation in magnetic force "F" with coil current "I" and magnetic gap "x" is described approximately by the proportionality "$F \propto (I/x)^2$." When the gap in a solenoid reaches mechanical closure, the "x" denominator in this proportionality goes nearly to zero, implying a nearly singular relationship between the control variables and the resulting magnetic force. Interpreting published families of static force/stroke/voltage curves exhibiting approximately this proportionality equation, the engineer is likely to conclude that a position servo control loop becomes unmanageably nonlinear over wide actuation ranges or on approach to full magnetic closure of the solenoid. As evidence of the prevalence of this assumption, FIG. 2 of the recent Jayawant patent (U.S. Pat. No. 5,467,244) illustrates the proportionality "$F \propto (I/x)^2$" for magnetic force as a function of distance and indicates a small region, designated by the symbol "$\Delta$," over which the curve is comparatively linear and amenable to linear control techniques, which are subsequently disclosed. What has gone unrecognized is that a reformulation of the control problem leads to division of the system into two well-behaved, coupled subsystems: a fast first-order controller using voltage to control magnetic force, and a slower second-order position servo using the force-control servo. The major system nonlinearities are confined to the robust first-order controller subsystem. Thus, from a control standpoint, there remains no advantage to magnetic geometries that linearize the relationship of force to armature motion, whereas one can now capitalize on the advantages of mechanical simplicity and economy in solenoid geometries that involve the mating of flat surfaces. Such simple geometries are found in the patent literature going back many years, e.g., to Kussy (U.S. Pat. No. 3,324,356). Such geometries give a strong nonlinearity of force with gap at constant current, which needs to be countered by appropriate controller design if the mechanical economies of flat geometries are to be realized.

Holding currents or drive voltages for solenoids are commonly set well below the peak currents or voltages needed to get a solenoid moving toward closure. Both drive and holding signal levels must, in open loop systems, be set high enough to insure closure followed by holding under all conditions, including variability in manufacture from unit to unit, including variability of power supply source (e.g., utility line voltage), and including variability in the mechanical load. Closed loop solenoid control offers a way to reduce both drive and holding signals to minimum practical levels. Yet problems with stability and nonlinearity inherent to magnetically soft ferromagnetic-core solenoids have impeded the development of servo solenoids, and therefore have prevented the potential efficiency advantages just described.

Solenoids have the potential for operating characteristics now associated with efficient motors: quiet impact-free operation, very frequent or continuous motion, and high efficiency at converting electrical energy to mechanical work. Reciprocating power from electricity is traditionally derived from a rotating motor and a cam or crank shaft, yet solenoids have been demonstrated, in the instant invention, to deliver reciprocating power at high efficiency, provided that the solenoid is designed to operate fast, in order to generate rapid changes of magnetic flux in its windings. In many reciprocating power applications, a solenoid with sophisticated control can offer greater simplicity and substantially tighter control than is achieved with a rotary motor and rotary-to-reciprocating motion conversion device. In the realm of control and sensing of external processes via a solenoid, the invention to be disclosed below can be configured to operate as a controller of position and simultaneous sensor of force, or as a controller of force and simultaneous sensor of position, or in an intermediate mode as a source of mechanical actuation with electrically controlled mechanical impedance characteristics, especially of restoration and damping. With rotary motors, such control has involved the use, e.g., of stepper motors used in conjunction with torque or force transducers, or of non-stepper motors used in conjunction with rotary position encoders and possibly torque or force transducers. The following specification will show a solenoid operated as the linear motor to drive a high-efficiency reciprocating pump, while two additional solenoids control the pump's inlet and outlet valves. All three solenoids operate silently and efficiently under servo control. This new system goes beyond objectives described and claimed in Applicant's U.S. Pat. No. 5,624,409, "Variable-Pulse Dynamic Fluid Flow Controller," a system using valve solenoid actuators that are mechanically similar to the ones described below and that achieve volumetric flow regulation from a pressurized fluid source over a very wide dynamic range of pulse volumes and rates. The system described below replaces the volume measurement device of Applicant's earlier invention with a solenoid that provides active pumping actuation in addition to fluid volume measurement, inferred from the position of the solenoid pump actuator, where that position is determined from measurement of the resonant frequency of the solenoid drive winding with a capacitor.

OBJECTS OF THE INVENTION

An object of the invention is control of the powered closure of a solenoid to eliminate closure impact and associated noise, efficiency loss, and progressive damage, including damage to the properties of the magnetic materials. Related objects are to eliminate closure impact through two strategies: a low-cost strategy called "launch control;" and a feedback strategy called "servo control." A further object is to employ servo control for dynamically maintaining a solenoid position in a hovering or levitating mode. A still further object is to employ servo control for smooth opening of a solenoid.

Within "launch control" an object is to infer, from current signals and/or induced voltage signals, a parameter to be compared to a threshold function for determining, dynamically, a time to terminate a launch pulse, such that the solenoid gap closes approximately to a target value short of full closure and short of impact.

Within mechanical "servo control," common terminology describes a sense parameter; indicating mechanical response of a servo system; a target parameter to be subtracted from the sense parameter and resulting in an error parameter; PID gain parameters describing three aspects of feedback amplification of the error parameter, namely: Proportional feedback; Integral feedback; and Derivative feedback; and a drive parameter arising from the summation of the P, I, and D feedback components and that determines the actuation output causing the controlled mechanical response. A servo control loop is characterized by a settling time constant, which may be defined by the shortest time interval beyond which an error parameter continues to be reduced by at least a specified ratio below an initial error defined at the start of the time interval. The settling time constant is generally minimized by an optimum combination of proportional and derivative feedback gains. Increasing of the integral feedback gain generally improves long term error reduction while increasing the settling time constant, thus degrading short term settling and, for excessive integral feedback gain, causing instability and oscillation of the servo system.

Within this descriptive framework, in the context of sense parameters for servo control, and where the magnetic gap of the solenoid is identified in the instant invention as the parameter to be sensed and controlled, an object is to employ a measure of solenoid current as a sense parameter of the servo loop. It is a related object to exploit the direct electromagnetic interaction between magnetic gap and solenoid current that inclines solenoid current to vary, in the short term and neglecting external influences, in approximate proportion to magnetic gap. It is a further related object to exploit the relationship demanding that, when a servo control loop causes electromagnetic force to balance against a mechanical load force, the result is to establish a solenoid current that necessarily varies in approximate proportion to magnetic gap. Given that, within the context of ongoing servo control, solenoid current is caused to vary in approximate proportion to magnetic gap, both in the short term due to the physics of the electromagnetic interaction, and in a longer term due to the force-balancing properties of the servo loop, it is an object to employ solenoid current as a sense parameter indicative of solenoid magnetic gap, including for servo control.

In an alternative embodiment of servo control employing an alternative sense parameter, the actuation output of the servo system is the output of a switching amplifier, which causes the voltage differential across a solenoid coil to switch between two known values with a controlled duty cycle, resulting first in duty cycle control over the coil current as averaged over one or more switching cycles, and resulting second in a measured AC fluctuation of the time derivative of current in the solenoid coil. That AC fluctuation varies monotonically and consistently with the magnetic gap of the solenoid, providing a repeatable measure of that gap. An object, therefore, in a solenoid system driven by a switching amplifier with duty cycle control, is to employ the measured AC fluctuation in current slope as a sense parameter of the servo controller.

Total magnetic flux through the solenoid and coils, designated Φ, is a valuable controller parameter related to magnetic force and to determination of magnetic gap, i.e. position. An object of the invention is to determine variation in magnetic flux in a controller by integration of the voltage induced in a coil linked by the solenoid flux. A further related object is to determine absolute flux by initializing the flux integral to zero for an open magnetic gap and when solenoid current is zero. A further related object is to determine induced voltage in the solenoid drive winding by subtracting an estimate of resistive coil voltage from the total voltage across the coil. A still further related object is to measure induced voltage in an auxiliary sense winding, coaxial with and electrically separate from the drive winding.

In the context of related drive parameters, sense parameters, and target parameters for servo control, an object is to split a solenoid control servo system functionally into coupled inner and outer loops with distinct drive, sense, and target parameters, and such that the inner loop has a substantially shorter settling time constant than the outer loop. A related object is to establish an outer control loop for which the sense parameter is a measure of position and the drive parameter is a signal related to force. The sensed measure of position may be a solenoid current, or a measured AC variation in a solenoid current slope, or an auxiliary measurement of mechanical position, e.g., via a hall effect sensor and permanent magnet or an optical sensor and a light source. A further related object is to establish an inner control loop for which the sense parameter is a measure of variation in magnetic flux, and for which the drive parameter of the outer loop defines at least an additive component of the target parameter being compared with the sensed measure of magnetic flux, and for which the drive parameter is a coil-drive voltage. Note that this drive voltage is the actuation output ultimately controlling mechanical motion in the solenoid. A still further related object is to establish an efficient voltage switching oscillation in an amplifier driving a solenoid coil, and to cause the duty cycle of that switching oscillation to vary such that the short-term-average voltage driving the coil is the voltage drive parameter of the inner loop. As a way of simplifying the electronic design of the servo system, an object related to the establishment of a switching oscillation with a controlled duty cycle is to design a controller loop with an intentional short-term instability that gives rise to switching oscillations having the desired characteristics.

We recognize that, over periods substantially longer than the time constant defined by the solenoid inductance/resistance ratio L/R, the average voltage applied to a solenoid coil determines the coil current, while inductive effects are "forgotten." We further recognize that the Integral component of PID feedback control is sensitive only to comparatively persistent or long term trends in the input error signal. From these recognitions, it follows that it is possible to substitute voltage or duty cycle for sensed current in the integral component of a PID feedback controller, with similar long-term results, even though settling characteristics will differ. An object is therefore to design controllers based on integral feedback whose sense variable may be drive current or drive voltage or drive duty cycle. For any of these choices of sense variable, the equilibrium magnetic gap established by servo control is dependent on a combination of mechanical load force and the controller target for the sense variable in the integral loop, i.e. the target for current or voltage or duty cycle. In any of these cases, an object of the invention is a controlled solenoid able to pull to near closure and hold there with a practical minimum of electric power. This can be accomplished by setting the bias for zero rate-of-integration at a signal level that is determined in advance to be sufficient to hold the solenoid at a finite gap. The solenoid of the instant invention can include permanent magnet material, so incorporated that a needed range for holding force is obtained, at zero drive coil current, over a corresponding useful range of the solenoid gap. In such a permanent magnet-incorporating embodiment, an object is to set the bias for zero rate-of-integration at or near zero drive coil current, so that except for power transients to compensate for perturbations from equilibrium, the control system achieves solenoid holding with vanishingly small drive power. With or without the inclusion of a permanent magnet, the moving element of the solenoid may be free-floating, in which case an object of the invention is to achieve stable electromagnetic levitation of a free-floating magnetic element. A further related object is to achieve levitation with a minimum of actuation power.

In controlling substantial currents to a solenoid winding, there are difficulties and disadvantages to incorporation of a current-sense resistor and associated differential amplification, including the difficulty of having to sense across a resistor whose common mode voltage swing travels outside the power supply range, and including the disadvantage of added power dissipation in the current-sense resistor. The differential voltage output provided by an isolated flux-sense winding, wound coaxial with the power drive winding, carries all the information necessary for the dynamic determination of both current "I" and magnetic flux "$\Phi$" when such a sense winding is used in conjunction with a switching mode drive. It is therefore an object of the invention to employ a sense winding for the determination of both coil current and magnetic flux in a switching mode solenoid controller.

From sense coil information, one can derive either the "integral ratio" designated "I/$\Phi$" or the "derivative ratio" designated "(dI/dt)/(d$\Phi$/dt)," or the "derivative difference ratio" designated "$\Delta$(dI/dt)/$\Delta$(d$\Phi$/dt)," any of these three ratios being a measure of effective magnetic gap and therefore a measure of position, for servo control. The integral ratio depends on a determination of absolute flux, as mentioned above and as feasible when the flux integral, as defined by integration of an induced voltage, can be initialized under known zero-flux conditions, e.g. zero flux for an open magnetic gap and a winding current of zero. A further limitation to absolute flux determination is integration drift, which introduces errors in an absolute flux determination if too much time elapses after initialization. Another disadvantage of the integral ratio is the requirement for division. In some embodiments of the instant invention, effective especially for servo control as the magnetic gap approaches close to zero and magnetic flux approaches a constant value that generates a force approaching balance with a constant load force, the denominator of the integral ratio is approximated as a constant, resulting in the use of current "I" as a sense parameter. This approximation fails, leading to an unstable control loop, under conditions of excessive loop gain or for excessively large magnetic gaps. A more robust controller therefore avoids the constant denominator approximation of the integral ratio and either computes the true integral ratio, or makes use of the derivative difference ratio, or makes use of a direct measure of position via an auxiliary sensor. In a switching regulator context, the denominator of the derivative difference ratio, namely $\Delta$(d$\Phi$/dt), is equal to 1/n times the peak-to-peak voltage swing of the switching amplifier output, where "n" is the number of turns in the drive winding. Thus, for a constant drive voltage swing, the denominator of the derivative difference ratio is constant, and the numerator varies in direct proportion to effective magnetic gap. An object, therefore, is to achieve a more robust controller, less prone to instability, by using an accurate measure of either the effective magnetic gap or the true geometric position as the sense parameter of the outer control loop. A related object is to use the ratio of current divided by flux, I/$\Phi$, as the sense parameter for the outer control loop. An alternative related object in a voltage switching servo is to use the peak-to-peak current slope amplitude, "$\Delta$(dI/dt)," or an approximate measure of this current slope amplitude, as the sense parameter of the outer control loop. For operation of a solenoid approaching full magnetic closure, the sawtooth current waveform resulting from a switching voltage drive becomes very unsymmetric, with short steep rises in current (when a drive voltage is applied) followed by much more gradual decreases in current where current is impeded by only a small resistive voltage and a small drop across a diode or on-state transistor. In this situation, the peak-to-peak current slope amplitude is well approximated by the positive-going current slope designated "I>0" where the much smaller negative current slope going into the difference "$\Delta$(dI/dt)" is neglected.

In controller contexts where sensing and servo control of true mechanical solenoid position is required over extended periods, where the time-integral determination of total magnetic flux will be prone to drift, effective magnetic gap "X" is determined without drift in a switching regulator context by the relation "X=K1·$\Delta$(dI/dt)" as described above, and magnetic force "F" is well approximated in relation to current "I" by the equation "F=K2·(I/X)$^2$" An object of the invention is therefore to construct a servo controller driving a solenoid drive winding with a switching amplifier and utilizing the oscillatory amplitude of current slope, or the positive-going current slope, as a drift-free measure of magnetic gap X. A related object is to use the square of the ratio of current to magnetic gap, (I/X)$^2$, as a measure of electromagnetic force. In an oscillatory feedback loop, only the sign of an inequality involving nonlinear variables need be determined in order to define the switching amplifier output as high or low at a given instant. Such an inequality involving ratios of variables and powers of variables is readily computed in an analog controller as an inequality involving logarithms of electronic variables, those logarithms arising from the inherent logarithmic voltage/current characteristics of semiconductor diodes or bipolar transistors. An object of the invention is therefore to design an oscillating servo controller circuit with output voltage switching based on the sign of an inequality involving logarithmic signals. A related object is to define a position sense parameter as an oscillatory amplitude of current slope. A further related object is to define a magnetic force as the square or the ratio of solenoid current divided by a position sense parameter. A still further related object is to employ a comparator circuit and logarithmic transistors to determine the sign of an inequality involving the logarithm of an oscillatory amplitude of current slope and the logarithm of current.

In systems applications of a servo controlled solenoid, it is sometimes useful to use the solenoid as a precision measurement device, where position of the solenoid armature correlates with a system parameter to be determined, e.g., fluid volume. When a solenoid is designed for good performance in a servo system, e.g., by employing a powder metal or ferrite core to avoid eddy currents that otherwise confuse electromagnetic measurements, and/or by including a flux sense winding in addition to the drive winding, then the solenoid becomes more useful and accurate as a position measurement device. As mentioned above, position, as related to effective magnetic gap, can be measured using any of the three ratios of current over flux, namely the integral ratio, the derivative ratio, or the derivative difference ratio. Yet another way to measure effective magnetic gap and infer position is by measurement of the resonance frequency of a solenoid winding coupled to a capacitor. Since the solenoid is capable of exerting a selectable or variable force while measuring position, it can therefore be used for the quantitative measurement of mechanical compliance. In a fluid-moving system employing solenoid actuation, measurement of position can be used to measure volume, and measurement of mechanical compliance can be used to measure fluid volume compliance, e.g., as an indication and quantitative measure of bubbles present in a substantially incompressible liquid. An object of the invention is therefore to make double use of a solenoid as an actuator and as a position measurement sensor. A related object is to use a solenoid to measure mechanical compliance. A related object in a fluid moving system is to make double use of a solenoid for pumping and fluid volume measurement. A further related object in a fluid moving system is to use a solenoid to measure fluid volume compliance, including as an indication and quantitative measure of bubbles in a liquid.

In an application of the invention for developing a sustained magnetic closure force for holding or magnetic bearing or magnetic levitation functions, an object is to combine permanent magnet materials with soft magnetic materials to generate a passive force bias, whereby the controller generates output drive currents that fluctuate about a zero average to correct for deviations from an unstable equilibrium point where steady magnetic force is derived entirely from the bias of the permanent magnet material. A related object is adaptively to seek out the levitating position for which the electric drive current required to hold velocity to zero is a zero drive current, and where non-zero drive current signals are integrated to generate a cumulative bias correction that drives the system toward the balance position calling for zero drive current.

In an application of the invention to magnetic levitation and propulsion of a monorail car, an object is to control multiple magnetic lifting modules in a common mode for regulating height of levitation, in a differential mode for regulating tilt, and in a variable-gain traveling wave mode for generating thrust through engagement of traveling magnetic waves with periodic ripples in a track. A related object for minimizing hysteresis and eddy current losses in a track is to generate lifting forces of magnetic attraction from magnetic fields directed mostly vertically and laterally relative to a longitudinal direction of motion, thereby generating magnetic flux in the track that remains relatively constant during the period of passage of a levitating car. A related object for minimizing lifting power is to combine permanent and soft magnetic materials for generating lift with a reduced or zero-average current to electromagnetic lifting modules.

SUMMARY OF THE INVENTION

The parameter X defined by $X=I/\Phi$, for solenoid primary winding current I and total flux $\Phi$ linking that winding, is called effective magnetic gap and varies approximately in proportion to the geometric gap of a solenoid with a flat-ended pole piece. This effective gap X is used in various solenoid servo controller embodiments, having the advantage of derivation from coil measurements without recourse to auxiliary sensors (e.g., optical encoders or hall effect devices.) The induced voltage Vi in a winding of n turns is given by $Vi=n(d\Phi/dt)$, so time integration of induced voltage yields a measure of variation in $\Phi$. For controllers starting with an open magnetic gap and zero solenoid current, the initial flux is zero, so integration of Vi from a zero initial condition at zero initial flux yields an absolute measure of $\Phi$. Vi in turn can be measured as the voltage differential across a solenoid drive winding, subtracting out the resistive voltage component IR for current I and winding resistance R. Alternatively, Vi can be measured directly from a sense winding wound coaxial with the drive winding, without need to subtract out a resistive voltage. Thus, effective gap X can be determined from a measurement of current and the integral of measurements of induced voltage, starting from an initial condition of zero. In the important situation where a solenoid is converging under servo control to rest at a near-zero value of gap X, where magnetic force is balancing a mechanical load that approaches a limiting force as gap X approaches its final, small value, then flux $\Phi$, the primary determinant of magnetic force, must necessarily approach a constant $\Phi_0$, as gap X closes to its final value. Under these circumstances, a controller can be based on the approximation that $1/\Phi \cong =I/\Phi_0$, so that the determination of flux and the division operation are both eliminated. An alternative approach to determination of effective gap X is based on AC inductance measurements, using the relation $X=n/L$ for inductance L in n windings. For precision measurements of X, appropriate for static or slowly changing X, a solenoid winding can be resonated against a capacitor C, measuring the resonant frequency, and solving mathematically for X. Resonance determination methods include: "pinging" with a transient excitatory pulse and monitoring of the ringing frequency; oscillation of a regenerative feedback loop involving the LC resonator; and phaselock loop techniques. For determination of X in a servo circuit where a switching amplifier drives the solenoid winding with a variable duty cycle, the peak-to-peak switching drive voltage, $\Delta V$, is related to the peak-to-peak change in current slope, $\Delta(dI/dt)$, by reciprocal inductance, which in turn is related to X. When $\Delta V$ is a constant pulse amplitude, then $\Delta(dI/dt)$ varies in linear proportion to X. In the important limit where gap X is approaching smoothly to a small final value, then the drive voltage pulses are becoming comparatively narrow, resistive voltage drop in the drive coil is becoming a small fraction of the on-state drive voltage, and the difference $\Delta(dI/dt)$ is approximated by the value dI/dt sampled when the drive voltage is on and the magnitude of I is increasing: a technique illustrated in FIG. 12 by the parameter labeled "I>0."

A servo control loop for operation of a solenoid includes a relatively slow outer loop for regulating magnetic force in order to control the sense parameter X, and a much faster inner loop to vary average output voltage in order to satisfy the force demand of the outer loop. More specifically, magnetic force varies approximately as the square of magnetic flux, i.e. $\Phi^2$, more or less independent of gap X. For the small fractional perturbations in total force that arise when a solenoid with a spring load converges to a target value of gap X, force is described by a constant plus a linear term in flux $\Phi$. Thus, the input sense parameter of the inner loop is X, and the output is $\Phi$, which controls force. This output is the input target parameter of the inner loop, whose output is typically duty cycle from a switching amplifier. Duty cycle drives current, which controls $\Phi$, the flux that is sensed at the input of the inner loop and compared to the target flux dictated by the outer loop. Flux also controls the magnetic force that causes variation in acceleration of the position parameter X, closing the second-order outer loop. X is compared to an externally-provided target, $X_0$, to yield the error signal of the outer control loop. Typically this error signal is processed by a linear transfer function whose output is characterized by the three gain terms of traditional PID control: a Proportional, a time Integral term, and a time Derivative term. The weighted sum of the P, I, and D terms, plus a bias constant corresponding to an estimate of $\Phi_0$, the flux expected at final equilibrium, yields the target flux from the outer loop to the inner loop.

This hierarchy of interacting loops with different speeds splits an inherently difficult-to-control, nonlinear third order controller into a second order linear controller (the outer loop) and a first order nonlinear controller (the inner loop). The rate behavior of the inner loop is approximately linear, since flux $\Phi$ is controlled by average output voltage V (averaged over variable-width pulses) and the controlling physical equation is $V=n(d\Phi/dt)$, a linear first order equation. The nonlinearity resides in a variable offset or inhoomogeneous term, IR, the component of voltage necessary for current I to overcome ohmic resistance R and maintain the current required to produce flux $\Phi$. This inhomogeneous term in the linear controller loop varies more or less in linear proportion to X for constant force, and nonlinearly with respect to required variations in magnetic force. In effect, the inner first-order control loop must respond to a time-varying input target and to a nonlinear time-varying voltage offset in its output (due to resistive voltage drop) in order to drive its input error to zero. Hence, a difficult nonlinear third order controller problem is segmented first by speed, to solve a first order equation rapidly and reduce the remaining control problem from third to second order, and second by confining nonlinearity to the simpler first-order loop, where nonlinearity appears as an innocuous variable offset term.

Means for measuring or determining the position parameter X were discussed above. Also mentioned was determination of flux $\Phi$ from integration of a measured induced voltage, either directly from a sense winding or with correction for resistive voltage drop from a drive winding. Where control of force is concerned, it is not necessary that the estimation of flux $\Phi$ be free from offset or drift with respect to time. The integral component of a PID control loop automatically corrects for offset and gradual drift in the estimation of flux. The control loop may also be designed so that the integration from induced voltage to flux, and from position error to the integral term of the PID controller signal, takes place in the same integrator, whose output is a sum of terms made immune to drift by the action of corrective feedback through the entire servo loop. In controller configurations where estimates of position X include linear terms in both current I and flux $\Phi$, the integral component of the PID loop may be based not on X, but on a correlate of X at equilibrium. For example, for a known range of static weight and/or spring forces at a holding value of X near zero, i.e. hovering at a negligibly small gap after impact-free solenoid closure, both the steady voltage and the steady current required to keep X in the required small range can be determined in advance. The integral control loop uses as its input, therefore, not X, but the voltage or current determined by the faster proportional and derivative components of the control loop. If the steady gap is "wrong" then the operating current and voltage will be off-target. Specifically, if the current and voltage are too high, relative to the target, this indicates that the magnetic gap X is too large, causing an excessive current demand to drive magnetic flux across the gap. Thus, paradoxically, the integral controller must gradually demand still more current, to drive X to a smaller value, so that less current is demanded. The magnetic force at constant current is destabilizing, with a smaller gap giving a greater force to close the gap more. The integral control loop is "unstable" or, specifically, regenerative, responding to an excess current with a rate of increase in current. The regenerative control loop interacts with the destabilizing magnetic property of the gap to give a stable closed loop behavior, as the product of two negative stabilities yields a positive stability.

A solenoid adapted for servo control based on sensed electromagnetic parameters is also well adapted for use as a position sensor, based on determination of the reciprocal of inductance, a parameter that is a well-behaved monotonic indicator of solenoid gap. Position sensing is employed in a pumping system for determination of pumped liquid volume and for quantitative determination of air bubbles present in a pumped liquid, as inferred from changes in solenoid position with changes in electromagnetic force.

In steady lifting and levitation applications, permanent magnet materials are combined with soft magnetic materials to generate a lifting bias force at zero cost in steady coil power. The principles of servo control and efficient switching-regulator drive taught elsewhere in this Specification are readily adapted to operation with a permanent field bias and to stabilization of an otherwise inherently unstable permanent-magnet suspension system. These principles are extended to levitation and tilt control in a levitated monorail car, whose propulsion is generated by a perturbation in the lifting magnets to generate traveling waves of magnetic field strength that are synchronized to the passage of ripples in the track.

In another application of the invention, where real-time closed-loop servo control is not required, knowledge of the known characteristics of the system is embodied in coefficients of a "launch control" apparatus and method, whose goal is to compute, in advance of launch, a pre-programmed sequence of pulses of predetermined starting times and widths, designed to move the solenoid armature, or shuttle, quickly and with a near-minimum of electrical energy consumption, from a starting position to a target finishing position. In systems contemplated here, this pulse sequence begins (and possibly ends) with a single launch pulse of duration designed to bring the solenoid armature to a stop at a target position. If that position is near magnetic closure but short of full closure and an impact click, and if the solenoid is to be held closed electromagnetically, then a pulse sequence follows to gently pull the armature the remaining distance to full gap closure, followed by pulse train at reduced duty cycle to maintain closure. In situations where the starting position is variable or otherwise unknown to the system software before launch time, then the initial position is measured either by electronically connecting a capacitor to a solenoid winding and using one of the resonance methods described earlier in this section, or by using a "probe pulse" from the solenoid driver to provide data adequate to compute a ratio of current/flux, "$I/\Phi$." The resonant frequency or the current/flux ratio thus determined is used to compute the previously unknown initial position or, more to the point, the parameters necessary to define a launch pulse duration. If the mechanical characteristics of the solenoid and load are well enough known in advance, then the pre-launch data alone is applied to an empirical formula describing the pulse width that will be required. There may be corrective adjustment for measured power supply voltage, as well as for power supply impedance based on measurements from recent launches (which is a significant issue for operation from an unregulated battery supply whose voltage and impedance will change as the battery is progressively discharged.)

If the unknown characteristics of the system include parameters that are not readily determined in advance of a launch, e.g., when an unknown effective preload force must be overcome to initiate motion of the solenoid armature from its initial position, then the launch control method includes an on-the-fly correction to the launch pulse duration. In a specific application of the launch controller to pumping with a solenoid-driven piston stroke, the effective preload force is affected by an unknown fluid pressure. Since the pressure is isolated from the solenoid by a valve (passive or active) that remains closed until roughly the moment in launch when the solenoid armature starts to move, the solenoid controller can obtain no advance knowledge of the preload forces that will affect launch. The effect of the preload force will first manifest itself to the system sensors as an advance or delay in progress toward gap closure. This progress is most readily observed in the waveform of current drawn by the solenoid during the launch pulse. Before the armature begins to move, the current waveform will describe an exponential decay from zero upward toward a resistive upper limit of current. Acceleration of the armature toward closure will rapidly curtail and reverse the upward trend in current. At any given instant, the value of current will be less than, equal to, or greater than a predetermined threshold function of time. When the sensed current waveform crosses the threshold function, the drive pulse is terminated and the solenoid coasts to its target. The shape of the threshold function is determined, in advance, to cause the desired outcome, which is generally to have the solenoid armature come to a halt slightly short of full closure and impact. When the armature is expected to have stopped, a pull-in pulse train may be applied to close the remaining gap, or valve closure may prevent the armature from falling back. A comparable threshold function may be defined for another sensed parameter, e.g., the output voltage from a sense winding. The sensitivity of the sense function to incipient armature motion may be enhanced by including time derivative terms of sensed current of induced voltage. In any case, a motion-sensitive sense parameter is compared to a threshold function of time, and the crossing of the parameter and the function causes launch pulse termination at a time predetermined to send the armature to the vicinity of a target.

Implementation of the invention summarized above relies on specific quantitative models of solenoid electromechanical dynamics. While parts of these models are to be found scattered among textbooks, the material to follow pulls together the mathematical and formula relationships necessary for the detailed implementation of the apparatus and methods taught. Following a list of the drawings, we begin with fundamental relationships and move forward to applied formulas.

SOLENOID PHYSICS AS APPLIED TO THE INVENTION

Figure 1:
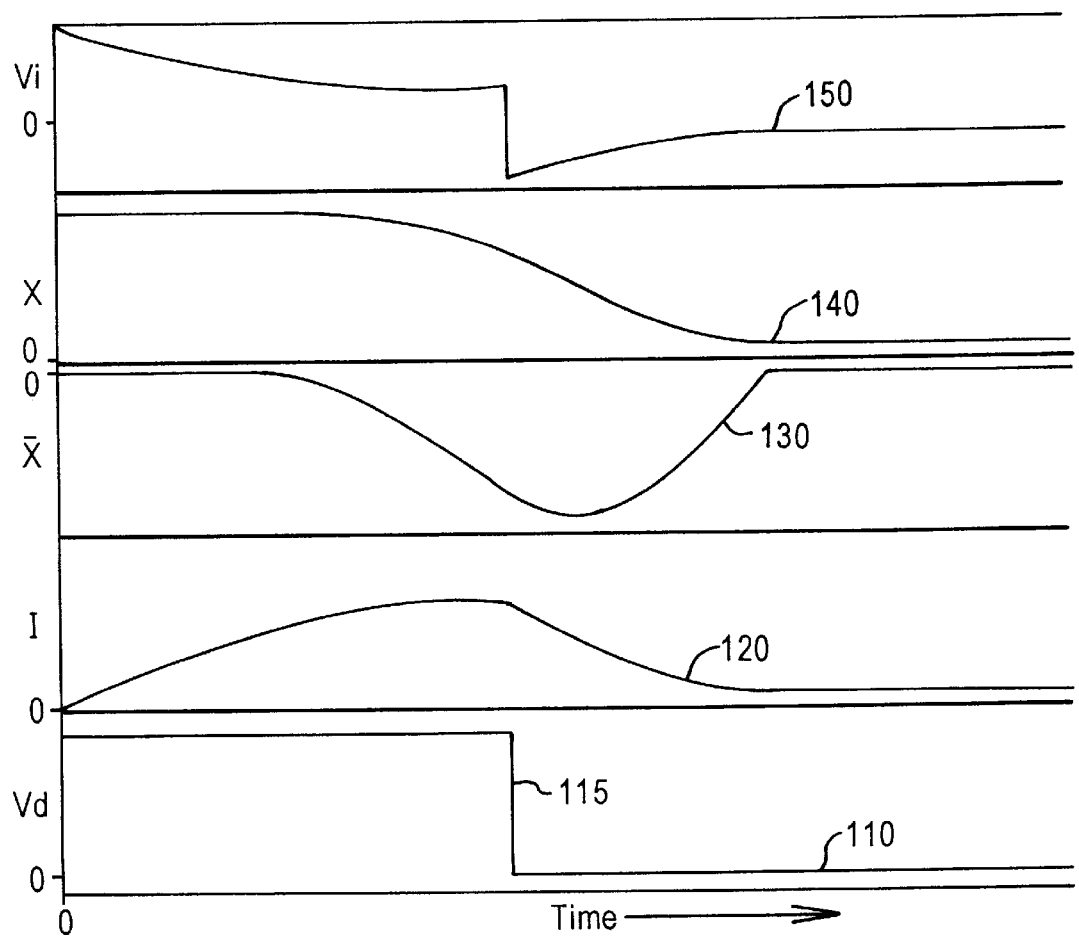
FIG. 1 illustrates parameter traces, against a time axis, typical of a controlled solenoid launch: the drive pulse, drive current, armature velocity, armature position, and induced voltage.

The mathematical formulas to be derived will be based on a few simplifying assumptions that, in engineering practice, are sometimes realized. It turns out that these assumptions are best realized for a new class of electromagnetic solenoid designs that are optimized for soft landing, as well as for options of two-point and four-point landing control (to be described later). It is difficult to measure electronic parameters adequate for servo control from a solenoid that has a low electromechanical efficiency. It will be seen that transformer-grade ferrites can be used in constructing fast-acting, energy-conserving, quiet solenoids whose electromagnetic characteristics are virtually "transparent" to a dynamic controller, yielding high-quality measures of mechanical position and velocity. The mating faces of existing designs for pot cores, E-E and E-I cores, U-U and U-I cores, are very well adapted for employing these components as electromechanical solenoid parts. The conductivity of iron in conventional solenoids permits eddy currents, which effectively limit the bandwidth for valid determination of position and velocity, as well as the bandwidth for quick closure through the inefficient region near full-open magnetic gap. Core fabrication from sintered powdered iron substantially overcomes these conductivity problems. Poor closure of the flux path further complicates electronic inference of position and velocity for feedback control, while simultaneously compromising electromechanical efficiency. Separating out these issues, then, there are three important assumptions whose relative validity affects both the validity of the mathematical derivations to follow, and the stability and precision achievable (or even go/no-go feasibility) in a soft landing servo system or launch control system:

1) For fixed shuttle position, solenoid behaves like a linear inductor.

Discussion: This is to validate the textbook inductor energy formula $E=\frac{1}{2}I^2L$. It is well known that ferromagnetic core materials are highly nonlinear, but when a small air gap is incorporated into an inductor design, its performance becomes very linear until the core material is pushed well up along its saturation curve. What is happening is that the air gap has a linear B vs H relationship, and the magnetic reluctance of the air gap dominates the total reluctance of the magnetic circuit. Commercial solenoids approximate linear inductors for all shuttle positions, except when pushing the maximum limits of force, since there is always enough effective air gap in the magnetic loop to wipe out core nonlinearity except in deep saturation at maximum forces. If a solenoid is designed intentionally for a very small effective gap when the shuttle is pulled in, e.g., to minimize holding current, then the equations to be shown below may be slightly inaccurate for the last few percent of travel before full closure of the solenoid gap.

2) Solenoid has no memory, so magnetic energy "now"= function of electric current "now".

Discussion: Two phenomena might invalidate this assumption: magnetic hysteresis, and eddy currents. Referring to assumption #1, concerning nonlinearity, the magnitudes of hysteresis effects are generally smaller than effects of saturation for solenoids operating at comparatively high flux densities (as is inevitable if a solenoid is reasonably compact for the mechanical energy of its stroke.) Thus, air gaps wipe out hysteresis effects in a similar way to wiping out nonlinearity effects, resulting is comparatively "memory-free" magnetic performance. If eddy currents are of sufficient magnitude, they will partially cancel the effect of current flowing into the solenoid leads in a time-dependent manner. The magnetic energy is a function of all currents, including eddy currents. At low frequencies, where magnetic skin depths are larger than the dimensions of conductive solenoid parts, the time constant for dissipation of eddy currents will be shorter than the time constant for change in drive current, and there will be little eddy current buildup. At high frequencies, with shrinking magnetic skin depths, material at skin depth or deeper will be shielded from the coil fields and thus effectively removed from the magnetic circuit, causing degraded performance and poor correlation with the mathematical model to follow. Ferrite solenoids will be effectively immune to eddy current effects.

3) The distribution of magnetic flux linking the winding does not change with solenoid position.

Discussion: In the derivations below, magnetic flux is treated as a simple scalar quantity with respect to inductance and back-EMF, as if the same flux links every turn in the winding. If the flux distribution is non-uniform, some turns get more flux than others, but the analysis is still valid for being based on an "effective" number of turns, so long as that number is constant. If the flux distribution through the windings changes significantly when the shuttle position changes and alters the magnetic gap, then the effective number of turns could change, violating the modeling assumptions. Furthermore, in designs that employ separate windings for generating and sensing magnetic flux, there may be a somewhat variable relationship between actuation and sensing as flux patterns in space change with changing shuttle position. There will inevitably be some gap-dependent redistribution of flux in the coil or coils, causing minor error in the mathematical model and in the control relationships between drive and sense windings. These issues are believed to be of minor practical importance in a controller context where, for most of the flight path of a solenoid shuttle, only very approximate control is required. As the shuttle approaches the position of full magnetic closure, more precise control of the flight path is required to achieve soft landing, but in that region near magnetic closure, virtually all magnetic flux will be confined in the core material, totally linking drive and sense windings. Deep core saturation will cause greater magnitudes of flux redistribution, introducing error into the analysis for certain operating conditions that push the envelope of solenoid operation.

Solenoid Force Equations

The derivation of the following formulas may be explained by a gedanken experiment: Assume that the solenoid winding is of superconducting wire, so that mathematically we ignore the effects of electrical resistance, which can be reintroduced separately, later. Imagine that, with the solenoid shuttle position fixed, voltage is applied until the current "I" reaches a specified level, at which time the total magnetic energy in the solenoid is $$E_{mgn} = \frac{1}{2}I^2L \qquad 1]$$

for magnetic energy "$E_{mgn}$," current "I," and inductance "L."

This is the textbook formula for a linear inductor. Now, short the superconducting winding, allowing current to continue circulating with no external connection that would add or remove electrical energy. Theory says that a superconducting surface is an impenetrable barrier to changes in magnetic flux, since induced currents at zero resistance will prevent the flux change. By extension, a superconducting closed loop or shorted winding is an impenetrable barrier against change in the total flux linking the loop, for if flux starts to change incrementally, the flux change will induce a current change in the superconductor that cancels the flux change. With no electrical energy entering or leaving the system through the wires, the sum of magnetic field energy plus mechanical energy must remain constant. Imagine that the solenoid shuttle pulls on an ideal spring that just balances the magnetic force "F" acting on the shuttle. We assume sufficiently slow motions that there is negligible kinetic energy and negligible acceleration force, so that magnetic force matches spring force in magnitude. We define "x" as the coordinate of the solenoid shuttle, such that an increase in "x" corresponds to an increase in the magnetic gap. We will conveniently define "x=0" as the position of full magnetic closure, giving maximum inductance. Magnetic force "F" pulls to close the magnetic gap and reduce "x," while the equal but opposite spring force pulls to open the magnetic gap and increase "x." We define "F" as a negative quantity, tending to reduce "x" and close the gap. If the shuttle moves a positive infinitesimal distance "dx," the spring does work to pull the solenoid more open, so the spring loses energy. Defining "$E_{mch}$" as mechanical spring energy, and given a negative magnetic force "F" balanced by an equal but opposite spring force, a positive travel "dx" result in a negative change in mechanical energy:

$$dE_{mch} = F \cdot dx \qquad 2]$$

for mechanical energy "$E_{mch}$," force "F," distance increment "dx."

When a total magnetic flux $\Phi$ links n turns of a solenoid coil, voltage across the coil has two expressions:

$$V_L = L(dI/dt) \qquad 3]$$

inductive voltage "$V_L$" from inductance and current change with time "t"

$$V_L = n(d\Phi/dt) \qquad 4]$$

inductive voltage from turns number "n" and change of flux "$\Phi$" with time

Setting the right hand terms of Eqs. 3 and 4 equal to each other and integrating with respect to time yields:

$$I \cdot L = n\Phi \qquad 5]$$

different expressions for "momentum" of inductor in volt-seconds

Assuming a superconductive shorted winding is equivalent to assuming $V_L=0$, in which case Eq. 4 implies that the flux $\Phi$ is constant over time:

$$\Phi = \Phi_0 \qquad 6]$$

flux is constant through time for shorted superconductive winding

With Eq. 6, Eq. 5 implies the constancy of the product I·L through time:

$$I \cdot L = I_0 L_0 \text{ for constant reference values } I_0 \text{ and } L_0, \text{ assuming } V_L = 0 \quad 7]$$

For this special shorted winding condition, substituting Eq. 7 into Eq. 1:

$$E_{mgn} = \frac{1}{2}I(I_0 L_0) \qquad 8]$$

assuming $V_L = 0$

Under these conditions, the differential in magnetic energy from Eq. 8 is:

$$dE_{mgn} = \frac{1}{2}(I_0 L_0)dI \qquad 9]$$

assuming $V_L = 0$

With no electrical power entering or leaving the system, the sum of magnetic plus mechanical spring energy is a constant, which means the sum of the differentials is zero:

$$dE_{mch} + dE_{mgn} = 0 \qquad 10]$$

Substituting in Eq. 10 from Eqs. 2 and 9:

$$F \cdot dx + \frac{1}{2}(I_0 L_0)dI = 0 \qquad 11]$$

Dividing through by the differential in distance, dx, in Eq. 11, and rearranging yields:

$$F = -\frac{1}{2}I_0 L_0(dI/dx) \qquad 12]$$

Using Eq. 7, we drop the subscripts from "I" and "L" in Eq. 12:

$$F = -\frac{1}{2}IL(dI/dx) \qquad 13]$$

Differentiating both sides of Eq. 7 with respect to x yields the expression:

$$L(dI/dx) + I(dL/dx) = 0 \qquad 14]$$

Solving for dI/dx in Eq. 14 and substituting this expression in Eq. 13 yields:

$$F = \frac{1}{2}I^2(dL/dx) \qquad 15]$$

Observe that "L" is a decreasing function of "x," so that "F" and "dL/dx" are both negative. Inductance is high when the magnetic gap is closed, so that a small current produces a large magnetic flux. Eq. 15 is based on conservation of energy with an equilibrium force balance and a zero-resistance coil. The expression has general validity, however, under more complicated conditions. Taking the total derivative of Eq. 1 with respect to "x" yields:

$$dE_{mgn}/dx = \frac{1}{2}I^2(dL/dx) + IL(dI/dx) \qquad 16]$$

Solving Eq. 14 for "dI/dx" in terms of "dL/dx" and substituting into the second term of Eq. 16 gives a negative contribution of "$-I^2(dL/dx)$," twice the size of the positive term, yielding:

$$dE_{mgn}/dx = -\frac{1}{2}I^2(dL/dx) \qquad 17]$$

Substitution from Eq. 15 now yields:

$$dE_{mgn}/dx = -F \qquad 18]$$

This serves as a consistency check. Force is negative, or attractive, in a solenoid, always tending to close the magnetic gap and drive positive "x" toward zero, so "−F" is positive. Eq. 18 therefore indicates that total magnetic energy in a solenoid with a shorted superconducting coil is an increasing function of gap. A spring pulling the gap open does work, which is transformed into magnetic energy. Inductance is reduced with increasing gap, but current is increased to keep the product of current and inductance, "IL," constant (recalling Eq. 7). With constant "IL," the energy product "½I²L=½I(IL)" is dynamically linear with current "I" and undergoes a net increase ,With increasing gap. Going in the opposite direction, if the magnetic circuit in a solenoid becomes a virtual "short circuit" at full gap closure, meaning that there are no air gaps to be bridged by magnetic flux and the relative permeability of the magnetic material is very high (figures of 1000 to 100,000 are common), then both current "I" and the energy product "½I²L" are driven dynamically to near-zero as the gap closes. This is true not only for the idealized case of a solenoid with a shorted superconducting winding initialized at some current before shorting, but for a real coil with electrical resistance and an applied drive voltage. Focusing attention not on voltage and current and changing inductance, but rather on the net magnetic flux, "Φ," that travels through the magnetic circuit, then for a solenoid gap approaching zero, magnetic force is more or less linear with the square of flux, "Φ²." There is a natural "inertia" resisting changes in "Φ," namely, the tendency for changes in "Φ" to generate compensatory changes in coil current and, in conductive magnetic materials, compensatory transient eddy currents. Thus, the combination of resistive voltage drop and coil drive voltage generates a time rate of change of flux, "dΦ/dt," but not an instantaneous response in "Φ."

Solenoid manufacturers typically publish families of curves showing force as a function of magnetic gap for various coil voltages. These curves bend steeply upward as the gap goes to zero, their slopes being limited at high coil voltages by magnetic saturation. It is common for the magnetic circuits in solenoids to include a significant non-closing net air gap, usually residing partly across an annulus between stator iron and the shuttle, and partly a cushion or minimum air gap maintained at the end of the shuttle, e.g., by a mechanical stop located away from the critical site of magnetic closure. Experience has shown that allowing uncushioned magnetic parts to impact together generates noise, shock, and some combination of surface damage, work hardening, and magnetic hardening of the material near the impact site. Magnetic hardening results in retention of a permanent magnetic field after the solenoid current is removed, and sticking of the shuttle in its full-closed position. Eliminating air gaps and pushing the design toward full closure of the magnetic flux loop would seem to invite problems of uncontrollable dynamics and a worsening singularity where force tends toward infinity as the gap closes. These appearances are deceptive, being based on steady state relationships among voltage, gap, and force. Dynamically, as a magnetic solenoid gap closes, flux and force tend not to change rapidly, and solenoid current tends to be driven toward zero with closing gap because the solenoid naturally resists abrupt change in total magnetic flux.

The alternative to mechanical prevention of impacting closure of a magnetic gap is dynamic electronic control, taking advantage of inherently favorable dynamic properties of the system and employing servo feedback to avoid impact. The optimum physical design of a solenoid changes substantially in light of the possibilities for dynamic electronic control. If there is full magnetic closure, then the point of full mechanical closure becomes virtually identical (typically within tenths or hundredths of a millimeter) with the point of zero magnetic reluctance, so that the target for a zero-impact soft landing controller is readily and consistently identified. With full closure, the holding current needed to keep a solenoid closed under mechanical load becomes almost vanishingly small. If parts mate too well, there can be problems of sticking due to residual magnetic flux at zero coil current, even with undamaged, magnetically soft materials. If needed, a little AC wiggle to the coil current will reliably unstick the shuttle—a function that needs to be automated in the controller implementation. Expanding on a previous statement of definition, the combined strategies of electromagnetic design, including flux-sensing coils as well as drive coils, and including coordinated electromagnetic, mechanical, and electronic design (including analog and digital software parameters) are collectively called "soft landing." Related to soft landing, as mentioned, are the strategies and designs for two-point landing and four-point landing, which may optionally be combined with soft landing to achieve good electromechanical performance within a simplified and error-tolerant mechanical design.

An Approximate Model For Inductance Versus Gap

Eqs. 19 and 20 give an approximate model for inductance "L" as a function of gap "x."

$$L = \mu_0 n^2 A / x_{\textit{eff}} \qquad 19]$$

Eqs. 19a, 19b, 19c, and 19d, easily derived from Eq. 19, are included here for completeness. Solving first for the effective magnetic gap in terms of inductance:

$$x_{\textit{eff}} = \mu_0 n^2 A / L \qquad 19a]$$

If inductance "L" is determined from measurement of a resonant frequency, $$\omega = 2\pi f \qquad 19b]$$

for measured frequency "f" in Hz giving "ω" in seconds⁻¹, where the unknown "L" is resonated with a known capacitance "C", then recalling the basic resonance formula, $$\omega^2 = 1/LC \qquad 19c]$$

it follows from Eqs. 19a and 19c that:

$$x_{\textit{eff}} = \mu_0 n^2 A \omega^2 C \qquad 19d]$$

Eq. 19 is the formula for inductance with a "pillbox" magnetic field, where the magnetic circuit has no magnetic resistance except across a space between parallel circular plates of area "A" and spaced by the distance "$x_{\textit{eff}}$." The turns count is "n" and the permeability of the gap volume is "$\mu_0$." The formula is based on a hypothetical magnetic field that is constrained not to spread out in the space between the plates, but instead is confined to a cylindrical path (e.g., as if by a superconducting cylinder). In a realizable situation, the performance of an actual gap "x" between parallel surfaces of a magnetic conductor approaches the ideal in the assymptotic limit of a small gap, i.e., "$x_{\textit{eff}}/x \to 1$" as "$x \to 0$," in which limit the field lines become parallel except for a shrinking "bulge" region around the area perimeter, where the width of the bulge shrinks in proportion to the height "x." As the gap widens, the field spreads out over a larger effective area than the actual area of the parallel plates, thus causing the inductance-determining ratio "$A/x_{eff}$" to exceed the physical ratio "A/x." This is modeled not by increasing the area "A" in the formula, but instead by reducing "$x_{eff}$" to a value smaller than the actual gap "x" as in approximate Eq. 20:

$$x_{eff} = (x_0/K)(1 - 1/(1 + (x + x_{\min})/x_0)^K) \qquad 20]$$

approximately

The inverse of Eq. 20 is also useful:

$$x = x_0 \cdot ((1/(1 - K \cdot x_{eff}/x_0)^{1/K}) - 1) - x_{\min} \qquad 20a]$$

approximately

Given electrical measurements to determine either inductance "L" or the radian frequency "ω" that resonates with a known capacitance "C", then Eq. 19a (from "L") or 19d (from "ω") yields a value for "$x_{eff}$" whose substitution into Eq. 20a yield the geometric gap "x". Discussion is provided later for dynamic determination of inductance "L" from time-integration of a magnetically-induced voltage, and for determination of "ω" from ringing measured in a driver/sensor circuit.

When actual "x" goes to zero, there is some residual resistance (specifically: reluctance) to the magnetic circuit, associated with small air gaps, with imperfect mating of the stator and shuttle where they close together, and with the large but finite permeability of the ferromagnetic material in the flux path. This resistance is equivalent to a small residual air gap $x_{min}$. Eq. 20 is designed so that the parameter "$x_{eff}$" is asymptotic to the sum "$x+X_{min}$" as that term goes to zero. As gap "x" increases, "$x_{eff}$" begins to increase more slowly than "x," at first due to the spreading of the magnetic field over an increased effective area. As the solenoid shuttle is further removed, flux begins to bridge across gaps in the solenoid structure until, when the shuttle is completely removed, i.e. as "x→," there remains a finite effective distance that magnetic flux must span, jumping between magnetic surfaces with no help from the permeability of the shuttle. This asymptotic limit is "$x_0/K$." This limit is unimportant to the practical modeling of a solenoid, since the shuttle in a practical solenoid is only operated over a limited range of travel. What is important is that the scaling parameters "$x_{min}$," "$x_0$," and "K" be adjusted for the best fit to empirically measured inductance over the intended range of travel for the variable "x." Once this data fit is performed for a particular shape of magnetic core and shuttle, the results are readily extrapolated to other sizes having the same shape. The exponent "K" will be a characteristic of the shape. The length scaling parameter $x_0$ is some fraction of a specific dimension of the assembly. For example, for a typical shape of pot core, with one half serving as the stator and the other half serving as the shuttle, a good fit is obtained by setting K=1.5 and $x_0$=0.16D where "D" is the diameter of the center pole piece. The value for $x_{min}$ depends strongly on how accurately the surfaces mate, but for a tested pot core with an outside diameter of 50 mm, the ratio $x_{min}$=0.01$x_0$ was obtained. The practical result is that the minimum effective gap is quite close to zero.

A valuable approximate formula for force is derived from substituting from Eqs. 19 and 20 into force Eq. 15. First expanding Eq. 15 in terms of "$x_{eff}$":

$$F = \tfrac{1}{2}I^2(dL/dx_{eff})(dx_{eff}/dx) \qquad 21]$$

Differentiating Eq. 19 gives an expression for the first derivative term of Eq. 21:

$$F = -\tfrac{1}{2}I^2(L/x_{eff})(dx_{eff}/dx) \qquad 22]$$

Differentiating Eq. 20 gives an approximation for the last term of Eq. 22:

$$F = -\frac{1}{2}I^2(L/x_{eff})(1/(1 + (x + x_{\min})/x_0)^{K+1}) \qquad 23]$$

approximately.

Expanding "L" from Eq. 19 in Eq. 23:

$$F = -\frac{1}{2}I^2(\mu_0 n^2 A/x_{eff}^2)(1/(1 + (x + x_{\min})/x_0)^{K+1}) \qquad 24]$$

approximately

In is not useful to show further expansion of Eq. 24, since no simplifications arise to boil the expanded result down to a simpler formula. Since "$x_{eff}$" is asymptotic to "$(x+x_{min})$" for small values, and since the last term in Eq. 24 approaches unity for small values of $(x+x_{min})$, Eq. 25 is an asymptotic approximation to Eq. 24:

$$F = -\frac{1}{2}I^2\mu_0 n^2 A/(x + x_{\min})^2 \qquad 25]$$

approximately

Not obvious without numerical computation is that Eq. 25 is a surprisingly good approximation of Eq. 24 over the entire range of the non-dimensional distance parameter "$(x+x_{min})/x_0$" that is likely to be useful in engineering computation. For K=1.5, Eq. 25 overestimates Eq. 24 by just over 5% when the non-dimensional distance parameter "$(x+x_{min})/x_0$" reaches 1.0, and by just over 1.7% for the distance parameter at 0.5. Noticing that in designs that close the magnetic circuit tightly, "$x_{min}$" is a small fraction of the useful range of "x," we can write an even simpler approximate expression that aids in seeing important physical relationships:

$$F = -\frac{1}{2}I^2\mu_0 n^2 A/x^2 \qquad 26]$$

approximately

Dissipation of power in a solenoid coil is $I^2R$ for resistance "R." Force is linear with power dissipation. Force is also linear with pole face area. If a solenoid is scaled up in size while retaining the same number of turns, "n," and adjusting the wire gauge to fit the larger space, then the increased cross-section of the wire outpaces the increase in winding length, so that resistance varies inversely as the linear dimension "D" of the solenoid. The effect of reduced resistance reinforces the efficiency advantage of increased area as scale is increased. The increase of solenoid mass with size reduces the efficiency advantage in a configuration that uses a much reduced holding current after solenoid closure, because the greater mass of a larger solenoid tends to make it respond more slowly and require more time in the inefficient wide-open range. What is especially apparent is the reciprocal square of solenoid gap in the denominator of Eq. 24. The ratio of force/power is much more favorable for small gaps, and small gaps will be closed more quickly, meaning that reduction to a holding current occurs more quickly. These considerations are summarized in the proportionalities expressed by Eqs. 27 through 27c, based on Eq. 26 (complete derivation not provided here). Eq. 27 describes, for a specified output of mechanical Energy per stroke, "$E_s$," how the Power dissipated in electrical resistance, "$P_d$," varies as a function of the stroke length "x" and of a characteristic linear dimension "D" (e.g., the diameter of a pole piece):

$$P_d \propto x \cdot E_s / D^3 \qquad 27]$$

proportionality based on approximate Eq. 26

Energy per stroke "$E_s$" is defined for this derivation as the force "F" developed at gap "x" multiplied by that gap, i.e. "F·x," though the same proportionality holds true if "F" varies as a function of the stroke going from "x" to zero in such a way that the shape of the force curve is maintained with resealing of "F" and "x" such that the ratio of actual stroke energy "$E_s$" to the product "F·x" is maintained constant.

Moving from rate of power dissipation to net energy to accomplish a stroke, if the acceleration of the shuttle is limited by the mass "M" of that shuttle, and if proportional scaling of the moving part is maintained so that "M" varies in proportion to the cube of the characteristic dimension "D," i.e. M D$^3$, then one obtains a stroke time "$t_s$" whose proportionality to the parameters of the system is expressed by.

$$t_s \propto \sqrt{D^3/E_s} \qquad 27a]$$

Under the circumstances where solenoid inertia is the limiting factor for stroke time, such that Eq. 27a is valid, then the Energy dissipated in electrical resistance, "$E_d$," varies in proportion to the product "$P_d \cdot t_s$" as shown in the following equation:

$$E_d \propto x^2 \sqrt{E_s/D^3} \qquad 27b]$$

absolute loss, acceleration limited by solenoid mass

Eq. 27c expresses the same proportionality as a loss ratio:

$$E_d / E_s \propto x^2 / \sqrt{E_s \cdot D^3} \qquad 27c]$$

loss ratio, acceleration limited by solenoid mass

Since mass "M" varies as "D$^3$" we can rewrite Eqs. 27b and 27c in terms of "M":

$$E_d \propto x^2 \sqrt{E_s/M} \qquad 28]$$

absolute loss, acceleration limited by "M"

$$E_d / E_s \propto x^2 / \sqrt{E_s/M} \qquad 28a]$$

loss ratio, acceleration limited by "M"

If a solenoid drives a load through a lever that provides some ratio of mechanical advantage or disadvantage, so that solenoid stroke length "x" may be varied at will in a design while maintaining a constant curve of force versus stroke position at the load side of the lever, and if the solenoid mass is the limiting factor for acceleration, then the above formulas for "$E_d$" apply. If the mass on the load side of the lever is predominant in limiting acceleration, then Eq. 27a is invalid, stroke time "t" becomes more or less a constant, and stroke energy becomes proportional to that constant stroke time "t" multiplied by "$P_d$" of Eq. 27. Many real world designs will lie somewhere between the proportionalities for "$P_d$" and for "$E_d$." The situation where solenoid inertia is rate-limiting places a higher efficiency premium on reduced stroke length, whereas the situation where the load is rate-limiting places a lesser premium on reduced stroke length and a higher premium on increased solenoid size, expressed either by a characteristic dimension "D" or a characteristic mass "M." In either case, these formulas make it clear that to obtain work from a solenoid at high efficiency, and provided that it is feasible to trade off reduced stroke for increased force at constant stroke energy, then there is a strong advantage to keeping the stroke length as short as possible. For a fixed size of solenoid, this implies driving the solenoid to achieve the largest possible force. Force varies as "B$^2$," the square of the field strength at the pole faces, and saturation of the core material of the solenoid places a constraint on the maximum magnitude of field strength "B." Optimization by reduction of stroke "x" and increase of force "F" to maintain a constant energy product "F·x" at constant dimension "D" will obviously drive the magnitude of "B" upward until saturation becomes a limiting factor in the design. One thus encounters a boundary to the application of the above equations for optimization. Working at the saturation boundary, there is an advantage to increasing solenoid size and poleface area, which at constant stroke energy allows one to reduce stroke "x" inversely as the square of dimension "D," thus keeping the swept stroke volume "x·D$^2$" constant. In this case, x$^2$ 1/D$^4$, and 1/D$^4$ is multiplied by 1/D$^{1.5}$ from the denominator of Eq. 27b or 27c to yield a net scaling of dissipated energy as the power law 1/D$^{5.5}$ for the solenoid-inertia-limited case. Similar considerations lead from Eq. 27 to a dissipated energy power law 1/D$^{5.0}$ where stroke time is load-limited. Under all the circumstances described above, there is a strong efficiency advantage in using a big solenoid with a short stroke for a task requiring a given stroke energy, where this is feasible. When one reaches a minimum practical stroke, e.g., because of dimensional tolerances, then further increases in solenoid size at a fixed stroke "x" yield much more marginal efficiency returns. Diminishing returns of a different sort are encountered if a solenoid is so efficient as a motor that dissipated energy "$E_d$" is no longer large compared to stroke energy "$E_s$," an operating region where efficiency is so high that there is little net energy to be saved by further efficiency improvement. This happy situation is seldom realized in practice.

It is well known that metallic iron and magnetic steel alloys have a substantially higher saturation B-field than ferrites, e.g., about 2.0 Teslas for iron as against about 0.5 Teslas for ferrites, roughly a 4-to-1 advantage. This translates into roughly a 16-to-1 advantage for maximum force at a given size, e.g., a maximum characteristic dimension "D." Maximization of force, however, is quite different from maximization of efficiency. Eqs. 27 through 28a imply an efficiency advantage to making a solenoid larger that the minimum size dictated by core saturation. Where efficiency optimization drives the solenoid size large enough that saturation will not occur in a ferrite core, then ferrite has the advantage of lower density than iron, implying a quicker stroke. While magnetic core hysteresis loss is a major consideration in transformer design, hysteresis is a very minor issue in solenoid designs, since the magnetic reluctance of the air gap is predominant in controlling the relationship between winding ampere-turns and the field strength that determines force. Thus, sintered powdered iron cores, which are cheaper but more lossy than ferrites in high frequency transformers, perform about as well as ferrites in solenoids at low flux densities while providing a substantially higher saturation field. In the servo control and measurement strategies to be described below, based on measurements of the voltages electromagnetically induced in solenoid windings, the electrical conductivity of solid iron or steel solenoid parts can present substantial problems for accurate determination of solenoid position. These problems are overcome to some degree with higher-resistivity powder metal cores and even more with ferrite cores. Where extremely high acceleration is demanded in a solenoid core, e.g., in moving an automotive engine valve through a prescribed stroke in a time period constrained by high engine RPMs, then iron or powder metal solenoid parts will accelerate faster than ferrite parts due to the higher achievable flux density.

The above proportionality optimization equations are based on constant shape of the solenoid pole pieces. When varying taper of the pole faces enters the optimization process, this adds considerable complication to the analysis. For a given size of solenoid and a given stroke energy requirement, use of tapered pole pieces confers little advantage or disadvantage (the particulars depending strongly on the pattern of saturation of inductor material) except where constraints demand a long stroke, in which case tapered pole pieces can offer some advantage. There is some advantage to shaping a solenoid so that most of the magnetic flux path is in the stator, to minimize shuttle mass and thereby minimize the duration of a stroke. Solenoids whose shuttles are cylinders many diameters in length are at a disadvantage for mass minimization. This patent specification will disclose some flatter solenoid geometries that help maximize gap area, minimize moving mass, and in some contexts simplify the task of guiding the motion of the solenoid shuttle, avoiding the traditional bushing design that can suffer from wear problems in high-duty applications.

Electromechanical Behavior of a Solenoid

In deriving Eqs. 1 through 26, we conceptually prevented dissipative electrical energy transfer by assuming a resistance-free, shorted coil, thus simplifying the physics. The derivation of Eqs. 27 through 28a, not shown completely above, introduced electrical resistance. The following derivations conceptually permit exchange of electrical energy with the magnetic circuit via coil current and the combination of externally applied voltage and internal voltage drop due to resistance. The inductive voltage of Eq. 4, which promotes change in coil current, is provided by an external drive voltage from which is subtracted a resistive voltage loss:

$$V_L = V_{ext} - I \cdot R \qquad 29]$$

The resistive voltage drop "I·R" neglects skin effect, which is usually negligible in coil windings at frequencies for which it is possible to overcome the mechanical inertia of a solenoid shuttle and induce significant motion. Skin effect may be significant in metallic alloys of iron and nickel (the primary ferromagnetic components of solenoids), cobalt (the more expensive ferromagnetic element, less likely to find use in solenoids), chromium (an anti-rust alloying component), and the other trace elements commonly appearing in solenoid alloys. Ferrites do not share this problem. High magnetic permeability in a conductive material has the effect of reducing skin depth very substantially, so that skin currents in the shuttle and stator components of a solenoid can transiently shield underlying magnetic material from a coil field and reduce the dynamic response of the solenoid. Reiterating caution number 2 under "SOLENOID PHYSICS AS APPLIED TO THE INVENTION," the performance analysis that follows will, for some geometries and materials, be overly optimistic concerning the speed of solenoid response and concerning applicability of the methods being derived here for servo control. This author and a colleague have measured solenoids in which change of inductance with shuttle position is dramatic and readily observed over a broad band of frequencies, and other solenoids in which impedance is almost purely resistive in an below the audio frequency band, with shuttle-position-indicating changes in the inductive component of impedance being detectable only with effort at sorting out in-phase and quadrature-phase impedance components. Solenoids in the latter category are not good candidates for the kind of control described herein.

Eq. 7, indicating the constancy of the product "I·L," implies a formula for the partial derivative of current with respect to inductance when x varies. To get the total derivative of current with respect to time, we need to consider the partial derivative with time associated with inductance L and voltage $V_L$, plus the partial derivative of current with inductance multiplied by the change of inductance with time:

$$dI/dt = \delta I/\delta t + \delta I/\delta L \cdot dL/dt \qquad 30]$$

The partial derivative of current with time is the effect of applied voltage, the familiar expression for fixed inductances:

$$\delta I/\delta t = V_L/L \qquad 31]$$

The partial derivative of current with inductance is derived from Eq. 7:

$$\delta I/\delta L = -I/L \qquad 32]$$

Substituting Eqs. 31 and 32 into Eq. 30 yields:

$$dI/dt = V_L/L - (I/L)(dL/dt) \qquad 33]$$

Expanding $V_L$ according to Eq. 29:

$$dI/dt=(V_{ext}-I\cdot R)/L-(I/L)(dL/dt) \quad 34]$$

A finite difference expression equivalent to Eq. 34 as time increment "dt" approaches zero suggests an approach for numerical integration:

$$I_{n+1}=I_n(L_n/L_{n+1})+dt\cdot(i\ V_{ext}-I\cdot R)/L \quad 35]$$

Our mathematical description is almost sufficient to simulate the response of a solenoid, so that the understanding gained can be used to design the analog circuit operations and digital methods of a working controller. Eq. 15, defining force as a function of current and inductance, will be needed, as will Eqs. 19 and 20, defining inductance as a function of gap "x," plus either Eq. 34 or 35 to simulate the changing electric current, and finally an equation for shuttle acceleration, including a description of the mechanical load. One load description is incorporated into Eq. 36, which describes the acceleration of a shuttle of mass "M" driven by magnetic force "F" and by a spring having linear spring rate "K1" and biased from an unstressed shuttle position "$x_1$" to the actual present shuttle position, "x:"

$$d^2x/dt^2=(F+K1(x_1-x))/M \quad 36]$$

Having developed the tools to model the motion of a solenoid, we require something in addition to exert servo control for soft landing: a method for measuring or inferring shuttle position. An obvious approach taken in past art is to provide an extra transducer to serve solely as a position sensor. It is feasible, however, to infer shuttle position, or a useful smoothly-varying monotonic function of shuttle position, from inductance measurement or inference from related parameters. The parameter "$x_{eff}$" appearing in Eq. 19, and approximated by Eq. 20 as a function of "x," may be inferred with reasonable accuracy from measurement of the electrical response in solenoid windings. For achieving soft landing, it is not necessary to transform "$x_{eff}$" into the linear Cartesian coordinate "x." The only advantage of such a transformation is to obtain a position variable for which the effective value of mass "M," e.g., in Eq. 28, is a constant. In the nonlinear coordinate "$x_{eff}$," the effective mass will vary somewhat, altering the equations of motion but not preventing a control method from functioning to bring a solenoid shuttle to a target position and land it with a low velocity at contact.

A pair of readily determined parameters to define "$x_{eff}$" consist of total magnetic flux "$\Phi$" and coil current "I." Recalling Eqs. 3, 4, and 5, inductive voltage $V_L$ is related to both inductance and flux. These equations are based on a fixed inductance, but Eq. 4 is valid even for time-varying inductance, being based on the fundamental relationship between voltage and magnetic flux cutting across a conductor. Eq. 5 also has general validity, allowing one to solve for inductance "L" when current "I" and flux "$\Phi$" are known, including when "L" varies with time. To determine $\Phi$ during the operation of a solenoid, one has a reference point when the solenoid gap is fully opened and no current is flowing: $\Phi=0$. Residual magnetism in the solenoid core material will have a negligible effect for a material with low coercive force and in the presence of a large air gap. External magnetic fields will be insignificant compared to the magnitudes of normal operation. The most straightforward way to determine "$\Phi$" dynamically through time is with an auxiliary sense winding in parallel with the solenoid drive winding. In this way, resistive voltage drop in the drive coil will be of no consequence, and the voltage obtained from the sense winding will be a good measure of the time derivative of flux. Thus parameter can be integrated, starting from an initialization value of zero, either by analog integration or periodic sampling of the sense voltage and cumulative summation of the sampled values. Either the analog integral or the cumulative sum can be scaled to give a useful measure of "$\Phi$." The other needed control parameter is "I," the current that together with inductance "L" sets "$\Phi$." A current sense resistor is an obvious approach. Now solving Eq. 5 for reciprocal inductance:

$$1/L=I/n\Phi \quad 37]$$

The reciprocal of "L" is linear with "$x_{eff}$." Incorporating the scaling coefficients of Eq. 19 yields:

$$x_{eff}=\mu_0 nAI/\Phi \quad 38]$$

As already stated, "$x_{eff}$" is a sufficient parameter to base soft landing control, its nonlinearities with respect to the Cartesian coordinate "x" being of little practical consequence. For a magnetic loop that closes to a very low reluctance, the offset between the mechanical limit of full closure and the zero of "$x_{eff}$" will be of little consequence. Targeting landing at $x_{eff}=0$ and approaching zero exponentially will result in landing in a finite time at a very low velocity. If the offset of the mechanical stop is significant, an offset correction can be incorporated into the landing software. Mechanical closure is relatively easy to detect: "$x_{eff}$" will not become smaller with increase in drive current.

An alternative way to determine "$x_{eff}$" is to make an AC measurement of inductance "L." With electronic control of coil voltage and current measurement capability, measuring inductance is a matter of determining the dynamic ratio of voltage variation to rate of change of current. Once the general approach has been identified, an obvious implementation is with a switching regulator to control average current. Specific circuit examples will be given later, while the objective in these paragraphs is to define the conceptual approach. The switching regulator applies DC supply voltage across the solenoid terminals in pulses. Between pulses, a transistor or diode allows current to circulate or "freewheel" through the winding, sustained by inductance and decaying due to resistance. If current needs to be reduced faster than the rate determined by resistance and magnetic effects, a transistor used in the "freewheel" current path can be pulsed off while the power supply transistor is simultaneously off. The inductively-sustained freewheel current will immediately build up a voltage exceeding the DC power supply voltage, and current will flow back into the supply through a diode, thus giving "regenerative braking." As was shown in Eq. 32, the rate of change of current with time will include a component due to shuttle motion and rate of change of inductance. In solenoids that provide a fairly clean inductance signal at practical regulator switching frequencies, the current waveform will approximate a sawtooth wave responding to voltage switching. The difference in slope between the voltage-on and voltage-off conditions can then be divided into the associated voltage swing to yield reciprocal inductance, as summarized in Eq. 39:

$$1/L = \Delta(dI/dt)/\Delta V \qquad 39]$$

defined by sampling current sawtooth driven by voltage pulses.

As a solenoid approaches gap closure, current is driven to a small value, so that the resistive component of coil voltage becomes a small fraction of the externally applied voltage. If supply voltage is "Vb" and the positive current slope is designated "I>0" then Eq. 39 is approximated by:

$$1/L \cong (I>0)/Vb \qquad 39a]$$

defining reciprocal inductance during voltage pulse at small gap.

Figure 11:
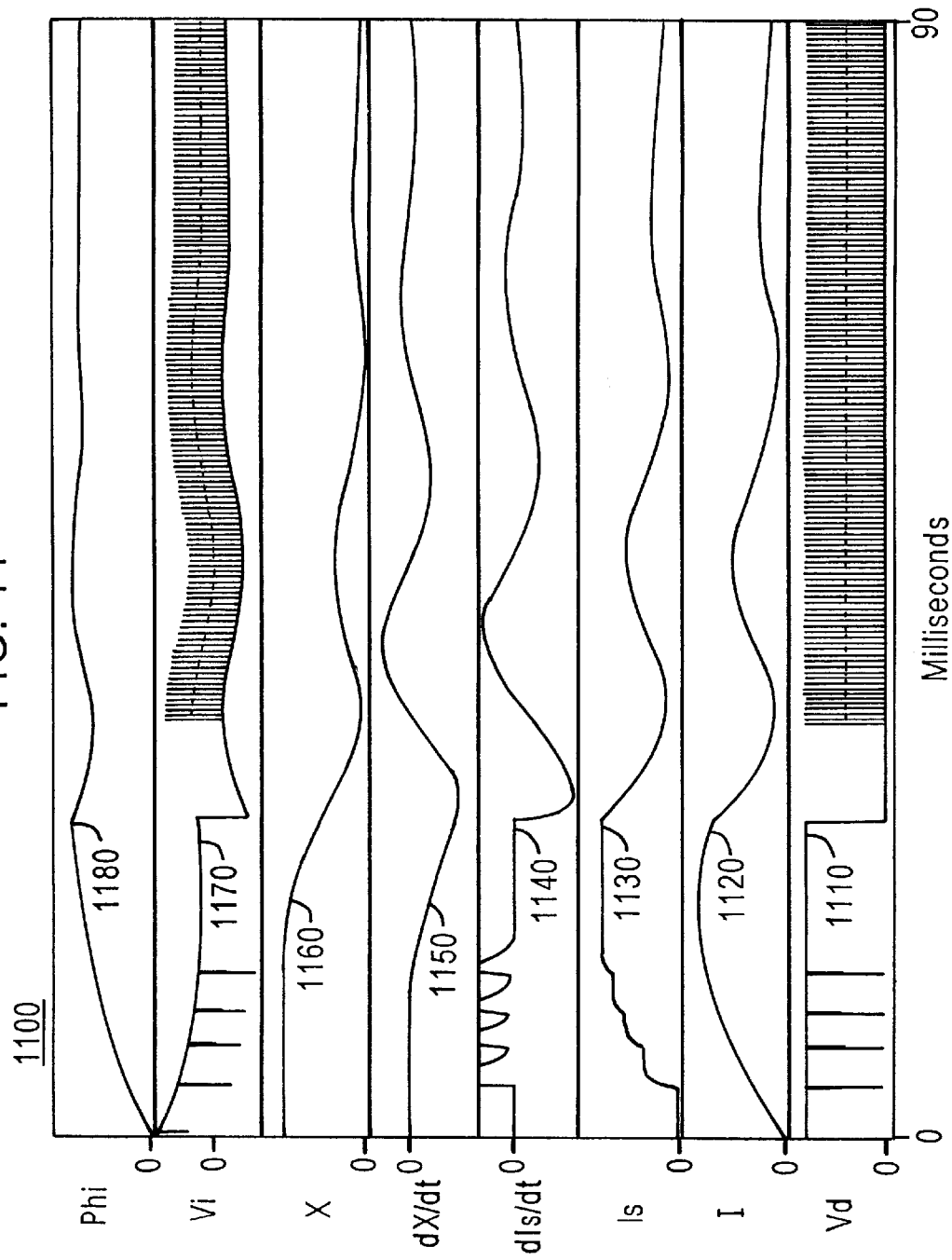
FIG. 11 illustrates parameter traces, against a time axis, typical of operation of the circuit of FIG. 10: the switching drive waveform, coil current, sampled current, sampled current derivative, velocity, position, induced voltage, and magnetic flux.

The relationship expressed by Eq. 39a is exploited in the embodiment of the invention illustrated in FIG. 11. Observe the signal waveforms sketched near points in the circuit, including a sawtooth-like current waveform at 1100, a band-limited inverted current slope waveform labeled "-I" at 1101, and a sampled peak waveform labeled "I>0" labeled at 1102 and corresponding to the like term in parentheses in Eq. 39a. Supply voltage Vb is considered constant. Thus, the sampled current-slope waveform is used as a position variable in the servo control loop. Since accuracy in this soft-landing circuit is required only on approach to zero gap, the approximation of Eq. 39a is accurate where accuracy is needed.

As the current waveform in the figure suggests, current immediately after the voltage transient may exhibit overshoot before settling into a more linear slope. Overshoot can be caused by eddy currents in transformer steel transiently lowering the effective inductance. The current slopes to subtract for Eq. 39 should be computed from data taken after transient settling, if possible.

Eq. 19 is readily solved for "$x_{eff}$" using the solution for reciprocal inductance from Eq. 39:

$$x_{eff} = (1/L)(\mu_0 n^2 A) \qquad 40]$$

Eq. 40 is just a rearrangement of Eq. 19a. The value of magnetic flux "$\Phi$" will need to be determined from data to enable computations described below, whether this value is measured by integrating a sense coil output, or by inference from measured current "I" and reciprocal inductance "1L" either from Eq. 39 based on AC measurements over pulse widths or from Eq. 19c based on ringing frequency measurements involving a known capacitance in the solenoid circuit. In the AC measurement case, "$\Phi$" comes from "I" and "L" most simply from dividing the sides of Eq. 5 by "n":

$$\Phi = I \cdot L/n \qquad 41]$$

A potential advantage to AC determination of inductance and shuttle position is that the result is valid even if the reference value of flux, $\Phi$, has been lost. This situation could come up where soft landing is used not for magnetic closure, but for slowing the shuttle before it impacts a mechanical stop at full-open, e.g., in a device that must operate very quietly. If a solenoid has been kept closed for a long period, flux in relation to current could drift, e.g., with heating of the solenoid. Heat can affect both magnetic permeability and the intimacy of mating of magnetic pole faces, whose alignment or misalignment can be affected by mechanical thermal expansion. The ratio of flux to current is sensitive to both permeability change and very small changes in the nearly-closed magnetic gap. Another more subtle effect is the time dependence of magnetic permeability. It is known that field strength in permanent magnets at constant temperature declines as a function of the logarithm of time over periods from seconds to years. "Soft" ferromagnetic materials have a similar settling behavior under steady magnetomotive force. For soft landing at full open, the "location" of the target in terms of "$x_{eff}$" should be known fairly accurately, so that velocity can be small when the target is reached, and so that the solenoid does not waste energy "hovering" in a region of high power dissipation and moving slowly to find the target. An AC determination of position does not depend on past history, and for the magnetic circuit approaching full-open, inductance is a stable measure of shuttle position, with minimal sensitivity to temperature-sensitive parameters such as core permeability.

A potential disadvantage to AC determination of inductance and position is that in solid metal solenoids (as opposed to ferrite core solenoids or powder metal core solenoids), high frequency inductive behavior is likely to be affected strongly by eddy currents or, to say the same thing, skin effect, which will have the effect of shielding the solenoid winding from the magnetic core, reducing inductance in a frequency-dependent manner that can make position determination impractical. Tracking of net magnetic flux will be much less sensitive to skin effect than AC inductance determination, since flux is a cumulative, or integral, parameter with respect to both drive voltage and shuttle velocity. Correlated with flux is current, which again is a cumulative or integral parameter in an inductive system. Flux and current determinations will be comparatively less perturbed by high-frequency skin effect. An added potential advantage of the cumulative parameter approach is reduced computation, in both digital and analog implementations. Where a solenoid exhibits a high-Q inductance to well above the frequency of a switching controller, a capacitor may be introduced into the circuit to induce high frequency ringing, in which case the ringing frequency may be determined by waveform sampling or by period measurement using appropriate high-pass filtering and a comparator. A sense winding coaxial with the solenoid drive winding provides an easy way to measure either high frequency ringing or a "$d\Phi/dt$" signal for integration to obtain "$\Phi$."

The derivations so far have concentrated on position measurement. The other significant control issue is to simplify dynamic control of force under dramatically changing conditions of current/force response and voltage/current-slope response. In Eqs. 37 and 38, we found that "L" and "$x_{eff}$" could both be expressed in terms of "I" and "$\Phi$." A similar reduction of force is now obtained by substituting for "L" and "$x_{eff}$" from Eqs, 37 and 38 into Eq. 22:

$$F = -\tfrac{1}{2}(\Phi^2/\mu_0 A)(dx_{eff}/dx) \qquad 42]$$

Eq. 42 is exact to the extent that the assumptions outlined earlier are fulfilled, concerning linearity, memory-free response, and consistent flux linkage of the windings. Eq. 38 provides a way to determine, from data, the value of "$x_{eff}$" at which the derivative "$dx_{eff}/dx$" is to be evaluated. What is not made explicit is the relationship between gap "x" and the parameter "$x_{eff}$." The curve relating "x" to "$x_{eff}$" depends nontrivially on the detailed geometry of the magnetic circuit and can be derived empirically from inductance measurements as a function of gap "x" for any particular solenoid, using Eq. 40 to translate inductances into values of "$x_{eff}$." A useful approximation for Eq. 42 employs the approximate model of Eq. 20, which requires parameter values for "$x_0$" and "K" to flesh out the model:

$$F = -\frac{1}{2}(\Phi^2/\mu_0 A)(1/(1+(x+x_{min})/x_0)^{K+1}) \qquad 43]$$

approximately.

The expression in "x," "$x_{min}$," and "$x_0$," on the right of Eq. 43 can be reexpressed in terms of "$x_{eff}$" using Eq. 20:

$$1/(1+(x+x_{min})/x_0)^K = 1 - x_{eff}(K/x_0) \qquad 44]$$

Eq. 38 defines "$x_{eff}$" in terms of measurable parameters in an expression to substitute on the right of Eq. 44:

$$1/(1+(x+x_{min})/x_0)^K = 1 - (\mu_0 nAI/\Phi)(K/x_0) \qquad 45]$$

Now rearranging the right hand side of Eq. 45 slightly and substituting that result into the expression on the far right of Eq. 43 yields:

$$F = -\frac{1}{2}(\Phi^2/\mu_0 A)(1 - K(\mu_0 nAI/\Phi)/x_0) \qquad 46]$$

approximately.

While Eq. 46 shows that all the data for computing F comes from flux "$\Phi$" and current "I," it is useful to substitute back in the expression from the right of Eq. 44, rearranged to express a dimensionless ratio of x's:

$$F = -\frac{1}{2}(\Phi^2/\mu_0 A)(1 - K(x_{eff}/x_0)) \qquad 47]$$

approximately.

The value for "$x_{eff}$" comes from data via Eq. 38 or Eq. 40 (depending on the measurement modality), but the expression of Eq. 47 clarifies the dimensional relationships. The expression on the far right of Eq. 47 is a dimensionless magnitude correction for the flux-squared term on the near right. This magnitude correction is barely less than 1.0 for small magnetic gaps and generally exceeds 0.5 for the largest magnetic gaps that are practical in solenoids. As "x" goes to infinity, i.e. when the solenoid shuttle is completely removed, then the correction factor on the right of Eq. 47 goes to zero as "$x_{eff}$" approaches its limiting asymptote. For practical control purposes, where the maximum value of "$x_{eff}$" in confined by the full-open limit stop on the solenoid shuttle, the correction factor can be ignored, i.e. set to unity, revealing a very simple approximation of force:

$$F = -\frac{1}{2}(\Phi^2/\mu_0 A) \qquad 48]$$

asymptotically as $x \to 0$.

"EXACT" SERVO CONTROL METHODS

When magnetic flux is known, force is known approximately, and quite accurately in the gap-closure landing zone. Added information about current yields a correction that makes the force expression accurate everywhere.

Concerning well-behaved control relationships, recall Eq. 4, which is repeated here for emphasis:

$$V_L = n(d\Phi/dt) \qquad 4]$$

(repeated)

The inductive component of coil voltage, $V_L$, depends only on rate of change of magnetic flux, independent of solenoid position. Inversely, magnetic flux varies as the linear time integral of inductive voltage, independent of shuttle motion. Approximately speaking, and fairly accurately for small motions in a soft landing zone, the square root of magnetic force varies as the linear time integral of inductive voltage, independent of shuttle motion. Eq. 38 is solved for current "I" to emphasize another relationship:

$$I = \Phi(x_{eff}/\mu_0 nA) \qquad 49]$$

If flux were viewed as a type of current, then a solenoid would behave like a linear constant-coefficient "inductor" with respect to "flux current." Actual electric current is much more complicated, varying as a function of applied voltage and solenoid shuttle position. As Eq. 49 suggests, it is also possible to consider electric current as a dependent variable, determined by a combination of effective shuttle position and total magnetic flux. For setting force in a solenoid, fortunately, it is the "well behaved" magnetic flux parameter whose control is important, so a good approach to servo control is to measure and control flux using relatively simple, constant-coefficient control means, and consider current as a "byproduct" of control, significant only as something that an amplifier must supply as needed to achieve the desired magnetic flux. The demand for current, and for the extra voltage needed to push that current through ohmic coil resistance in order to maintain a prescribed inductive voltage $V_L$, will vary widely with changing shuttle position. Solving for the voltage required from a controller output at a given moment, we begin by solving Eq. 29 for $V_{ext}$:

$$V_{ext} = V_L + I \cdot R \qquad 50]$$

In a control context, current "I" will have just been measured. Though the "meaning" of "I" in terms of other variables is given by Eq. 49, there is no advantage in substituting the expansion on the right of Eq. 49 into Eq. 50. The controller will be targeting some rate of flux change, "$d\Phi/dt$," which will set the required inductive voltage $V_L$ according to Eq. 4. Substituting this voltage in Eq. 50 yields the proper setting for amplifier output voltage:

$$V_{ext} = n(d\Phi/dt) + I \cdot R \qquad 51]$$

By making the proper choice of measurements and control parameters, soft landing control is reduced to a linear third-order control problem: second order from the double integration from acceleration to position of the shuttle, and moving from second to third order when one adds the integration from voltage to magnetic flux. (If magnetically induced eddy currents are substantial in the time frame of one shuttle flight, this raises the order of the dynamic system from 3 to at least 4, which makes the servo control problem substantially more difficult, and potentially impossible if solenoid coil measurements are the sole source of flux and trajectory information.)

Before proceeding with the control discussion, note that Eq. 51 suggests an alternative method for measuring coil current "I" as needed in Eq. 38 to solve for "$x_{eff}$" and, via Eq. 20a, for position "x." If voltage readings are taken from a sense coil with "n1" turns, the measured sense voltage is "n1(dΦ/dt)," which multiplied by the turns ratio "n/n1" yields the inductive voltage term on the right of Eq. 51. In a switching regulator, "$V_{ext}$" is set either to the appropriate power supply voltage for the on-condition, or to zero for the current-recirculating condition. The supply voltage may be a known regulated output or a measured unregulated value. The resistive voltage term "I·R" is adjusted to include the effects of all current-dependent voltages developed in the current path, e.g., the on-resistance of a field effect transistor, the saturation voltage of a bipolar switching transistor or darlington pair, or the nonlinear forward voltage drop across a current-recirculating diode. One might view the adjusted "I·R" voltage as "R(I)" where "R" is viewed as a nonlinear function of current "I." With a knowledge of the two terms "n(dΦ/dt)" (as inferred from the sense coil output) and "$V_{ext}$," (which is zero or a supply voltage), and with a knowledge of the resistance function "R(I)" one is in a position to solve Eq. 51 for current "I." This solution is conceptually the simplest (and often most favorable computationally) in the recirculating mode where $V_{ext}=0$, for then one does not need to know the supply voltage and one need only solve "R(I)=−n(dΦ/dt)" for current I. Operationally, one may determine current "I" and solve for position by this simplest recirculating-mode equation during the power-off periods of any drive pulse train. One then requires only a single sense coil A-to-D channel, computing current, position, and force from a time integral (i.e. a sum) of the channel output and from the most recent instantaneous reading where the coil drive voltage is switched off Returning to the dynamic control problem, to avoid the problems of third-order control, the controller loop can be split into an inner, fast-acting first-order loop that exerts tight servo control over force via control of magnetic flux, and a slower outer second-order loop that uses force to control shuttle position and velocity. For this outer loop, the principles of "PID" control are applicable, using Proportional, Integral, and Derivative terms. Inclusion of a significant integral term in a PID loop controlling a second (or higher) order mechanical system tends to introduce overshoot and ringing, which work to the detriment of energy efficiency and an ability to soft land without bumping at full closure (due to overshoot.) In a solenoid that fires repetitively and can be monitored by a control microprocessor, a circuit bias can be introduced that amounts to an integral correction carried out over many response repetitions, rather than within the time frame of a single actuation. The bias so determined will be closely related to the expected magnitude of flux to generate an equilibrium with load force at the landing point, either full-open or full-close. If the shuttle overshoots and lands with a bump, then the required landing flux bias was overestimated for a closing gap, or underestimated for an opening gap, and will be reduced or increased (respectively) for the next try. If the shuttle undershoots and has to be pulled in after coming to a stop short of the mark, then the opposite correction is needed. One supposes, in this context, that a microprocessor controller is monitoring solenoid performance (e.g., via analog-to-digital conversion) and adjusting control parameters (e.g., a digital-to-analog output) to optimize performance adaptively. When the solenoid load varies significantly and unpredictably with each individual flight, a more sophisticated control method may be needed to make on-the-fly parameter corrections that anticipate landing conditions.

To expand upon the controller design, the outer loop of the controller will demand measurements of "I" and "Φ," from which are computed a position "$x_{eff}$." This value is compared to the next-most-recent position for estimating a velocity. In the "PID" method, an error signal is defined by a weighted sum of position error, which is the Proportional term "$x_{eff}-x_{tgt}$" for target position "$x_{tgt}$" (where the target will be zero on somewhere near zero for soft landing on closure), and velocity, the Derivative term, which is given by the most recent change in position. To the resulting error will be added an Integral term, or bias, which is often based on experience with previous soft or not-so-soft landings, rather than being a dynamic integral for the present launch. The resulting "PID" sum sets a target for flux, "Φ," which is a goal value for the inner loop of the controller. It so happens that the square of this target flux is the actual force that produces accelerations. The controller does not deal directly with force, but only indirectly in terms of the flux that is required to overcome external load forces and produce accelerations. To achieve a stable system, the inner loop should converge much more quickly than the lead time constant set by the ratio of the Proportional to the Derivative term in the outer loop. To get to the target "Φ" from the currently measured value of "Φ" with a first order controller, a rate-of-change of flux will be set as a coefficient multiplied by the difference between the currently measured and the target flux. This rate-of-change appears in the first term on the right of Eq. 51. Electric current "I" will have just been measured and provides the variable multiplier for the second term on the right of Eq. 51. The output set by the controller is the left hand term of Eq. 51, "$V_{ext}$," and this output alone controls the process of converging to a soft landing. In a switching regulator setting, the value for "$V_{ext}$" may be translated into the width of a single pulse, such that the average voltage over the coming controller interval including that voltage pulse will be "$V_{ext}$." The time constant for the inner controller loop might then be set to exactly one controller interval, so that the width of a single pulse pushes flux from the most recent value all the way to the new target value. When the computed pulse exceeds the controller interval, then the pulse is set to occupy the entire controller interval, or most of it, and the controller will be in a slewing mode, seeking a maximum rate of change of flux.

A switching regulator driving a solenoid will typically provide only unipolar pulses, whose widths will become small when the solenoid is closed. If this regulator encounters large and unpredictable load variations, it may find itself requiring negative pulses, to "put on the brakes" and avoid closure impact. A switching method for "regenerative braking" of inductively sustained coil currents, mentioned above, will be shown in greater detail in the next section.

Spelling out the above "PID" controller approach in terms of equations in a specific application context, imagine that there is a fixed controller time interval, Δt, at the beginning of which a pulse is fired, preset for an interval $t_p$, based on the PID method. If the switching regulator high-state output voltage is $V_h$, and the low-state output voltage is approximately zero, allowing solenoid current to flow from ground potential to ground potential, then the applied external voltage $V_{ext}$ can be written as an average voltage over the pulse interval:

$$V_{ext} = V_h(t_p/\Delta t) \qquad 52]$$

duty cycle average voltage

Rewriting the right side of Eq. 51 in terms of pulse width modulation, the controller will be seeking a change in flux, ΔΦ, to get flux up to a target value during one pulse interval Δt. This net flux change per time interval is substituted for the time derivative of flux on the right side of Eq. 51, while the right side of Eq. 52 is substituted for the left side of Eq. 51:

$$V_h(t_p/\Delta t) = n(\Delta\Phi/\Delta t) + I \cdot R \qquad 53]$$

The prescription for ΔΦ will be spelled out below. The controller will require solution of Eq. 53 for the pulse time interval, $t_p$, to be fired in order to provide the desired ΔΦ:

$$t_p = (n \cdot \Delta\Phi + I \cdot R \cdot \Delta t)/V_b \qquad 54]$$

Note that the two terms in the parentheses on the right of Eq. 54 have SI units of volt-seconds, and are divided by an on-voltage to give a pulse period in seconds. In the case of a pair of field effect transistors (FETs) switching one end of a solenoid coil between a supply voltage and ground, presuming similar on-resistance for the two FETs, then it is appropriate to include the FET on-resistance as part of the net resistance "R," in addition to winding resistance, and then set $V_h$ to the full supply rail voltage, without correction for drop across the switching FET.

The value for ΔΦ comes from the most recent determination of flux by measurement, $\Phi_n$ for time index "n" just passed, and a target flux, $\Phi_{n+1}$, determined as fulfilling the force requirement of the "PID" control loop:

$$\Delta\Phi = \Phi_{n+1} - \Phi_n \qquad 55]$$

As indicated in Eq. 48, for a magnetic gap approaching zero, force varies roughly as the square of magnetic flux. For a control system in which the landing or holding force to be expected on a given landing is estimated from the force required on recent landings, the controller will establish an end-point value for force or, in practice, the target flux that was required to provide that holding force, $\Phi_{tgt}$. This target flux is the integral term of a "PID" loop, but in this context the integral is a sum from previous landing errors, possibly based on the most recent landing, or possibly based on an extrapolation from two or more previous landings. Because of the square-law nature of the force response, a given flux correction, ΔΦ, will result in a larger change in force, and therefore in acceleration, for a larger bias in the magnitude $\Phi_{tgt}$. A linear control method based on position "$x_{eff}$" and velocity "$dx_{eff}/dt$" would achieve different loop gains at different landing forces and, consequently, different end-point flux levels. To make the loop gains independent of end-point force (where this might be relevant), we scale the system loop gain to vary inversely as the anticipated "$\Phi_{tgt}$."

$$\Phi_{n+1} = \Phi_{tgt} + (G/\Phi_{tgt})(x_{eff} - x_{min} + \tau \cdot dx_{eff}/dt) \qquad 56]$$

In Eq. 56, "G" is the loop gain coefficient, and "τ" is the phase-lead time constant for the derivative controller term. The overall controller method includes repetitive solutions to Eq. 56, with substitution of the result from Eq. 56 into Eq. 55, and from Eq. 55 into Eq. 54, where the pulse interval is set in order to produce the appropriate flux and force. Values for "$x_{eff}$" come from earlier equations, depending on the measurement approach (i.e. using derivative determination of "1/L" or integral determination of "Φ" as discussed), and the time derivative of "$x_{eff}$" typically comes from a finite difference over the most recent time interval. One can also infer a more up-to-date velocity parameter by examining the relationship of velocity to rates-of-change of the flux and current parameters going into Eq. 38 and designing for slope measurements and computations based on those parameters and rates. As velocity approaches zero, the error term with the gain multiplier "G" goes to zero as "$x_{eff}$" approaches the target "$x_{min}$." By expressing gain as the ratio of "G" to anticipated flux magnitude, one achieves a relatively constant gain in the realm of force and acceleration. If the factor "G" is pushed too high, the controller will become unstable due to time lag between measurement and force response, i.e. some multiplier times the controller time interval Δt, and also due to possible high-order time response lags (such as skin effect) in the electromechanical system. By varying dynamic gain adaptively as shown in Eq. 56, the designer helps insure stability over a range of operating conditions and can push the limits of loop gain over the entire operating envelope. Where landing force does not vary significantly, the coefficient "$(G/\Phi_{tgt})$" can be replaced by a constant coefficient without compromise to the controller design. The gain and phase lead coefficients of Eq. 56 can be set, in a practical context, by empirical determination of good performance, or they can be determined for a specific control system from analytic considerations. Notice that in a microprocessor that does not provide for fast numerical division, the ratio "$G/\Phi_{tgt}$" can be computed in advance of a solenoid launch and used as a constant multiplier during real-time dynamic control.

Concerning landing point errors, if the estimate used for "$\Phi_{tgt}$" is in error, then either:

1) the position variable "$x_{eff}$" will exceed "$x_{min}$" as velocity settles to zero, with no landing; or
2) the shuttle will land with a "bump" indicated by an abrupt reduction or bounce in "$dx_{eff}/dt$."

In case 1, as successive values of "$\Phi_{n+1}$" approach a constant limit, that limit indicates the flux actually required to balance the load force, in which case tie final value of flux may be set to the new target, "$\Phi_{tgt}$," which will exceed the previous value.

In case 2, "$\Phi_{tgt}$" has been overestimated and c an be reduced by a multiplier slightly less than 1.0 for the next landing. Alternatively, a better estimate of "$\Phi_{tgt}$" might be computed if the controller is able to observe and record values at the impact point. This computation could be tricky and dependent on the nature and nonlinearities of the specific controller apparatus. When premature landing takes place, the controller-determined dynamic flux "$\Phi_{n+1}$" might be decreasing because of the increasing nonlinear multiplier $(dx_{eff}/dx)$ of Eq. 42; or it might be increasing since the shuttle is decelerating as it approaches its target, since that deceleration is decreasing toward zero, and therefore since the force needed to hold the shuttle against the load force would be decreasing; or flux change on landing approach may be driven significantly by changing load force. If there is any dynamic overshoot or tendency toward ringing in the control loop, this further complicates determination of the soft landing target. In a practical method, some reduction in target flux will be called for if the shuttle lands with a bump and is held at the mechanical stop. If there is bumping due to dynamic overshoot with final settling short of the mechanical stop, this indicates a problem with the control loop parameters, which have been set for less than critical damping, calling for adjustments in gain and phase lead to achieve the smoothest possible approach.

As a practical matter, there is generally "no hurry" about soft landing. When touchdown is approached, duty cycle and drive current are very low, so power consumption is near a minimum, whether or not actual mechanical contact is achieved in the solenoid. It is reasonable to contemplate a controller design in which the target landing point is short of actual mechanical closure and the shuttle is caused to hover dynamically for the duration of time that the solenoid is in an "energized" or "on" state. If hovering is maintained, the controller will effectively be measuring time-varying load force. For hovering performance, the controller might reasonably include a slowly-accumulating integral correction to error, which would track changing load and leave the controller initialized to recent load force history for the next launch.

The discussion above has concentrated entirely on controller operation approaching a soft landing. At launch, Eq. 54 will generally dictate a pulse interval $t_p$ exceeding the time interval $\Delta t$, i.e. a duty cycle exceeding 100%. In this event, the controller will operate in a slewing mode. If control is based on AC determination of reciprocal inductance from current slope on a sawtooth waveform, or from ringing frequency after a voltage transition, then the system should slew at a pulse interval set to give somewhat less than 100% duty cycle, so that there will be an oscillation in current and a possibility of measuring reciprocal inductance dynamically. If control is based on integral determination of magnetic flux, then the driving amplifier can be turned steadily on until the controller method calls for a reduction in the pulse interval below its maximum. The launch phase must not establish such a high cumulative energy, including kinetic energy and inductively-stored energy, that the shuttle will overshoot its mark. There is the possibility of active "braking" of inductive current, including "regenerative braking" wherein excess inductive energy results in a pumping of charge back into the power supply. With active braking, a more aggressive launch is possible without overshoot, if the system places any premium on actuation speed. In terms of energy conservation, experience has proved that as long as the drive voltage and winding impedance are established such that the force on the shuttle overcomes the load force by a reasonable margin, e.g., at least 125% of the minimum, and by not too large a margin, e.g., not in excess of 800% of the minimum, then the net energy dissipation will be quite close to the minimum achievable dissipation. A reasonable target is for an initial magnetic force of about 200% of the minimum to produce acceleration against a spring preload, with design for a higher value where there is great uncertainty about the preload. In the case of a solenoid whose shuttle starts out in equilibrium with a spring and encounters a progressive increase in force as the magnetic gap closes, as a very rough guideline, magnetic force should ramp up initially about twice as fast as the load force, i.e. a variation on the rule that magnetic force should be of the order of 200% of load force in the launch phase. If "reasonably" designed, the details of the controller method are not critical to energy performance. The controller must establish launch with a reasonable acceleration and must cut power soon enough to avoid overshoot of the landing target. The soft landing method outlined mathematically above takes over from a launch-phase or slewing-phase and is based on an exponential final approach to the target, which is a relatively simple method from a design standpoint. Other methods are possible for providing non-exponential target approach paths, with about the same overall energy performance.

Approximate Servo Control Methods

The above discussion has been directed toward a controller in which the position variable "Xeff" is determined as a ratio, either of current/flux, or of d(current)/d(time)/d(flux)/d(time), the latter ratio being proportional to the reciprocal of dynamic inductance. Jayawant (U.S. Pat. No. 5,467,244) teaches a system for approximating the ratio of current/flux by a linear fit about an operating point. Consider the ratio A/B of variables A and B, where A is close to A0 and B is close to B0. From the zero-order and linear terms of Taylor series expansions in variables A and B near A=A0 and B=B0, one obtains the linear ratio approximation, $$A/B \cong A0/B0 + (A-A0)/B0 - (B-B0)(A0/B0^{\wedge}2) \qquad 57]$$

for $A$ and $B$ near constants $A0$ and $B0$.

Since force obeys a square-law equation for solenoids, the following linear approximation (also from a Taylor expansion) is useful near a known operating point, and is exploited by Jayawant:

$$A^2 \cong A0^2 + 2(A-A0)A0 \qquad 58]$$

for $A$ near constant $A0$.

In both formulas, the perturbation differences A-A0 and B-B0 are multiplied by fixed coefficients. When the operating point is predetermined, as in the context described by Jayawant for magnetic levitation with small perturbations from the operating point, then a linear circuit can be used to implement the above quotient and ratio approximations. For continuous levitation, however, there are problems with Jayawant's approach of using the ratio I/Φ where the magnetic flux Φ is determined as the time integral of an induced voltage: specifically, the integral drifts over time. An AC determination of current-change to flux-change is more cumbersome to implement by Jayawant's approaches, requiring the use of a high-frequency carrier and amplitude detection. Furthermore, experience with real solenoids shows that AC eddy currents induced in metal solenoid material cause the measured inductance to deviate substantially from the ideal relationship, exploited by Jayawant, that 1/L indicates position X. An alternative approach offered here, employing I and Φ rather than their derivatives, is to base control not entirely on estimated position, but rather on estimated force in the short term, and average actuation voltage or current in the long term. If a solenoid is subject to a stabilizing mechanical spring force as well as a destabilizing tendency in the electromagnetic force, one can substantially reduce the electromagnetic destabilization by exerting servo control for constant magnetic flux, Φ, as determined by integration of induced voltage. In the short term, solenoid drive voltage is controlled by deviation of flux from a target flux value, which corresponds to a magnetic force in equilibrium with mechanical spring force at a desired final position. To maintain this position, a particular coil current will be required, and long-term deviation of servo-controlled coil current from a target value is taken as an indication that the integral estimate of magnetic flux is drifting. Such drift is eliminated by summing into the flux integrator (or digital accumulator in a digital implementation of the controller) an error signal representing the difference between actual drive winding current or voltage and that target current or voltage associated with the desired position. In the long term, then, the controller stabilizes current or voltage to a target, which only works when the same controller is controlling current to stabilize magnetic flux in the short term. Note that position measurement is absent from this description. If the zero-velocity magnetic flux is on target, or if the long-term average current needed to stabilize flux is on target, then position is on target by inference, based on a knowledge of the system. In a hybrid approach, short term servo control is based on a linear combination of current and flux, as with Jayawant's linear ratio approximation, but long-term control is based on average current or average applied coil voltage, which may in turn be estimated from average pulse duty cycle from zero to a given supply voltage, in the context of a switching regulator. Implementation of this approach will be described in an embodiment of the instant invention.

Jayawant's controllers employ linear power amplifiers to actuate the drive coils, an approach which needlessly dissipates substantial power. A switching or Class-D amplifier can give an efficiency improvement, but then the AC signals introduced into the controller circuit must be dealt with. Taking advantage of that situation, embodiments described below are designed intentionally to make the feedback loop go unstable and oscillate, by analogy to a thermostat that maintains a desired temperature within small error by switching its output discontinuously in response to measured error, resulting in a loop that controls duty cycle rather than a continuous analog parameter. This oscillatory control loop approach results in an energy-conservative transformation from DC power at constant voltage into coil power at variable voltage and current. In an oscillatory control loop, AC signal information is present that can be used to advantage for servo control. One use of this information parallels a use employed by Jayawant, where Jayawant applies a known AC voltage amplitude to a coil at high frequency and reads the resulting AC current as a measure of reciprocal inductance and of effective magnetic gap. This approach by itself parallels applicant's use, described under "OBJECTS OF THE INVENTION" as the numerator of the derivative difference ratio, of the quantity $\Delta(dI/dt)$, the oscillatory change in current slope. The instant invention, by contrast, derives this quantity from a very robust signal associated with powering the solenoid, without an auxiliary oscillator. In the efficient switching regulator environment taught here, switching noise at constantly varying frequency and duty cycle would mask a small carrier signal such as is taught by Jayawant, but in the new context, the switching noise itself is interpreted as a position-indicating signal. As will be shown, one-sided rectification of switching noise induced in a sense coil can be used to infer solenoid current from a large, robust signal, without reliance on extraction of current information from a current sense resistor, whose voltage differential signal must in the simplest driver topologies be read against a large common-mode voltage swing.

DETAILED DESCRIPTION OF PREFERRED EMBODIMENTS

Launch Control Methods

We have discussed the achievement of linear servo control, whose outcome is to establish a roughly exponential decay of error, including simple exponential decay and ringing within a decaying exponential envelope. A real solenoid controller has built-in slew rate limits that set boundaries to the region of linear behavior and, consequently, the range of applicability of linear control methods. Typically, the solenoid driver amplifier operates between voltage output limits that set the maximum rate at which solenoid current can be increased and decreased. In the most common two-state output controller, the "on" output state drives current toward a maximum while the "off" output state short-circuits the solenoid winding through a transistor, allowing the current to vary and, ultimately, decay, in passive response to resistance and changing magnetic gap. The momentum attained by the solenoid shuttle falls into two categories: mechanical and electromagnetic. The mechanical momentum is related to the inertia of the solenoid shuttle and its coupled load. The "electromagnetic momentum" is the natural persistence of the solenoid magnetic field. A controller can be designed to provide braking of electromagnetic momentum if it provides a drive output state that resists the flow of electric current in the solenoid drive winding. A switching controller can provide an output state designated "brake" that slows the flow of current established during the "on" state faster than that flow would slow down in the "off" state. An effective way to provide a "brake" state in a two-transistor output stage, one transistor connecting the output to a supply voltage and the other transistor connecting the output to a ground voltage, is to "tri-state" the output, i.e. to turn both transistors off, and provide a zener clamp diode between the output and ground to limit the inductively-produced voltage swing on the far side of ground potential from the DC supply potential (i.e. a negative swing for a positive supply or a positive swing for a negative supply). A more complicated "H" drive output configuration, familiar to electrical engineers, functions like a double-pole double-throw switch to reverse the solenoid lead connections and allow the inductive current "momentum" of the solenoid to pump current back into the single supply rail in the "regenerative braking" mode mentioned earlier. Notice that regenerative braking can only reduce the electromagnetic "momentum" quickly, removing but not reversing the electromagnetic driving force. This is because electromagnetic force in a solenoid not based on permanent magnets is inherently unipolar, a square law phenomenon, as indicated, e.g., in Eq. 42, whose only controlled term is the square-law term "$\Phi^2$." The variable multiplier term "$dx_{eff}/dx$" of Eq. 42 is a function only of position "$x_{eff}$" and cannot be altered or reversed by the controller. Thus, even with electrical braking, there is no quick way to brake the mechanical momentum toward closure of a magnetic gap. Thus, one is inevitably confronted with a mechanical stewing limitation and the inevitably of overshoot if one establishes an excessive momentum toward gap closure. For providing soft landing at full-open, the slew rate limit imposed by a finite supply rail voltage implies an upper limit to electromagnetic braking of a shuttle driven by mechanical springs. Again, this situation implies that when excessive momentum is established toward the full-open limit stop, overshoot and impact are inevitable.

Where the direction of momentum is specified, i.e. toward full-closure or full-open position, then it is useful to analyze slewing dynamics in terms of energy rather than momentum. Whereas the definitions of mechanical and electromagnetic "momentum" differ, energy is commonly described by the same units (e.g., joules in S.I. units) in both mechanical and electromagnetic contexts, and it is meaningful to speak of the total energy of the solenoid, combining mechanical and electromagnetic terms. At full closure with zero velocity for a solenoid shuttle being pushed open by a mechanical spring, the total energy of the solenoid assembly is the potential energy of the spring. While analysis is possible for any specific nonlinear spring or complex mechanical load including masses, nonlinear springs, and nonlinear dampers, we will restrict ourselves here to the commonplace and useful example of a linear spring and a single lumped mass, described by Eq. 36 as repeated here:

$$d^2x/dt^2 = (F + K1(x_1 - x))/M \qquad 36]$$

acceleration equation repeated here

To review, the mechanical spring rate is "K1," and "$x_1$" describes the coordinate of a fully relaxed spring. The full-open mechanical stop for this system, defined by $x=x_{open}$, will lie between $x=0$ and $x=x_1$ for a system with a spring preload. Eq. 36 is valid only for the range between 0 and $x_1$, i.e. between the mechanical stops defining full-close and full-open. The mechanical potential energy of this system varies between minimum and maximum limits:

$$E_{p,max} = \frac{1}{2}K1 \cdot x_1^2 \qquad 59]$$

maximum potential energy $$E_{p,min} = \frac{1}{2}K1 \cdot (x_1 - x_{open})^2 \qquad 60]$$

minimum potential energy

In the simplest control situation, all the constants of Eqs. 36, 59, and 60 are known in advance and can be incorporated into a control method for a specific solenoid. In interesting situations, one or more characteristics of the mechanical load of the solenoid will be unknown at the time of solenoid launch. In a practical solenoid application described later in this paper, the effective total mass "M" and the spring constant "K1" do not vary, but conditions at launch do vary. Specifically, the solenoid pulls on a short-stroke piston (described later, using a molded plastic "living hinge" or rolling seal rather than a sliding fluid seal) that draws a fluid through a valve, which remains closed before launch time. The pressure of the fluid behind that closed valve is unknown at launch, which amounts to not knowing the force preload on the system and, consequently, the equilibrium value of "$x_1$." When the solenoid is energized and begins to move, and specifically when its motion is coupled to the source fluid pressure through an open valve, then the acceleration of the shuttle is an indication of the effective preload. Analysis of measurements taken early in launch lead to a determination of the launch pulse duration needed to generate a trajectory toward a specific target value "$x_{tgt}$" at the minimum point of the trajectory. The starting value of "x," which is "$x_{open}$" in Eq. 60, will vary according to the initial fluid volume behind the piston. The value of "$x_{tgt}$" will also vary according to the desired final fluid volume behind the piston. At maximum fill, $x_{tgt}=0$, i.e. the solenoid reaches maximum magnetic closure, but in typical operation the end-point volume is targeted as less than maximum fill. In this solenoid control context, there is no use of "soft landing" or servo-controlled convergence to a target "x." In one configuration, passive fluid check valves halt the motion of both the fluid and the magnetic shuttle up to launch time and after the shuttle passes its position of maximum closure and begins to fall back toward open. In an alternate configuration, active solenoid valves perform similar functions to check valves but permit more flexible control, particularly for precision dispensing of fluid in medical infusions and industrial applications. It is seen that in the context just described, the entirety of solenoid servo control consists of launch control to achieve a prescribed target under variable operating conditions, with no use of soft-landing control.

Controller designs and methods meeting the requirements of this pumping application are applicable in more restrictive contexts, e.g., where the full-open start position for the solenoid is fixed but the spring bias resisting solenoid closure to a specified "$x_{tgt}$" is unknown until the solenoid lifts away from its full-open stop. Common applications will call for an adaptive launch method combined with a soft-landing method that takes over the final part of the solenoid trajectory, once unwanted preconditions for overshoot have been avoided by the launch method. The nonlinear adaptive launch method to be described below can give a minimum-time trajectory to a target. It is feasible to dispense with separate launch control and use a linear "soft-landing" method from launch onward, provided that the phase-lead time constant "$\tau$" (Eq. 56) is made large enough to bring the system out of slewing before too much energy has been injected. To achieve maximum speed, the value of "$\tau$" would have to vary according to launch conditions that may be unknown in advance. Maximum speed, however, will often be of little practical importance.

Of greater importance in the fluid pump application described above is the freeing of a microprocessor from a solenoid control task to make way for another task. Specifically, the active valve pump embodiment to be described later involves three controlled solenoids, one for piston pumping and two for valve actuation. For economy, all three valves can be made to operate from a single microprocessor controller. The piston solenoid is energized first, to full-on, after which a regular time sequence of samples from a sense winding provide values proportional to "$d\Phi/dt$," the rate of change of magnetic flux. A running total of these regular samples gives the present flux. Interleaved with sampling and summing of samples of "$d\Phi/dt$" the microprocessor controls the inlet fluid valve solenoid to reach full-open with a soft landing and switch to a low-computation holding mode, e.g., at a predetermined holding duty cycle. The controller then returns its attention to the piston solenoid to determine a cutoff time for achievement of a prescribed "$x_{tgt}$." Once that cutoff time is reached and the piston solenoid is shut down, the controller can wait for the projected trajectory interval to elapse and then shut down the inlet valve. At this point, the pumped volume has been captured, and the computation tasks relating to the solenoids for the inlet valve and piston are done. The microprocessor can therefore concentrate on the tasks of pulsing the outlet valve and dispensing the fluid that has been pulled in by the piston.

To summarize the method development task ahead, we seek a launch controller that begins launch with an initially unknown effective spring-balance value "$x_1$" whose physical location is beyond the full-open mechanical stop at $x_{open}$ (i.e. the spring preloads the shuttle against a full-open stop) and which adaptively targets a predetermined but possibly variable minimum value of "x" at "$x_{tgt}$" where the shuttle velocity goes through zero. The value of "$x_{tgt}$" may be set at or just barely above zero where a simple soft landing is sought, such that the solenoid shuttle stops in the vicinity of full closure, possibly with a minor bump, and is then pulled to full closure, with a first or possibly second minor bump, using a few open-loop power pulses of appropriate magnitude.

The specific procedure given below suggests the manner of approaching different but related control problems that will arise in practical situations. A generalized mathematical treatment for control under unknown mechanical conditions would be quite difficult to approach, given the multitude of ways in which practical systems can differ. The analysis below, following relatively quickly from the governing equations given above, represents but one of many variant paths from the governing equations to a control method appropriate for a specific application. With the example to be given, the engineer skilled in the art in this area of control engineering, and schooled in the form of analysis provided in detail in this disclosure, will be able to come up with a control method and/or controller design tailored to the particular application, but falling within the scope of the invention being disclosed herein.

In the event that "$x_{open}$" from Eq. 60 is not initially known to a controller or control algorithm, this value may be measured with a low level power pulse that causes little or no solenoid motion and that consumes little energy. Starting at zero current and zero flux, a fixed-duration voltage pulse is applied. Sense winding readings are taken at regular intervals and summed to a register to provide an integrating variable proportional to the total magnetic flux, "Φ." Alternatively, where no separate sense winding is provided, current "I" is measured and a computed "I·R" voltage drop across the winding is subtracted from the voltage applied to the winding to infer the induced voltage in the drive coil, which in turn is integrated over multiple samples to provide a running estimate of flux "Φ." In the vicinity of the end of this pulse, perhaps both before and after the end of the pulse, electric current "I" flowing through the drive winding is divided by flux "Φ" to compute "$x_{eff}$" from Eq. 38. As has been shown, "$x_{eff}$" can also be determined from current slopes at differing drive voltages using Eq. 40, inferring reciprocal inductance "1/L" from current slopes. It is seen that for a single pulse, computing "1/L" from current slopes and correcting for the effect of electrical resistance amounts to the same thing as computing flux "Φ" from resistance-corrected coil voltage and cumulative current. It is only in the redetermination of "$x_{eff}$" during later voltage pulses that the flux and reciprocal-inductance methods differ. This position parameter thus obtained is used to compute "$x_{open}$," e.g., by inversion of approximate curve-fit Eq. 20 to solve for "$x=x_{open}$" from "$x_{eff}$." The pulse width used for this determination is chosen small enough that the solenoid force does not overcome the preload force and there is no motion. For convenience, current and flux are allowed to settle to essentially zero before the launch pulse.

By an alternative approach, the initial or open value of "$x_{eff}$" is determined by connecting a capacitor across the solenoid coil, measuring a resonant frequency or period, and computing inductance L or its reciprocal, 1/L. A first preferred embodiment of the invention includes a "ping" circuit for gap determination, although that embodiment is a servomechanism rather than a launch control apparatus.

Having determined "$x_{open}$" the controller now initiates the voltage pulse to the drive solenoid. Current will ramp up at a rate limited by inductance until the magnetic force is sufficient to overcome the spring preload and start the shuttle moving. Before shuttle motion begins, theory predicts that current "I" will increase in linear proportion to flux "Φ" in the ratio that was already measured to determine "$x_{open}$." Empirical measurement has shown that with ferrite solenoid components, this linear proportion is observed in measurement to good accuracy. As soon as the magnetic gap begins to close, the ratio "I/Φ" will begin to decrease. If the excitation is not a continuous pulse but a pulse train at high duty cycle, so that current ripple can be measured to determine reciprocal inductance, "1/L," then this measure of magnetic gap will also hold steady until the magnetic force exceeds the preload force threshold and the gap begins to shrink. Let us suppose that a threshold is set for detection of shuttle motion, specifically when "$x_{eff}$" is reduced fractionally by "ε" below the value corresponding to the linearized distance parameter "$x_{open}$." In terms of repeated measurements of "I" and integrated "Φ" this reduction is expressed by the threshold inequality of Eq. 61, which derives from Eq. 38:

$$I < (1-\varepsilon)(I_{open}/\Phi_{open})(\Phi) \qquad 61]$$

current/flux threshold equation for motion detection

The values for "$I_{open}$" and "$\Phi_{open}$" are the numbers that were used, in the pre-launch pulse test, to compute "$x_{open}$," and the reference ($I_{open}/\Phi_{open}$) ratio of Eq. 61 is pre-computed, appearing as a constant during the rapid repetitive computations to detect a threshold crossing. To avoid repeated division computations, the time-varying flux denominator "Φ" of Eq. 38 is multiplied through to yield the form of Eq. 61, free of repetitive division computations.

If the launch on-pulse is interrupted by short off-pulses to reveal the changing AC impedance of the coil, an AC equivalent of Eq. 61 is derived from Eq. 39 and expressed in Eq. 62:

$$\Delta(dI/dt) < (1-\varepsilon)(\Delta(dI/dt)_{open}) \qquad 62]$$

current slope threshold equation for motion detection

In getting from Eq. 39 to Eq. 62, it is assumed that the denominator voltage change Δ V is constant, being primarily the power supply voltage but with corrections, e.g., for the forward drop of a current-recirculating diode. The change in current slope is associated with the switching transition of the driver transistor, e.g. transistor 509 of FIG. 5, which will be examined later. The constant "$\Delta(dI/dt)_{open}$" on the right of Eq. 62 is the value that was used, in the pre-launch pulse test, to define "$x_{open}$." By keeping the denominator interval "dt" fixed, the change in current slope is transformed into a simple second-difference among three equally-spaced current samples. Thus, the left side of Eq. 62 becomes a second difference among samples, while the right side is a constant.

The threshold value for "68" may be set at a low, practical value, e.g., ε=0.05, so that a combination of circuit noise, quantization error, and arithmetic error will not cause a false trigger. The time delay from the start of the launch pulse to passage of the motion threshold associated with a given "ε," as determined by the first measurement that satisfies Eq. 61 or 62, is designated simply $t_\varepsilon$.

If one could extrapolate back from the triggering event at t, to the estimated current where the force balance threshold was crossed, then one could quantify the preload force and, from there, define all the analytic parameters that determine shuttle trajectory as a function of the electrical input. For the pragmatic task of launching the solenoid on a trajectory to a desired maximum closure at $x=x_{tgt}$, however, analytic solutions are quite cumbersome, and an empirically derived function is quite sufficient for launch control. In the context presented, this function has three arguments:

$x_{open}$=launch start point, measured via pre-launch pulse and Eq. 38 or 40 and 20a $x_{tgt}$=target end point, measurable by a test pulse at the trajectory end $t_\varepsilon$=launch acceleration time for motion to designated fraction of full trajectory Based on these three arguments, one desires a launch pulse period, $t_p$, that will cause a trajectory to reach the target:

$$t_p = t_p(x_{open}, x_{tgt}, I_\varepsilon) \qquad 63]$$

defines arguments of pulse period function

The nature of this pulse of width $t_p$ is better understood in light of FIG. 1, which illustrates the waveforms associated with the launch of a solenoid whose magnetic closure force must exceed a mechanical preload force before motion begins. The coil drive voltage Vd is zero up to time=0, at the left edge of the family of traces and the beginning of trace 110, at which point Vd goes high for a pulse interval extending to 115, where trace 110 returns to its low state and the drive pulse interval terminates. Current I, trace 120, begins to rise starting from the left-hand end, causing an increasing force varying as the square of I. When this force exceeds the mechanical preload, then velocity trace 130, dX/dt, labeled X where the dot above the letter designates time differentiation, begins a negative excursion from zero, indicating that gap X is becoming smaller. Trace 140 illustrates the integral of dX/dt, which is gap X. Trace 150 illustrates the induced voltage Vi, which has the effect of limiting the rate of increase of current I in the drive winding, and which may be detected free from other signals in a sense winding wound coaxial with the drive winding. Where current is zero at the left-hand edge, Vi initially equals the supply voltage. Essentially the same Vi signal may be obtained from a sense winding, though the sense voltage will be multiplied by the ratio of sense winding turns to drive winding turns. Before motion begins and dX/dt departs from zero, current I along trace 120 follows an exponential decay upward toward an asymptote where ohmic resistive voltage balances the supply voltage, while Vi along trace 150 follows an exponential decay downward toward an asymptote at zero. Motion begins when the solenoid shuttle lifts off its mechanical stop, or in a context to be described later, when the pull of a solenoid-driven piston reduces the pressure in a fluid chamber below a source pressure, causing a one-way check valve to open. The resulting fluid flow allows the piston and solenoid shuttle to begin moving. The closing of gap X toward zero reduces and then reverses the upward slope of current I, causing trace 120 to fall below the exponential path that it followed initially. As the current increase is halted, the decline in induced voltage Vi on trace 150 is halted. Shortly beyond these zero-slope points, at the time of Vd transition 115, the applied coil voltage is removed and the drive coil is short-circuited, allowing current flow to continue as sustained by inductance. The induced voltage goes in a downward step from the positive value: (supply-voltage—I·R) to the negative value: (–I·R), from which point trace 150 decays upward toward a zero asymptote. Current is driven toward zero by a combination of resistive voltage and magnetic gap closure, with gap closure coming to dominate over resistance in the determination of current as the gap becomes small. As trace 140 and gap X reach a minimum, with dX/dt reaching zero, a fluid check valve closes, preventing reverse flow and preventing a subsequent increase in gap X. Through a correct adjustment of the pulse width on Vd, the final value of gap X is reduced to 10% of its starting value. The present discussion centers on a determination of the pulse width $t_p$ that will cause this 90% gap reduction to take place.

Figure 2:
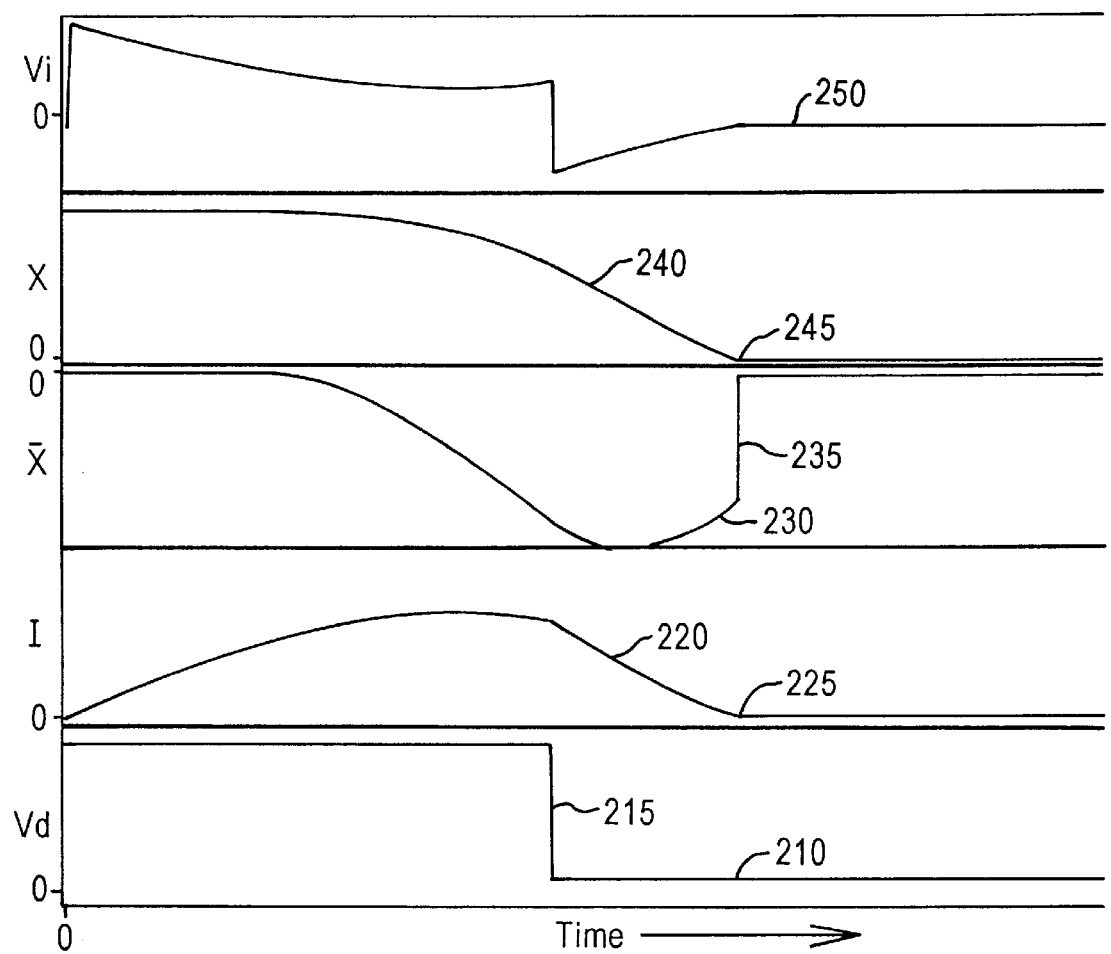
FIG. 2 illustrates sensitivity of the traces of FIG. 1 to a 5% increase in drive pulse width.

If the pulse interval is increased by about 3%, the 10% gap residual will be reduced to 0%. FIG. 2 illustrates the result of a 5% increase in the pulse interval, where the off transition time of trace 210 at 215 is delayed 5% later than at 115 of FIG. 1. It is seen that dX/dt, labeled as X, along trace 230 goes more negative than for trace 130, and X along trace 240 reaches zero at 245, indicating the point of impact. At this time, dX/dt trace 230 jumps to zero at 235, indicating that the solenoid shuttle is brought to an abrupt halt. The simulation program generating these traces includes an idealized fluid check valve that completely prevents rebound in X, whereas a comparable empirical set of traces would show effects of rebound and subsequent settling bounces. When gap X is stopped at zero at 245, current I along trace 220 is driven nearly to zero at 225. Induced voltage Vi along trace 250 reaches nearly to zero when X reaches zero.

Figure 3:
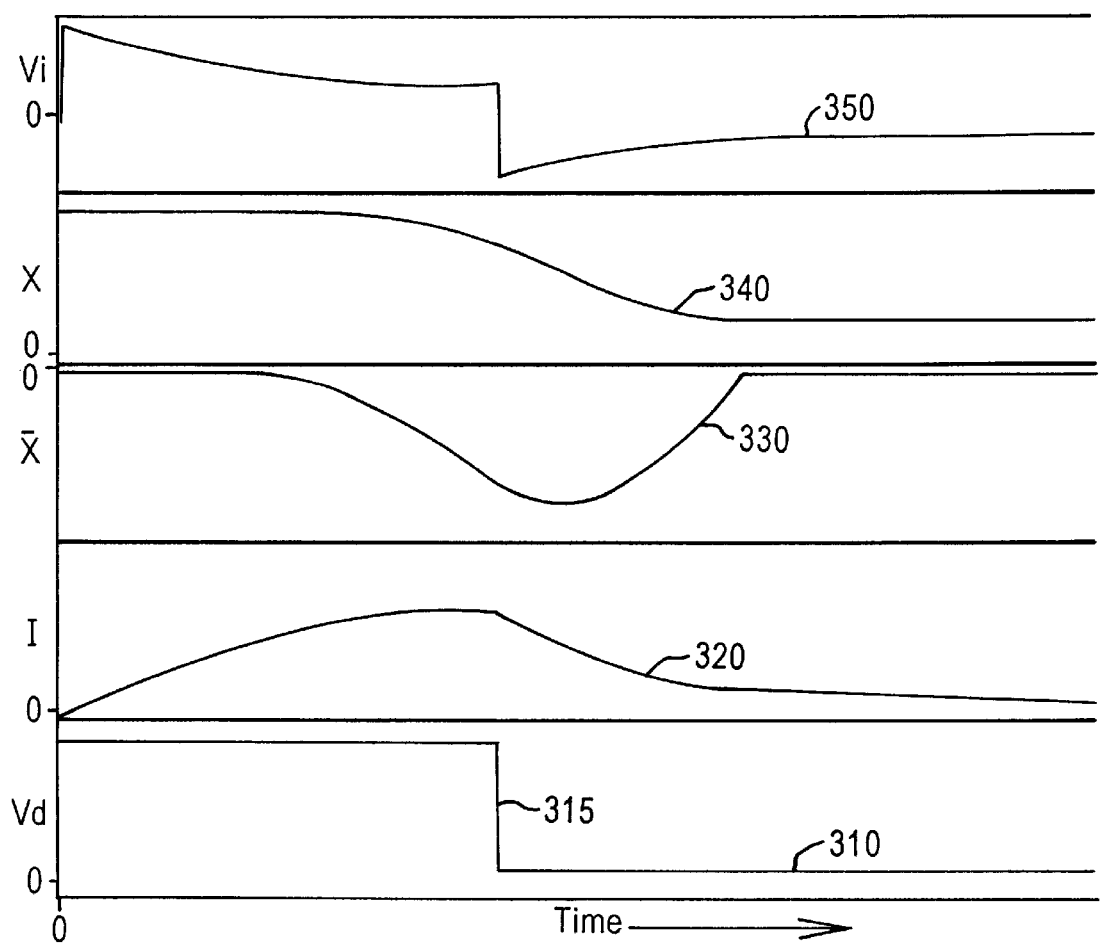
FIG. 3 illustrates sensitivity of the traces of FIG. 1 to a 5% decrease in drive pulse width.

FIG. 3 illustrates the result of a 5% decrease in the pulse interval of trace 310 to transition 315, as compared to the baseline transition of trace 115. The decrease in gap X along trace 340 terminates earlier and at a substantially higher end value, where motion is terminated by check valve closure. Trace 330, indicating dX/dt, labeled as X, exhibits a negative peak and a return to zero, while trace 320, indicating current I, continues to decay after motion in X has stopped, as indicated by the return of trace 330 to zero. Trace 350, illustrating induced voltage Vi, exhibits a similar decay toward zero from below and extending beyond the point where shuttle motion stops. Comparing current decay traces 120 and 320, the decay time constant for trace 320 is shorter (giving faster settling) than for trace 120. Both decays are exponential with a time constant of $-L_s/R$, where R is circuit resistance including coil resistance and L is solenoid inductance. Inductance L is larger for FIG. 1 and trace 120 because of the smaller gap X achieved along trace 140, as compared to trace 340, thus explaining the faster settling time constant for trace 320.

Figure 4:
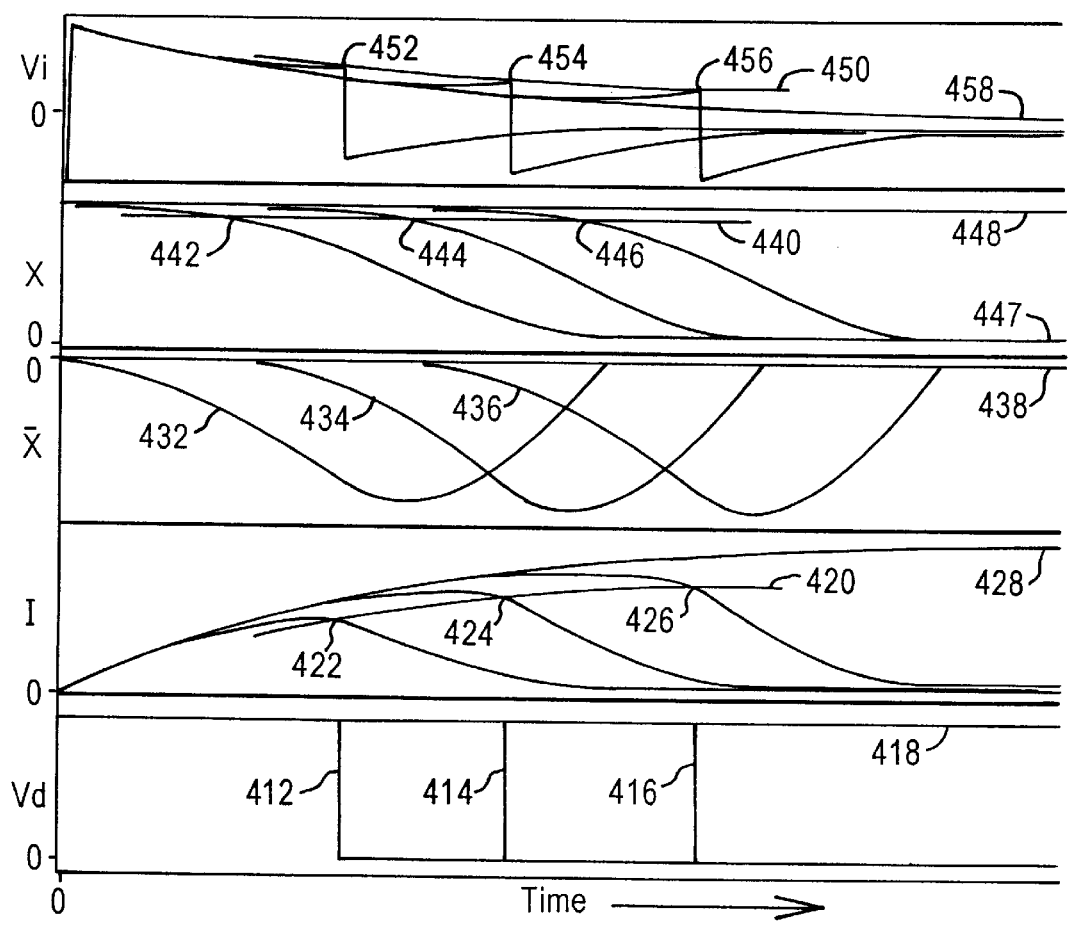
FIG. 4 shows families of curves like FIG. 1 for differing preload forces affecting launch, as well as threshold functions used to determine a desired drive pulse width for a specified armature travel.

Returning to Eq. 63, we have postulated an advance measurement of $x_{open}$ and a predetermined value of $x_{tgt}$, leaving only one unknown, $t_\varepsilon$, to be determined "on-the-fly." The event that sets $t_\varepsilon$ is position X crossing a threshold indicating that motion has begun, where this change in X is inferred from a change in the ratio of current/flux according to Eq. 61. A change in the ratio of derivatives, (d(current)/d(time))/(d(flux)/d(time)), performs equivalently for detecting a position change, and detection of such a change is simplified to solution of the threshold inequality Eq. 62. Using either Eq. 61 or Eq. 62, the intent is to detect incipient solenoid motion, and, by the timing of this detection, to define a future time at which a launch power pulse should terminate. An unknown preload condition will cause the timing to vary. FIGS. 1, 2, and 3 indicated sensitivity of gap closure to pulse interval under fixed preload conditions. FIG. 4 illustrates traces for differing preload forces and the use of three distinct methods to determine a launch pulse interval dynamically, on-the-fly. First we consider FIG. 4 illustrating the results of implementing Eq. 63 in a controller that sets $x_{tgt}$ to 10% of $x_{open}$ and solves for $t_\varepsilon$ to achieve this final gap, which is indicated at trace 447, where three X traces converge to a single line. The system being simulated for FIG. 4 is a pump whose piston is driven directly by a solenoid. The variable preload is a variable fluid pressure at the inlet of the pump, behind a one-way check valve. With the check valve closed, the solenoid driver system has no way to sense the unknown pressure that will affect the launch. When the drive signal Vd goes high, causing voltage to be applied to the solenoid drive winding, current I will build up for a period of time before enough force is achieved to open the check valve and allow solenoid motion to begin. At a positive pressure, e.g., +3 psi, the check valve is already forward-biased, and a very small magnetic force unsticks the valve, initiating the almost immediate acceleration observed in the fastest-descending trace 432 of dX/dt (labeled X) and, observable slightly later, a decline in trace 442 of X, which crosses fixed threshold trace 440 where the line from the label "442" touches the trace. This position threshold crossing is detected indirectly via either Eq. 61 or Eq. 62, as was explained above. The constant value of trace 440 correlates with the threshold parameter $\epsilon$ of Eqs. 61 and 62. At a more negative pressure, e.g., 0 psi, the solenoid must develop a larger magnetic force before overcoming the fluid force bias and initiating shuttle motion, as indicated in the velocity domain by trace 434 and in the position domain by trace 444. Trace 444 crosses threshold trace 440 at the tip of the line from the label "444." At a still more negative pressure, e.g., −3 psi, the solenoid must develop a still larger magnetic force before overcoming the fluid force bias and initiating shuttle motion, as indicated in the velocity domain by trace 436 and in the position domain by trace 446. Trace 446 crosses threshold trace 440 at the tip of the line from the label "446." Thus, three threshold-crossing time points are defined by the three fluid pressures. For the threshold times associated with 442, 444, and 446, there are target switch-off times defined by the Vd transitions at 412, 414, and 416. The threshold times define values for $t_\epsilon$ in Eq. 63, and the switch-off times define the computed pulse widths $t_p$. The three velocity and position traces just described for increasingly negative inlet pressures correspond to traces of currents 422, 424, and 426 and induced voltages 452, 454, and 456. For reference, trace numbers ending in the digit "8" correspond to no solenoid motion at all, leading to no downward transition of Vd trace 418, an exponential decay of current trace 428 to a resistance-limited maximum, zero-velocity trace 438, fixed position trace 448, and a simple exponential decay of induced voltage trace 458 toward zero.

An obvious method of defining the specific numerical values for Eq. 63 is a combination of empirical measurement and mathematical curve fitting. One begins with an instrumented prototype of the system to be manufactured and controlled. One sets an input bias, e.g., a bias fluid pressure, and experimentally pulses the system until an interval is determined that carries the solenoid from a specified starting position to a specified final position. The determined time intervals are recorded and the test repeated for other input bias values. The resulting data sets define Eq. 63 for a specified, fixed initial position and a specified, fixed final position. A one-dimensional curve fit to the data is obtained and programmed into a controller.

If the controller is to be operated with variable initial positions, then the parameter $x_{open}$ of Eq. 63 comes into play, raising the dimensionality of Eq. 63 from one to two. Conceptually, one must now repeat the series of experiments described in the previous paragraph for a series of different starting values $x_{open}$, yielding a family of curves. The specific computation algorithm used to implement Eq. 63 must then be capable of defining a specific member of the family of curves when the starting value $x_{open}$ is specified. In actual hardware, $x_{open}$ is a measurement, a reading taken in advance of launch. As will be shown in hardware embodiments, the parameter used in place of $x_{open}$ is not a true magnetic gap, but rather a measurable electrical parameter of the solenoid corresponding to the magnetic gap, e.g., inductance, or ringing frequency of the solenoid in a tuned circuit with a capacitor.

If the parameter $x_{open}$ is fixed but $x_{tgt}$ is to be made variable, then the situation is comparable to that of the last paragraph, with Eq. 63 defining a two-dimensional surface, to be regarded as a family of one-dimensional curves, one of which is to be preselected when $x_{tgt}$ is defined.

For defining interpolation over a smooth surface defined by Eq. 63 when two input parameters are free to vary, one approach is multinomial curve fitting. Multinomials become cumbersome even in two domain variables, and much more so in three domain variables, due to the proliferation of cross-product terms at high orders. Interpolation from a two- or three-dimensional table is a relatively easy method for implementing Eq. 63. A hybrid of table interpolation and polynomial curve fitting is to express each coefficient of a polynomial in the variable "$t_p$" in terms of a tabular interpolation with respect the variable $x_{open}$ or $x_{tgt}$ or, in the general case, in terms of the variable pair ($x_{open}$, $x_{tgt}$) The particular values for $x_{open}$ and $x_{tgt}$ will be established before launch, and using those values, each of the several polynomial coefficients is defined by an interpolation. The set of coefficients thus obtained defines a specific polynomial $t_p$=POLY($t_\epsilon$) for use in the real time computation, immediately after "$t_\epsilon$" is measured and before the interval defining "$t_p$" has elapsed.

For any of the launch control situations described above, computer simulation may be used at least for a preliminary computational definition of Eq. 63. A curve-fit method derived from computer simulations can be used for designing and evaluating the overall actuation system, including determination of the system's complexity, cost, efficiency, and sensitivity of control to resolution of time and parameter measurements, including the needed bit resolution for analog conversions. Once a system has been computer-designed and built in hardware, the specific parameters for implementation of Eq. 63 may be fine-tuned using empirical data, which will generally be subject to physical phenomena not fully modeled in the computer (e.g., to the viscoelastic properties of a rubber pump diaphragm, which are difficult to predict from a simulation.)

Examining potentially simpler methods that accomplish the same purpose as Eq. 63, consider curve 420 of FIG. 4, which defines an empirical threshold function for current I. In the case where the solenoid shuttle is held fixed, current follows exponential curve 428 to a constant-current asymptote. Shuttle motion generates an increased induced voltage, opposing current, that causes the curve of current with time to bend downward from trace 428. Through measurement or computer simulation, one determines the transition times, e.g., for transitions 412, 414, and 416, of drive control voltage Vd, that under variable preload conditions result in the desired ending values of X, e.g., at the value of 440. From these observations, one records the values of current I at the moment of transition of Vd, e.g., at 422, 424, and 426, corresponding respectively to the transition times of 412, 414, and 416. Plotting the values of 422, 424, and 426 on a time chart and interpolating a smooth curve yields a threshold function for current I, e.g. trace 420. In controller operation, then, samples of current I are digitally converted in rapid sequence and compared to corresponding time values from a table describing trace 420. When a current sample is observed to fall below the threshold function, the controller immediately switches control voltage Vd to its low state, terminating the launch pulse. There is no need, as in Eqs 61 or 62, to define shuttle position, since any parameter indicating a change in shuttle position and describing a well-behaved threshold function will suffice. If the threshold function is allowed to be a curve rather than a constant value, then the pulse termination time can be made "now," i.e. immediately after threshold detection, rather than some function describing additional time delay. Simplicity of one constant function is traded off against the complexity of another variable function.

By similar reasoning to the above paragraph, a threshold function can be described in relation to induced voltage Vi, instead of current I. This threshold function is illustrated by trace 450, which touches the Vi curves at 452, 454, and 456, defining the transition times for 412, 414, and 416, respectively. Observe that the triggering of Vd causes the Vi curve immediately to break away from the threshold curve 450, whereas current triggering at trace 420 caused the current curves to bend down across the threshold function.

Other threshold functions are readily derived. Consider the example of a threshold function that incorporates the exponential nature of the no-motion induced velocity trace 458. An exponential function f decaying toward zero with time constant $\tau$ takes the general form $f=A \cdot EXP(-t/\tau)$. The time derivative is then $df/dt=-(A/\tau) \cdot EXP(-t/\tau)$. The weighted sum given by "$f+\tau \cdot df/dt$" is particularly useful as a threshold function, since this sum equals zero up to the moment when X begins to change. Hence, this particular sum is an especially sensitive indicator of motion and amenable to motion threshold detection in a real device. To complicate the use of this threshold function, the time constant $\tau$ is not constant with operating conditions, but varies in proportion to initial solenoid inductance, which in turn depends on the parameter $x_{open}$.

It is noted that the threshold reference function to which (e.g.) the sum "$f+\tau \cdot df/dt$" is compared is a slice of a higher-dimensional function, that slice being cut at a value of $x_{open}$. Thus, the significant parameters for threshold detection are all altered by initial solenoid position for the approach described in this paragraph.

Figure 5:
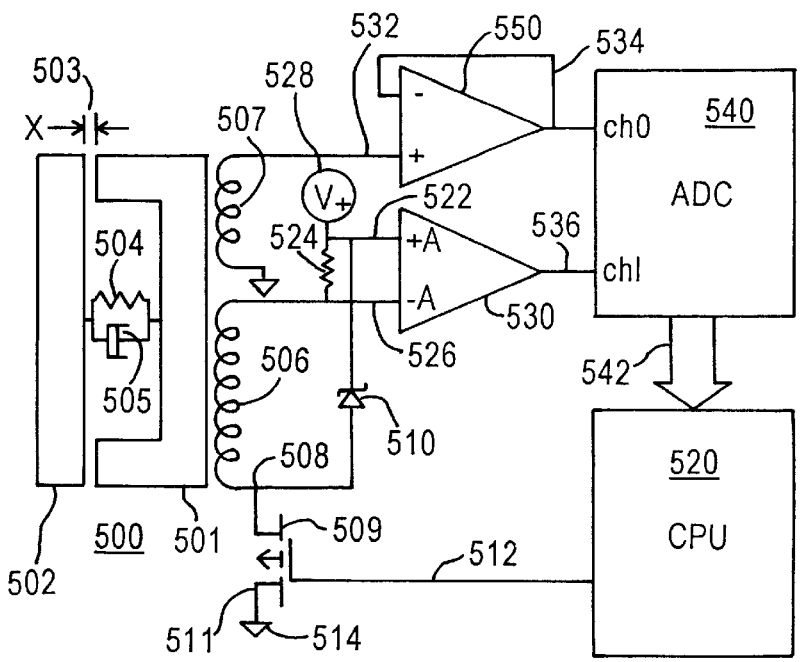
FIG. 5 shows the drive and data acquisition hardware needed for launch control as illustrated by FIG. 4.

To implement the strategies illustrated in FIG. 4, FIG. 5 illustrates interface circuitry between a control computer and a solenoid, including driver and sensor electronics. The electromechanical and magnetic system to be controlled is drawn above 500 as a hybrid of a transformer symbol and the shape of a "U-I" magnetic core pair with a gap, the "U" at 501 opening to the left and the "I" at 502 as a rectangular piece capping the "U" with a variable gap, "X" at 503. A mechanical suspension defining a mechanical impedance of the "I" shuttle piece with respect to the "U" stator is shown as the spring symbol 504 and the dashpot or damper symbol 505, connected between the "U" and "I" such that each sees the entire relative motion of the two pieces and each contributes its force additively to affect rate of change of spacing. An inertia of the mechanical system is assumed, though not drawn explicitly, being partly inertia of the solenoid shuttle and partly inertia of the load. A real mechanical of fluid-mechanical load will, in general, be more complicated than the load diagrammed. Not diagrammed is some mechanism for enforcing linear motion without rotation of shuttle 502 with respect to stator 501, such that the two magnetic gaps are forced to remain substantially equal except very near closure, where even a very small mechanical alignment error results in one side closing before the other. It is noted that in any shape of electromagnetic core, and in some shapes much more than others, there is a strong magnetic/mechanical destabilizing force favoring unequal closure of magnetic gaps. Simply stated, magnetic flux concentrates wherever a gap is narrower, and this concentration leads to an increase in attractive force, driving the narrowest part of the magnetic gap toward further closure.

The solenoid windings, including the drive winding 506 and the sense winding 507, actually wrap around the core, sharing substantially the same magnetic flux, but they are diagrammed as is conventional with transformers, as helices running alongside the part of the diagram representing the magnetic core. The polarity convention is that when a voltage appears + to − from the top to the bottom of one coil, the same induced potential will appear in the other coil terminals, going + to − from top to bottom. From a physicist's standpoint, the coils are intended to spiral with the same sense (i.e. clockwise or counterclockwise) going from top to bottom, with the result that the signs of d(flux)/d(time) in the two coils match and yield induced voltages of like sign and with potentials in the same ratio as the numbers of windings. Thus, when a positive voltage from $V_+$ at 528 is applied, via series current sense resistor 524, to node 526 including the upper terminal of winding 506, and the circuit is completed via the lower terminal of 506 at 508 into the drain of N-channel enhancement mode field effect transistor (FET) 509, and thence via the source node 511 into ground terminal 514, and when FET 509 is turned on, then the positive-to-negative potential difference from top to bottom of 506 will drive current down through the coil. The rate of increase of this current will be opposed by an induced voltage, which will appear in the same direction in 507, tending to cause a current flow from bottom to top of that coil, i.e. in a direction that would oppose the external potential applied to the bottom coil. Recalling the gedanken experiments with superconducting coils as used to derive the early electromagnetic formulas, were there no resistance in the secondary coil, and were that coil shorted, then the ampere-turns of current flow in the secondary coil would cancel the ampere-turns in the primary, meaning that the currents would tend to flow in opposite directions, the one driven externally against the induced potential, the other driven from within and in the direction of the induced potential.

Coil 507 is grounded at its lower terminal and connects via node 532 to the non-inverting input of unity buffer amplifier 550, whose output node 534 connects back to the inverting input of 550. 534 also connects into the channel 0, or "ch0" input of Analog/Digital Converter (ADC) 540, whose output connects via bus 542 to computer (CPU) 520. Thus, 520 receives digital data indicating the induced voltage in coil 507, which varies in known proportion to the induced voltage in 506. The induced voltage signal is proportional to the rate of change of magnetic flux through the windings 506 and 507. As stated in the mathematical section above, the induced voltage signal to the CPU via 534 and channel 0 is also a transformed potential representing the sum of the applied voltage and the resistive voltage: recall Eq. 50 for the voltage transformer relation, and Eq. 51 for an expression in terms of rate of change of magnetic flux. Since buffer amplifier 550 draws negligible current via 532, the voltage appearing at 532 from coil 507 lacks a significant resistive term and therefore indicates only $V_L$, the induced or inductive component of voltage. Completing the diagram of FIG. 5, a CPU digital output line at node 512 connects to the gate of FET 509, controlling the on/off switching of that FET with the respective high/low switching of 512. When 509 is off and current is established flowing down through 506, the current can complete a loop from 508 upward via the anode of shottky diode 510 to the cathode connecting to node 522, which also connects to positive power supply 528 and to the non-inverting "+A" input of instrumentation amplifier 530. The inverting "−A" input of instrumentation amplifier 530 receives its potential from node 526, which includes the bottom of current sense resistor 524 and the top of coil 506. The instrumentation amplifier has a well-controlled differential voltage gain of "A" as indicated by the "+A" and "−A" labeling on its inputs, while the amplifier common mode gain is extremely low. The output of 530 at node 536 connects of channel 1 or "ch1" input of ADC 540 where the input signal is converted to digital representation and sent via bus 542 to the CPU. The signal thus converted from 536 indicates the current flowing through sense resistor 524, which equals the current flowing through 506 excepting for a negligible current into the inverting input of 530.

Given the computer and interface circuit of FIG. 5, with appropriate software and adequate speed and timing capability, computer 520 can implement the launch control methods described in relation to the traces of FIG. 4. Using both channel 0 and channel 1 inputs, i.e. induced voltage and current, the computer can integrate (by a running numerical summation) induced voltage to get flux, and can ratio current to flux to obtain a position estimate, and can then implement the threshold detection and pulse interval determination of Eq. 63. Alternatively, using only the induced voltage signal at channel 0, the computer can implement the threshold detection on induced voltage described by trace 450. Or, using only the current signal at channel 1, the computer can implement the threshold detection of current described by trace 420. To detect initial gap "X" the computer can output a probe pulse and compute a subsequent ratio of current/flux based on the perturbations observed in channels 0 and 1, all at a current insufficient to move the solenoid shuttle from its mechanical stop. Thus, the initial gap $x_{open}$ can be inferred in preparation for launch control. A user interface or host computer interface, not shown in the diagrams, can be used to receive commands regarding variation in the target gap, $x_{tgt}$.

A Nonlinear Continuous Server Controller

Figure 6:
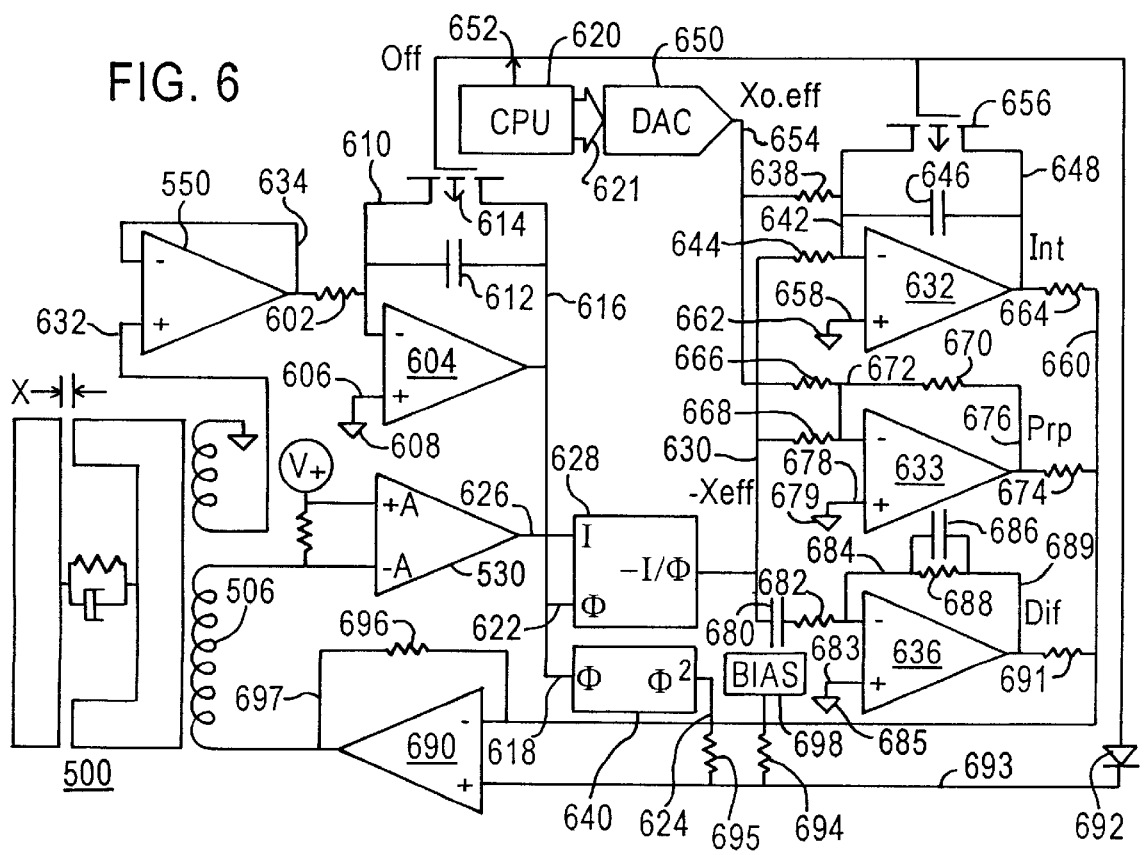
FIG. 6 illustrates a nonlinear continuous analog servo control circuit to move a solenoid armature to a target and hold it there.

Launch control methods and devices are limited in their scope of operation to situations where initial conditions are stable and measurable and where control extends only to a simple trajectory from a starting position to a target. Continuous control is more complicated but much more flexible, allowing for a system about which less is known in advance and, obviously, allowing continuing control, for gap closure, gap opening, and levitation. FIG. 6 illustrates a continuous analog controller using multiplication and division to derive force and motion parameters for a conventional Proportional-Integral-Derivative, or PID, controller. The solenoid at 500 and the associated circuitry for detecting current and induced voltage are the same as in FIG. 5, so components already explained in reference to FIG. 5 are unlabeled in FIG. 6. The difference between the figures begins with the sense coil, which is grounded at the top rather than the bottom and whose output, from the bottom via node 632, is applied to the non-inverting input of unity buffer amplifier 550, whose output on 634 feeds back to the inverting input. The induced voltage output at 634 is therefore reversed in polarity compared to output 534 of FIG. 5. 634 connects to resistor 602, which defines the input of an integrator consisting of amplifier 604 grounded to ground 608 at inverting input node 606 and with parallel feedback elements, capacitor 612 in parallel with field effect transistor (FET) 614. The FET source and one side of 612 join to node 610 leading to the inverting input of 604 along with input resistor 602. The FET drain and the other side of 612 join to node 616 at the output of 604. The FET discharges capacitor 612 when line 652 from computer (CPU) 620 goes high, thus initializing the integrator to zero. Line 652 is labeled "Off" since it initializes and shuts down the servo circuit when in its high state. The integral output is called "Φ" since the signal varies in proportion to flux Φ. This flux signal on 616 is applied to two non-linear circuits, at the denominator terminal 622 of an analog divider 628, and at the input terminal 618 of a square-law circuit. The numerator terminal to 628 is node 626, which is also the output of the current-detection instrumentation amplifier already defined by 530 in FIG. 5 and relabeled as 530 in FIG. 6. The output of division circuit 628 is labeled "−I/Φ" inside the divider box, and also by "−Xeff" on the output node, since the ratio of current/flux yields what has been defined as "effective X" and what approximates a linear measure of magnetic gap for small gaps. 630 is the basis for the motion terms of PID control. The proportional term is defined from 630 via input resistor 668 to the inverting input of amplifier 633 at node 672. A reference is provided via computer 620 via bus 621 to digital/analog converter (DAC) 650, yielding the reference "Xo,eff" on the DAC output at node 654, which leads to input resistor 666 summing in with resistor 668 into inverting input node 672. The proportional output from 633 at node 676 leads to feedback resistor 670 back to the inverting input. 676 also leads to summing resistor 674 to node 660, defining the proportional current term labeled "Prp." The non-inverting reference for 633 is provided at node 678 by ground 679. Node 630 generates an integral term via input resistor 644 to node 642 at the inverting input of amplifier 632. The DAC reference on 654 couples into node 642 via resistor 638, defining a variable "zero" for both proportional and integral terms. Integrator feedback capacitor 646 from output node 648 to input node 642 is paralleled by initialization FET 656, with drain to 648, source to 642, and gate to 652, so that 632 initializes at the same time as 604. From node 648, resistor 664 sums the current designated "Int" into summing node 660. The non-inverting reference for 632 is provided at node 658 by ground 662. Inverting input node 684 of amplifier 636 generates a band-limited derivative term via output node 630 and series components 680, a differentiating capacitor, and 682, a band-limiting resistor, leading to 684. Feedback from the output of 636 is provided by gain-setting resistor 688 and band-limiting capacitor 686, wired in parallel from the output back to node 684. Resistor 691 completes the definition of the derivative current term, labeled "Dif" above 691, and summing into input node 660. The non-inverting reference for 636 is provided at node 683 by ground 685. The proportional, integral, and derivative terms just described sum currents via 660 into the inverting input of amplifier 690, whose output node 697 connects back to the inverting input node 660 via gain-setting resistor 696. The non-inverting node 693 of 690 receives a bias term via resistor 694 from potential source 698, "BIAS," and from the output node 624 of square-law circuit 640 via resistor 695. The output of 640 on 624 is labeled "$\Phi^2$" and is the square of magnetic flux, which varies approximately in proportion to magnetic force. Hence, magnetic force is differenced against the sum of the proportional, integral, and derivative terms in amplifier 690. The resulting signal voltage differential, greatly amplified, is applied via node 697 to the bottom side of drive coil 506, as found in FIG. 5. The resulting current in 506 is measured via amp 530 to give the signal at output node 626, completing the feedback loop. Thus, the high gain of the feedback loop through 690 insures that magnetic force tracks, with little phase lag, the sum of the proportional, integral, and derivative motion terms. To force the output of 690 high and thus force the current in coil 506 to decay to zero, silicon diode 692 connects from "Off" line 652 on the anode side to non-inverting input node 693 on the cathode side. When 652 goes high, this forward biases 692 and forces the output of 690 positive.

To identify the "outer" and "inner" feedback loops described more abstractly earlier in this Specification, 690 provides a large amplification to the difference between a force signal, varying roughly in proportion to "Φ²" via wire 624, and a target force, consisting of a bias force from 698 plus a transfer function of position via summing resistors 664, 674, and 691 for integral, proportional, and derivative components of the transfer function. The "inner" loop causes net force, including magnetic and spring components, to track the target force with minimal time lag, due to the high gain of 690. The "outer" loop, not so apparent in the circuit schematic, involves the mechanical response of the armature of solenoid 500 to the controlled force. The mechanical load is modeled conceptually as a mass, spring 504, and damper 505 (recalling the labeling of FIG. 5). The mechanical transient and settling behavior is modified by an equivalent electronic spring in the feedback loop attributed to proportional gain via 674, by an equivalent damper via 691, and by an equivalent active mechanical component, having no passive mechanical counterpart, in the integral correction term via 664. The net equivalent load, including mechanical and electronic feedback components giving rise to equivalent net inertia, net restoration, net damping, and cumulative or integral correction behavior, is the responsiveness of the outer loop. If the generation of a change in force in response to an error signal at 690 involved a significant time lag, then this lag, viewed as a transfer function, would be multiplied by the transfer function responsiveness of the net equivalent load, in many cases leading to an unstable system. By making the inner loop sufficiently fast and by providing adequate damping in the outer loop transfer function, a servomechanism can be constructed that is free of ringing and overshoot response to small signal perturbations. It is recognized that in responding to large perturbations or large initial errors, the inner force-correcting loop of FIG. 6 will slew whenever the voltage drive signal from 690 is driven into limiting and a significant time is required to bring magnetic flux to match a target level. Recovery from slewing will include overshoot if the system is driven too hard and if electronic velocity damping does not provide enough "anticipation" to bring the system out of slewing before it is "too late." By limiting the speed, particularly the acceleration, with which the parameter "Xo,eff" on the output of DAC 650 is allowed to change, the designer can prevent unwanted overshoot due to slewing recovery.

An Oscillatory Solenoid Servo Circuit

Figure 7:
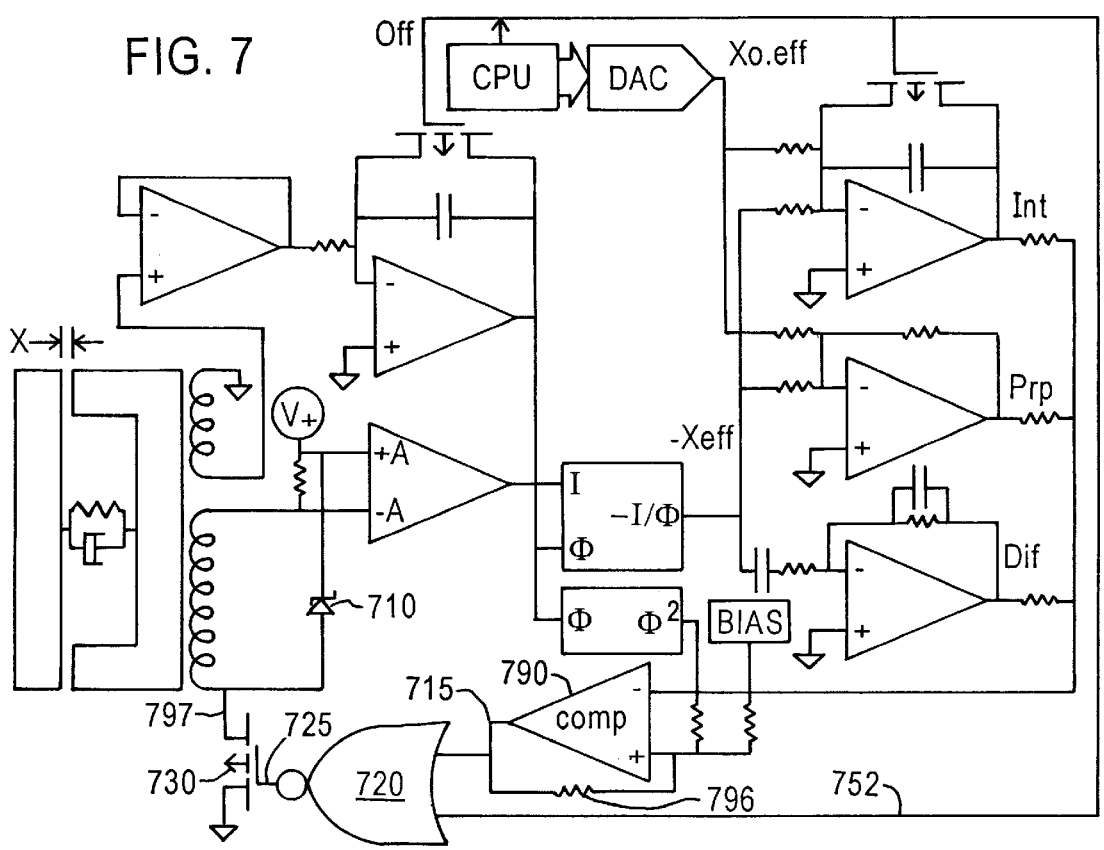
FIG. 7 illustrates an oscillating controller circuit with switch-mode output to perform the same function as in FIG. 6, but with greater electromechanical efficiency.

With too much inner loop gain, the circuit of FIG. 6 could be prone to high frequency oscillation. The objective of the modifications turning FIG. 6 into FIG. 7 is to bring about such an oscillation intentionally, to assure that voltage-limiting associated with the oscillation causes no damage or waste of energy and is confined to the drive signal to coil 506, and to assure that recovery from voltage limiting is very quick, in order to prevent the oscillation from slowing down the corrective action of the inner feedback loop. The continuous analog output of amplifier 690 is an inefficient means of driving coil 506, a switching regulator being preferred for efficient transfer of energy from a fixed DC supply to an inductive load. Rather than stabilizing the analog feedback loop and providing a Class D switching amplifier within that loop as a replacement for 690, a more direct solution is to design a feedback loop that is an oscillator providing a clean, variable-duty-cycle switching signal to the solenoid drive winding. In FIG. 7, amplifier 690 is replaced by comparator 790. A small amount of regenerative feedback is provided around the comparator from output node 715 via resistor 796 to the non-inverting input, so that saturated switching is assured. The comparator output at 715 feeds into one input of two-input NOR gate 720. The "Off" signal from 652 feeds not via a diode as in FIG. 6, but instead via node 752 to the second input of NOR gate 720, accomplishing the same shut-down function. The output of 720 via node 725 drives the gate of N-channel enhancement-mode FET 730, whose signal inversion undoes the inversion of the NOR gate to restore the polarity of the FIG. 6 feedback circuit to the circuit of FIG. 7. The source of 730 is grounded while the drain at 797 connects to the bottom coil 506, as did the output of amplifier 690. To permit recirculation of inductively-maintained current, shottky diode 710 provides the same function performed by diode 510 of FIG. 5. In this oscillator, the error signal in the feedback crosses zero (neglecting the small hysteresis feedback) each time the comparator output switches. With minimal phase delay, the comparator circuit controls flux-squared, an indicator of magnetic force, rather than voltage or current. A voltage-drive feedback loop, by contrast, would suffer from nonlinearity and an extremely variable phase lag due to gap-dependent inductance. The phase lag between voltage and flux is nearly independent of magnetic gap, and the high gain of the oscillator loop substantially reduces the effect of this phase lag on servo stability. Thus, the inner loop through comparator 790 functions much like the inner loop through amplifier 690, while the components of the outer servo loop remain unchanged from FIG. 6 to FIG. 7.

Linear Approximations Simplify Oscillator Servo

Figure 8:
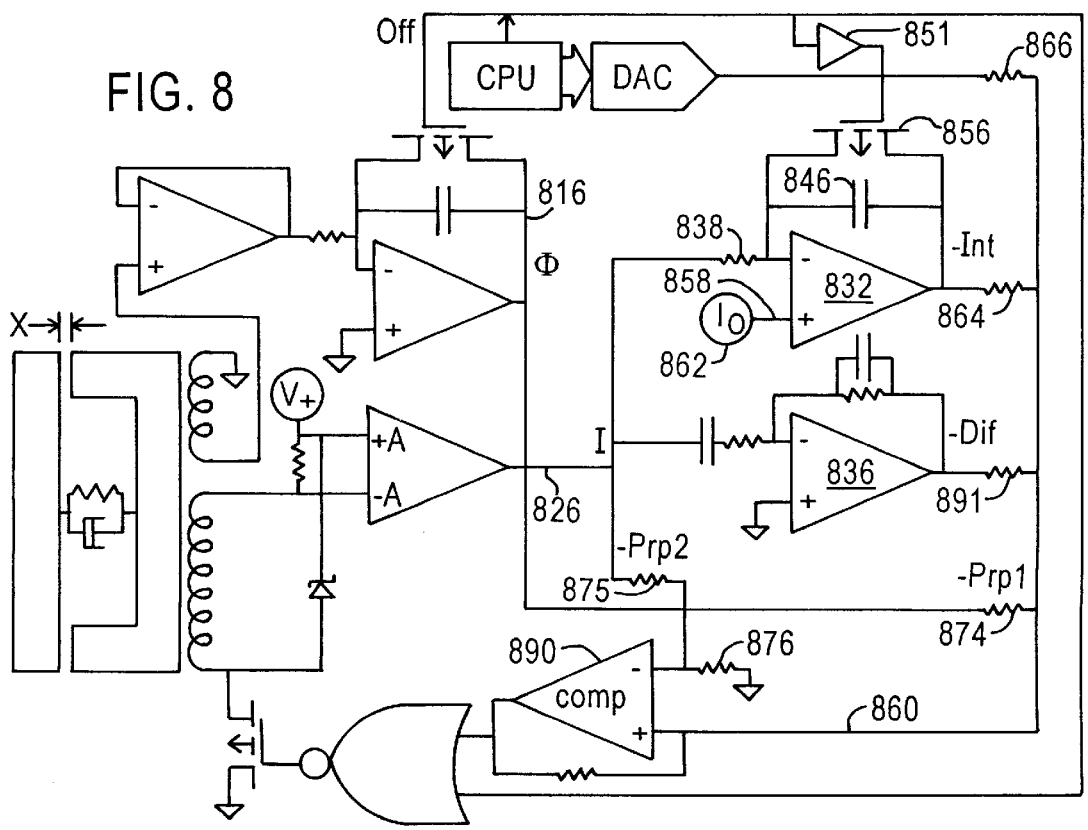
FIG. 8 illustrates linearizing circuit approximations that simplify the circuit of FIG. 7 while retaining most of the functionality of the FIG. 7 circuit. Integral control is based on solenoid current rather than position.

FIG. 8 illustrates a modification of the circuit of FIG. 7 to eliminate the operations of analog division and squaring. The approximations involved were described under the heading "APPROXIMATE SERVO CONTROL METHODS" particularly with reference to Eqs. 57 and 58, repeated here:

$$A/B \cong A0/B0 + (A-A0)/B0 - (B-B0)(A0/B0^{\wedge}2) \qquad 57]$$

for $A$ and $B$ near constants $A0$ and $B0$.

$$A^2 \cong A0^2 + 2(A-A0)A0 \qquad 58]$$

for $A$ near constant $A0$.

Instead of using a division circuit to compute the current/flux ratio, I/Φ, we utilize the approximation of Eq. 57 to approximate this ratio as a constant plus two linear terms, a positive term for variation of I about a reference I0, and a negative term for variation of Φ about a reference Φ0. As in FIG. 7, a differential amplifier in FIG. 8 generates a current signal on node 826 and labeled "I" while an analog integrator, initialized to zero output before the circuit is activated, generates a magnetic flux signal on node 816 and labeled "Φ." For a circuit intended to provide "soft landing" i.e. near-closure of the magnetic gap with little or no overshoot and therefore without bumping at full mechanical closure, the ratio approximation needed should work best as the magnetic gap approaches zero. In this situation, force is typically approaching a constant value, namely the force of the solenoid return spring plus any steady load force that might be encountered. Fractional variations in force are going to be small on approach to closure. Since (as noted earlier) force is more or less proportional to the square of magnetic flux, more or less independent of gap for small gaps, a stable servo circuit will be producing a relatively steady magnetic flux on approach to full gap closure. Thus, the signal on 816 may be expected to approach a constant value. The current signal on 826, by contrast, will exhibit significant fractional variation, with I varying more or less in linear proportion to gap X for small X. For a derivative signal to serve as the damping term of the PID controller, therefore, the current signal I on 826 is applied to the band-limited differentiation circuit surrounding amplifier 836, which is like amplifier 636 and the associated components from FIG. 6 except for the difference that signal input −I/Φ from FIG. 6 becomes signal I in FIG. 8. The current signal labeled −Dif at resistor 891 going from the differentiation output to summing node 860 is therefore analogous to the negative of the current on 691 and labeled Dif in FIG. 6, and similarly in FIG. 7. Denominator variation is simply ignored in the derivative signal, and likewise for the integral signal. Integrator amplifier 832 receives the I signal from 826 via input resistor 838 to the inverting summing junction, while feedback capacitor 846 and field effect transistor (FET) 856 provide for signal integration and resetting to zero. Note, however, that FET 856 is turned the opposite direction of 656, with its drain facing the amplifier inverting input and its source facing the amplifier output, since in this topology the amplifier output savings negative to give current signal −Int across resistor 864 between the integrator output and summing node 860. While the "Off" signal 652 from the CPU is the same in FIGS. 6, 7, 8, and 9, non-inverting level shifting buffer 851 is provided between 652 and the gate of 856 to provide a more negative gate swing for cutoff.

The integrator based on amplifier 832 includes a bias voltage, labeled Io at 862, which is applied via conductor 858 to the non-inverting input of 832. In the circuit of FIG. 8, the final target for steady magnetic levitation is not a position, but a current, where current I equals Io. The circuit seeks out the position X for which the specified current Io provides just enough magnetic force to balance the steady mechanical forces at that position. Targeting a current rather than a position represents an important simplification in design for many practical circuits. If, for example, a minimum holding current is the practical goal of a servo circuit, then the design engineer will determine, from prototypes, the largest minimum holding current that is guaranteed to maintain gap closure under all operating conditions, with an appropriate safety margin. For a circuit with good magnetic closure, this worst-case holding current is generally a small fraction of the current level needed to close the open gap, and the power associated with that current is lower than peak power roughly in proportion to the square of the current reduction, where a switching regulator provides an effective energy conversion rather than a simple resistive dissipation of supply voltage. A value for Io slightly above the worst-case or maximum holding current will result in servo closure toward a hovering gap at a small value X, whose particular value is often of minor importance. As will be shown in FIG. 15, the addition of a small permanent magnet component in the magnetic flux loop of the solenoid makes it possible to set the parameter Io=0. The permanent magnet then provides the entire holding current, and the servo circuit seeks out that position for which zero average current is drawn. This levitation position will vary according to load, which is unimportant for many magnetic bearing applications. The important issue of often to rely entirely on a permanent magnet for lifting power while maintaining control with low-power correction signal fluctuating about zero.

For proportional feedback, the proportional "Prp" signal on resistor 674 of FIGS. 6 and 7, which used the current/flux ratio signal, becomes two separate proportional terms in FIG. 8: a term "−Prp1" from the flux signal on 816 via resistor 874 to summing node 860, and a term "−Prp2" from the current signal on 826 via resistor 875 in series with resistor 876 to ground. The node between the voltage divider resistors 875 and 876 is applied to the inverting input of comparator 890, while summing node 860 is applied to the non-inverting input of 890. A small amount of regenerative feedback is provided around 890 to the non-inverting input, as was done via resistor 796 around comparator 790 in FIG. 7. Notice that the equivalent inputs of 790 and 890 are reversed, so that the polarities of the negative signals "−Int" and "−Dif" and "−Prp1" and "−Prp2" are reversed go give the equivalent polarity on the output of 890 on node 815 as was derived on the output of 790 at 715. The remainder of the FIG. 8 circuit is like that of FIG. 7, including a NOR gate like 720 driving a FET like 730 to power the solenoid drive winding.

Figure 9:
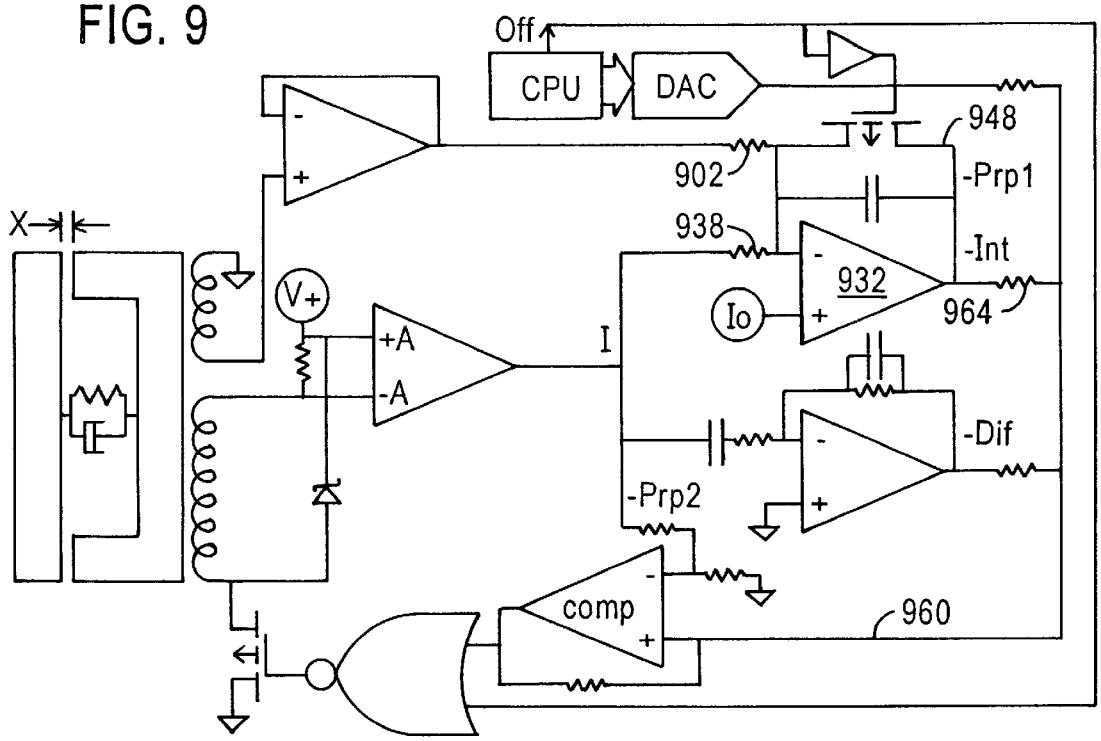
FIG. 9 illustrates the consolidation of the two integrators of FIG. 8 into a single integrator, where servo feedback correction results in indefinite operation without integrator signal drift.
Figure 10:
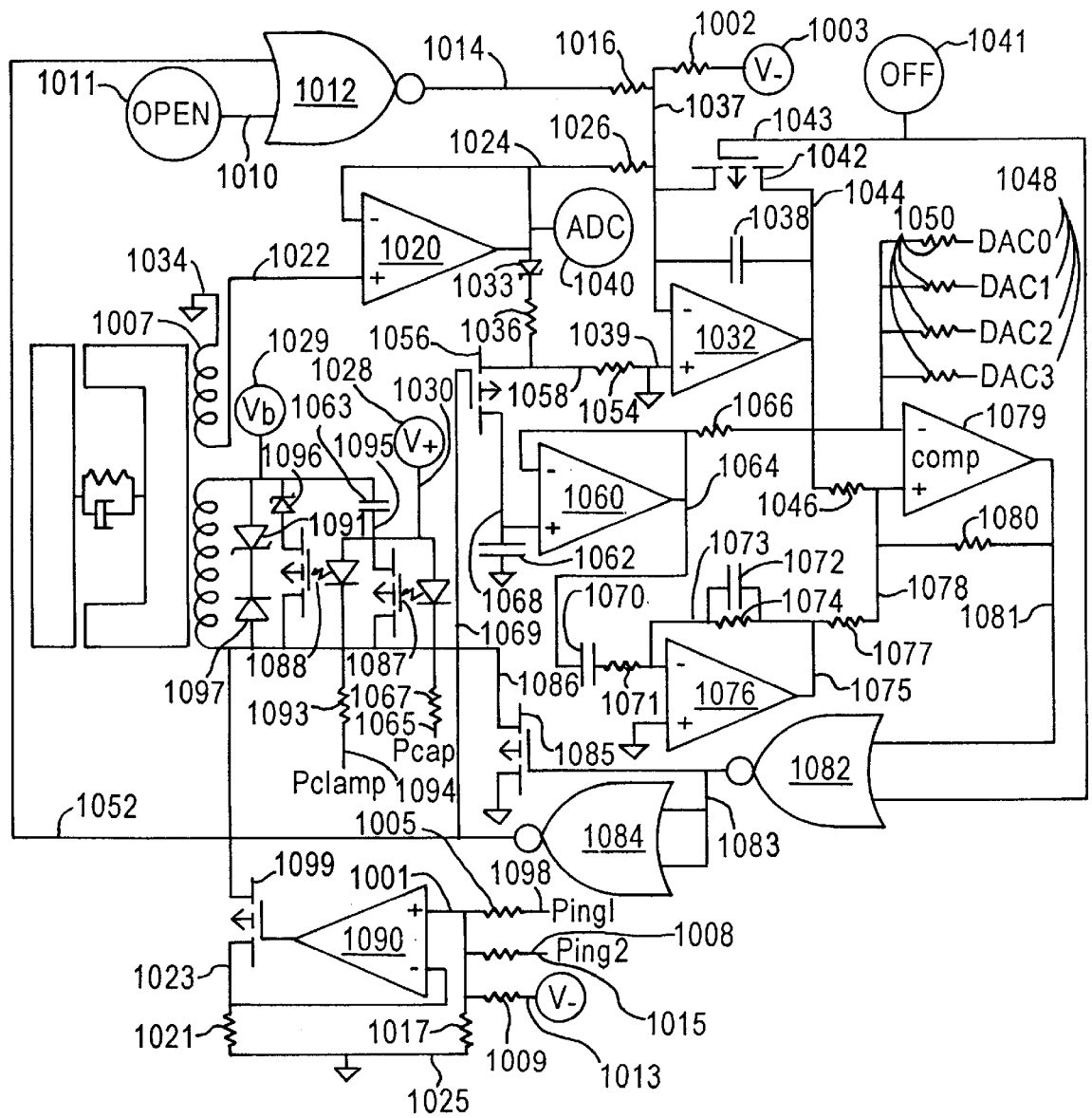
FIG. 10 illustrates a circuit functionally similar to that of FIG. 9 except for lack of a current sense resistor and differential amplification, use of sampled sense coil outputs to infer current, and use of resonating circuitry to provide precise measurement of armature position, including when an electromagnetic force is being exerted.

The approximations made in going from the servo of FIG. 7 to that of FIG. 8 include an error in the derivative feedback signal via 891, plus errors in other terms whenever the circuit is far from its design operating point and the linear approximations to the ratio and square law governing equations become poor approximations. One effect of the resulting errors can be to cause a mixing of the desirably separate dynamics of the inner and outer feedback loops previously described, creating stability problems. In both simulations and empirical trials, circuits like that of FIGS. 8, 9, and 10 are observed to exhibit instability below the frequency band of intentional oscillation, especially when the differentiating or damping gain, e.g. via 830, is pushed too high. If flux "Φ" is being pushed around aggressively by an outer feedback loop demanding large changes in force, then the approximation of constant flux is invalidated, and current "I" multiplied by a constant scaling coefficient is no longer a good approximation of the ratio of current/flux, "I/Φ." The circuits of FIGS. 8, 9, and 10 are nevertheless effective in less demanding applications, and have economic advantages.

FIG. 9 illustrates the collapse of the two integrators of the circuit of FIG. 8 into a single analog integrator. Magnetic flux no longer appears in the circuit as a separate signal, but instead in combination with the "−Int" current signal across resistor 864 of FIG. 8. The new combined integral signal is free from long-term drift, since feedback through the electromechanical servo loop automatically cancels drift. Integrator resistor 602, inherited from FIG. 6 in equivalent form in FIGS. 7 and 8, becomes resistor 902 in FIG. 9, summing into the inverting input of integration amplifier 932 along with the current signal across resistor 938, which is equivalent to resistor 838 from FIG. 8. Amplifier 932 looks like amplifier 832 of the previous circuit, except for the additional flux derivative input on 902, but it also looks like amplifier 604, inherited from FIG. 6 by FIGS. 7 and 8, except for the current input on 938. One zero-reset with a single FET replaces the twin zero reset functions of the two FETs of FIG. 8. The integrator output current of resistor 964 into junction 960 is labeled with both −Prp1 and −Int, indicating that the sum of the proportional and integral contributions is provided by the integrator output across the single resistor 964, functionally replacing resistors 864 and 874. The signal on 960 is treated like that on 860, and the remainder of the circuit of FIG. 9 is like that of FIG. 8. Lacking an explicit magnetic flux signal, the circuit of FIG. 9 is now inherently dependent on a signal other than the "position" signal I/Φ as a target for the integrating feedback loop. While the target signal is a current in FIG. 9, the target signal of FIG. 10 is a pulse duty cycle. This choice of control variables leads to different dynamic settling behavior of the servomechanism. Under the restricted circumstances of constant supply voltage and constant drive winding resistance, a constant pulse duty cycle yields an equivalent target current in the long run.

Servo Controller with Auxiliary Position Measurement

Figure 9A:
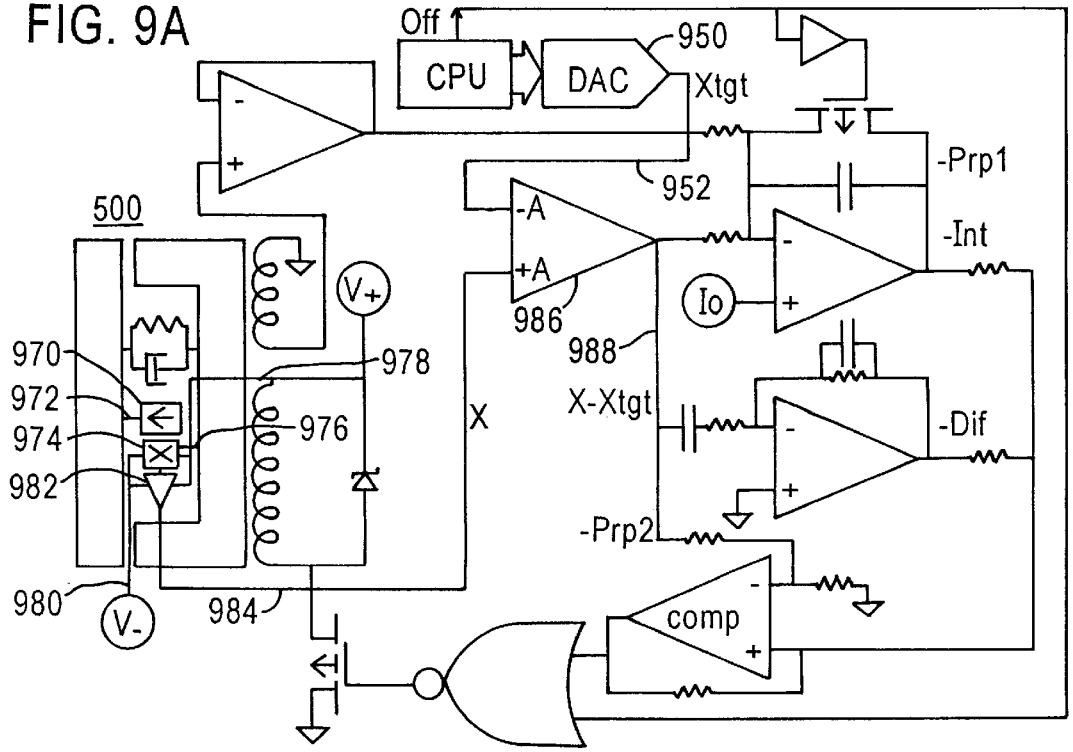
FIG. 9a illustrates the FIG. 9 circuit modified to use position sensing from a permanent magnet and Hall effect device instead of a position estimate based on current.

For reasons of economy and mechanical simplicity and reliability, earlier circuits have derived all position information from electrical responses of the solenoid winding or windings. Where the solenoid design permits incorporation of a separate position sensor, performance comparable to the relatively complicated "exact" servo of FIG. 7 can be achieved without the use of a ratio circuit. The circuit of FIG. 9a shares with FIG. 9 an inner feedback loop to control the linear flux term $\Phi$, rather than the square-law term $\Phi^2$. This linearizing approximation results in a variable dynamic gain factor around the outer PID loop, because of the square-law response of actual force to change in flux. The system will therefore be underdamped or overdamped, sluggish or quick, depending on the operating region, but runaway instability is not generally threatened by the linearization of the flux control loop. Of more consequence to stable performance is abandonment of the current/flux ratio in favor of current as an approximate position signal. By use of an auxiliary position sense signal, loop stability is obtained even when high outer-loop gain is used to speed the settling of an otherwise sluggish mechanical system, e.g., one characterized by a low spring rate and thus a slow natural period of oscillation. One has a tradeoff, then, between a division operation in the control electronics (in analog circuitry as illustrated in FIG. 7, or in a real time digital controller), or a separate sensor. (Another option, using oscillatory change in current slope as a measure of position, is discussed later with reference to FIG. 12.) FIG. 9A illustrates the auxiliary sensor route.

In FIG. 9A, the mechanical network in the middle of solenoid 500 has been modified by the addition of a permanent magnet 970, whose poling direction is indicated by an arrow, and the addition of a Hall effect sensor 974, indicated schematically as a balanced bridge whose output is amplified by amplifier 982. The Hall effect bridge and amplifier are supplied by positive supply voltage via wire 978 and by negative supply voltage via wire 980. (In practice, since common Hall effect ICs often use a low supply voltage, e.g., 5 volts, a separate single-sided supply might drive the Hall sensor, while further circuitry might offset the mid-scale sensor output to zero volts.) Line 972 from the armature of solenoid 500 to magnet 970 indicates a mechanical connection, so that the magnet moves with the armature. Line 976 similarly indicates a mechanical linkage from the stator of the solenoid to the Hall sensor, which is therefore fixed in space. The Hall sensor output connects via 984, labeled "X" for the position signal, to the non-inverting input "+A" of feedback-controlled gain differential amplifier 986, with nominal signal gains +A and −A from the two inputs. Digital/Analog Converter or DAC 950, unlike its counterpart 650, provides the target parameter, "Xtgt," to which "X" is compared. This target output of 950, via 952, is applied to the inverting "−A" input of amp 986. The difference output from 986 on wire 988, labeled "X-Xtgt," performs much the same function as the position-approximating signal "I" seen originally at 826 of FIG. 8 and carried unchanged to FIG. 9. A difference is that the bias level provided via resistor 866 from the DAC in FIG. 8 is not summed directly with the position sense signal for input to all the legs of the outer servo loop, namely the proportional, integral, and derivative paths. Hence, if Xtgt is varied, the damping feedback path will "feel" the velocity of the target variable and generate a quick response to follow target changes. The proportional gain of the loop with respect to the measure of position is labeled "−Prp2" as in earlier figures, while the balancing magnetic flux signal gain is labeled "−Prp1" as before. The signal used as a measure of position has changed, but the basic functioning of the servo loop is the same except for the elimination of some performance-limiting errors.

An example of the mechanical configuration of a Hall effect sensor and permanent magnet is shown as part of FIG. 14, along with numerous components to be discussed later. The sensor actually uses a pair of magnets, whose poling is oppositely oriented, moving on a holder on either side of the Hall effect device. Solenoid 1410 is based on two pot core halves drawn together by the magnetic field bridging across the inner and outer gaps. 1410 is configured as a "pull" solenoid (or with spring bias toward pushing, as a "push less" solenoid) with the pulling end pointed down and the sensor occupying the unused "push" end. Plastic magnet holder 1480 is secured to the end of the solenoid shaft by screw 1402. Flat circular magnets 1482 and 1484, seen in section, are poled respectively downward and upward, as indicated by arrows diagrammed in the magnet sections. The Hall integrated circuit 1486 extends out of the bottom of PC board 1488, which in turn is mounted on the surface of housing closure component 1490. The direction of vector sensitivity of the Hall device points from left to right in the diagram, the front side to the back side of the package. The magnetically sensitive region is off-center in the package and actually lies nominally midway between the magnets, even though the package itself is off-center. The field of the two magnets describes a clockwise loop out of the top of 1484, laterally right to the top of 1482, down and out the bottom of 1482, laterally left to the bottom of 1484, and completing the magnetic flux path up through 1484 and out the top. When the magnets move up, it places the Hall sensor lower relative to the magnets, in a region of flux from right to left, which opposes the vector sensitivity of the device and causes a negative-going output. A downward armature and magnet movement similarly places the Hall sensor higher relative to the magnets, in a left-right field producing a positive-going, output. The downward movement of the armature pot core half, which is below the stator pot core half, opens up the magnetic gap and therefore increases the variable "X," so positive Hall sensor variation corresponds to an increase in X.

Servo Controller with Precision Measurement Capability

The circuit of FIG. 10 is similar in function to that of FIG. 9, but differs in four significant respects. First, the circuit detects drive coil current without the use of a sense resistor in the drive coil circuit, relying instead on inference of the drive coil current from the current-times-resistance voltage drop in the drive winding, as transformed into a sense winding voltage when the drive voltage is turned off. Second, the integral feedback of the circuit is a measure of pulse duty cycle, rather than of coil current. Third, the circuit supports slow release from a nearly-closed state under servo control. Fourth, the circuit supports precision measurement of shuttle position based on the ringing frequency of the drive winding inductance resonated against a capacitor. This position measurement via resonance is referred to as "pinging." The resonating capacitor 1063 can be disconnected from the solenoid circuit by use of optical switch 1087. A high impedance current source circuit built around amplifier 1090 and FET 1099 is used both to excite ringing and to provide a selectable DC current bias through the drive winding during the ping measurement of position. The DC bias generates an electromagnetic force bias. The objective is to measure the mechanical compliance of the solenoid load, i.e. the variation in position, as determined by pinging, with respect to variation in force, as determined by computation from the DC current bias and the pinging frequency.

Examining the circuit in more detail, the solenoid at 1000 is like solenoid 500. The top of the drive winding is connected to positive battery terminal 1029, labeled "Vb," which is also a node common to the anode of zener diode 1091, the cathode of shottky barrier diode 1096, and one side of "ping" capacitor 1063. The bottom of the drive winding, opposite the positive battery terminal, is driven via node 1086 by the drain of FET 1085, whose source is returned to common ground, which is also the negative battery terminal. Associated with the drive winding are several components for sustaining a recirculating current, impeding and slowing the recirculating current, and pinging. Shottky diode 1096, for conducting an inductively-sustained recirculating current when power is not being applied via FET 1085, has its anode connected to node 1086 via a bidirectional FET which is part of optical switch 1088, the gate of the FET being activated effectively by light from a photodiode component of 1088. The anode of this photodiode is connected to regulated supply 1028, called "V+," via node 1030, while the cathode of the same photodiode is returned via current-limiting resistor 1093 to wire 1094, labeled "Pclamp" for the logic level associated with the clamp operation as part of the Ping circuit. This logic level is provided by a microprocessor pin, possibly via a buffer, with a low logic level turning on the optical switch and connecting diode 1096 to recirculate drive winding current with a minimum of voltage drop. Then the "Pclamp" logic level on 1094 goes high, cutting off photodiode current, then optical switch 1087 opens, preventing current flow through 1096. Inductively sustained current is then forced in the forward direction from node 1086 and the anode of diode 1097 through to the cathode of 1097, and from there to the cathode of zener diode 1091 and in the zener-drop direction of 1091 to the anode of 1091, which is connected to positive battery terminal 1029. Thus, causing Pclamp to go high forces recirculating drive current to pass through the braking path of zener 1096, reducing the current level quickly. Capacitor 1063 is connected in parallel with the drive winding except for optical switch 1087, whose turning off effectively eliminates the capacitor from the circuit. Specifically, one terminal of 1063 connects to battery positive terminal node 1029, the opposite terminal of 1063 connects to a lead of the bi-directional optical FET in optical switch 1087, and the other optical FET lead connects to node 1086. The photodiode in switch 1087 has its anode connected to the regulated positive supply at node 1030, with the cathode connected via current limiting resistor 1067 to wire 1065, which is energized by the logic level labeled "Pcap" for Ping capacitor. When Pcap goes high, no photodiode current flows and capacitor 1063 has no significant effect on the drive winding, while a low logic level at Pcap and 1065 drives photodiode conduction, turning on the FET and connecting capacitor 1063 in parallel with the drive winding.

Pings, or resonant ringing signals, in the resonant circuit consisting of the drive winding and capacitor 1063, become energized in several ways. If current has been driven via drive FET 1085 and decays slowly via 1096, and if switch 1087 is switched on during this conduction period, then a low-level ping will occur as decaying conduction through 1096 comes to a stop, with a first peak at less than the shottky forward bias of 1096. If 1096 is isolated by an off state in switch 1088, causing current to decay rapidly through the zener circuit via 1091, then the cessation of zener current will be accompanied by a much higher level ping, with the first AC peak somewhat below the sum of the zener drop plus the forward drop of diode 1097. For a controlled ping amplitude, current may be stopped by the braking of zener 1091 before the capacitor path is connected through on-state switch 1087, after which current pulses may be applied via the high impedance current source circuit consisting of FET 1099 and amplifier 1090. The drain of 1099 is connected to node 1086 while the source of 1099 is connected via current-scaling resistor 1021 to the common ground at label 1025. The node common to the FET source and resistor 1021 is connected to the inverting input of 1090, resulting in a feedback voltage precisely proportional to the drain current of 1099. The non-inverting input of 1090 at node 1001 is biased via resistor 1017 to ground at 1025 and via resistor 1009 to the negative supply labeled "V−" indicated on wire 1013. This negative supply may be provided, e.g., by a switching inverter operating from the positive battery voltage "Vb" from 1029. The bias level to the non-inverting input of 1090 is varied by two logic levels: "Ping1" on wire 1098 and via resistor 1005 to node 1001; and "Ping2" on wire 1008 and via resistor 1015 to node 1001. Like "Pcap" and "Pclamp," the signals "Ping1" and "Ping2" are logic levels either directly on microprocessor pins or obtained via buffers, swinging between ground potential and a positive logic supply voltage, e.g., "V+" at 1028. When Ping1 and Ping2 are both low, the current source is off because of the negative bias via 1009 from 1013. For combinations with one or both of Ping1 and Ping 2 being high, resistor ratios are chosen to give desired choices of bias voltages and current source output levels. Switching between current levels (including zero) either as steps or as pulses can be used for dual purposes: to excite ringing for frequency determination, and to maintain a chosen magnetic force in the solenoid armature. By varying force bias and measuring changes in ping frequency, the circuitry is used to measure mechanical impedance of devices driven by the solenoid, including to determine compliance due to the presence of bubbles in a solenoid-driven pump.

Unlike solenoid servo circuits of earlier figures, the circuit of FIG. 10 lacks a current sense resistor. The level of current in the drive winding is inferred, instead, from the voltage induced in sense winding 1007 when current is recirculating through on-state switch 1088 and diode 1096. The total voltage drop balanced against induced voltage in the drive winding is given by I•R+Vd for current I multiplied by net resistance R (including mostly the winding, plus an increment for the on-state switch) and for diode forward drop Vd, typically a small voltage for a shottky device. Coil 1007 is grounded at its upper terminal at 1034 and connected from its lower terminal via 1022 to the non-inverting input of unity buffer amplifier 1020, whose output via node 1024 couples back to the inverting input of 1020. The signal on 1024 goes negative when FET 1085 switches on to drive an increasing current, and positive when current is recirculating and being slowed by a combination of resistive voltage drop and diode voltages. 1024 connects to terminal 1040, labeled "ADC" and indicating an analog/digital interface to a control microprocessor. 1040 may be a multi-bit analog/digital converter, or it may be a comparator (i.e. a one-bit A-to-D) serving as input to a period counter. Circuitry including both a multi-bit converter and a comparator may be included in the "ADC" device at 1040, depending on the measurement functions chosen. For determination of solenoid armature position, it is possible to analyze samples from a multi-bit ADC waveform to determine a best-fit frequency of a ping signal, or alternatively it is possible to rely on greater time resolution of transitions from a comparator output to obtain a ringing period or frequency. If frequency is varying dynamically with time due to motion of the solenoid armature, the comparator option offers perhaps the simpler form of signal interpretation. An application to be discussed in relation to FIG. 14 is dynamic bounce of the armature as the solenoid is de-energized and the armature is pushed by return spring force into a diaphragm backed by water and, possibly, bubbles. The multibit ADC is useful for monitoring and analyzing overall circuit performance, specifically in the telling indications of induced voltage trace 1180 of FIG. 11, whose polarity is the opposite of the signal connected to ADC terminal 1040.

As mentioned, the buffered induced voltage signal on 1024 is positive when drive transistor 1085 is off and current is decaying in the drive winding. In the case where optical switch 1088 is on and the "slow decay" mode is active, the signal on 1024 varies with the resistive voltage I•R, and this current-indicating signal passes via the anode of shottky diode 1033 to the cathode of that diode, then via small resistor 1036 to node 1058 and to the source of FET 1056. When 1056 is on, the signal via 1033 and 1036 conducts to the drain of 1056 and on to node 1069 and sample/hold capacitor 1062, whose opposite terminal is grounded. FET 1056 is switched on when FET 1085 is off, so that 1062 is connected for band-limited sampling (with bandwidth limit set in part by resistor 1036) of the current signal, I•R, from buffer 1020. When the drive coil is actively driven and induced voltage is not an indication of current alone, the signal on 1024 is negative, 1033 is reverse-biased, FET 1056 is off, and the drain of 1056 points toward the positive sampled voltage, preventing leakage of the sampling capacitor charge back via resistor 1054 to ground. From node 1058, resistor 1054 to ground at 1039 provides a discharge path for capacitor 1062 when the current signal level is decreasing from one sample period to the next, thus allowing the output of the sample/hold circuit to decrease. Amplifier 1060 serves as a unity buffer for the sampled voltage, with its non-inverting input connected to capacitor 1062 at node 1068, and with its output connected via node 1064 to its own inverting input and to two output paths. One such path, representing proportional gain of the current signal, is via resistor 1066 to the inverting input of comparator 1079, whose input also includes a programmable bias from a digital/analog converter or "DAC" consisting of the group of four resistors 1050 driven by the four bits of the DAC input signal, on bit lines collectively labeled 1048 and individually labeled "DAC0," "DAC1," "DAC2," and "DAC3." The other signal path for the current sample/hold signal is via phase lead capacitor 1070 and band-limit resistor 1071, wired in series to the inverting input of differentiation amplifier 1076. The non-inverting input of 1076 is grounded, while the feedback from the output on node 1075 consists of parallel gain-setting resistor 1074 and band-limiting capacitor 1072, both wired to inverting input node 1073 and the input from 1070 series 1071. The differentiator output on 1075 sums via resistor 1077 to the non-inverting input of comparator 1079, along with another input signal via resistor 1046 and a regenerative or hysteresis feedback signal via large resistor 1080 from the output of 1079 on node 1081.

Leaving the "current" or "I•R" signal path momentarily and returning to the overall induced signal path, the output of 1020 on node 1024 sums via resistor 1026 into the inverting input node 1037 of inverting integrator amplifier 1032. Integrating feedback is achieved by feedback capacitor 1038 from output node 1044 of 1032 back to input node 1037. This capacitor can be shorted by FET 1042, whose drain connects to op amp output node 1044 and whose source connects to input node 1037, thus being wired for a normally-positive integrator output. Shorting via on-state FET 1042 resets and holds the integrator output to nearly zero volts whenever the signal "OFF" at 1041, and communicating via node 1043 to the FET gate, is high. Two other signals sum to the integrator input at 1037: a negative bias from negative supply 1003, "V−," via resistor 1002 to 1037, and a logic level via resistor 1016 to 1037 from node 1014, which is the output of NOR gate 1012.

We now consider circuit operation for combinations of logical levels 1041 and 1011, "OFF" and "OPEN." First consider the "normal" situation where "OPEN" on 1011 is low, i.e., no call to open the solenoid. When "OFF" on 1041 and via 1043 is high, integrator 1032 is initialized to zero. At the same time, the high "OFF" signal is applied via 1043 to one of the two inputs to NOR gate 1082, forcing that NOR output low on 1083. 1083 connects to the gate of drive transistor 1085, forcing it off. 1083 also connects to both inputs of NOR gate 1084, which acts as a logic inverter. The output of 1084 drives, via node 1052, the gate of sample/hold FET 1056, thus causing that FET to be on, sampling, when FET 1085 is off, and vice versa, off, holding, when 1085 is on and driving the drive winding. 1052 also connects to one of the inputs of NOR gate 1012. With "OPEN" on 1011 and 1010 in its "normal" low state, NOR gate 1012 behaves like an inverter to the signal on 1052, so that the signal on node 1014 at the output of 1012 reflects the state of driver FET 1085, namely, high when 1085 is on and low when 1085 is off. When "OFF" on 1041 and via 1043 is high, as discussed, driver FET 1085 is kept off, and the integrator is initialized. When "OFF" goes low, the soft-landing feedback loop is activated. Drive FET 1085 is enabled to follow the inverse of comparator output from 1079 via 1081, turning off when the comparator output is high and on when the comparator output is low. In this case, the signal summation into integrator 1032 is analogous to the summation into integrator 932 of FIG. 9, the sum of an induced voltage signal plus a drive signal, except that in this case the drive signal is a logic level indicating the on or off state of the driver FET, rather than being a current signal. The integrator thus responds to the running average, or duty cycle, of the drive signal. The "target" of the integrator feedback loop is to establish a steady on-state duty cycle where the induced signal from the sense coil averages zero and the ratio of resistors 1016 and 1002, and voltages 1003 (negative) and on-state voltage of 1014 (positive) establish a zero average balance, causing zero long-term cumulative change at the integrator output. Thus, if the resistances of 1016 to 1002 are in a ratio of 1:3 and if the on-state voltage from 1014 equals the magnitude of the negative bias on 1003, then a duty cycle of ⅓ at 1014 will result in an average of zero current to the integrator, implying an equilibrium. While this is the ultimate target for soft landing, i.e. a duty cycle corresponding to an equilibrium armature position typically near magnetic closure, the short-term dynamics of remaining stably near the equilibrium position are established by sampling of current and proportional and derivative feedback of current, plus proportional feedback via integration of the sense winding output, i.e. proportional feedback of the flux or Φ signal.

Circuit operation is simplest when the sampled current feedback path via FET 1056 is deactivated, e.g., by removing diode 1033, and when integrating duty cycle feedback is deactivated, e.g., by removing resistors 1002 and 1016. In this situation, the integral output on 1044 represents total magnetic flux, and is compared to the DAC voltage on the inverting input of comparator 1079. An increase in flux is indicated by an increase in the integrator output on 1044, which via resistor 1046 communicates to the non-inverting input of comparator 1079 and tends to drive the comparator output high. The inversion of the comparator signal at NOR gate 1082 results in FET 1085 being turned off, initiating a rate of decrease in magnetic flux. Thus, the simplest circuit operation maintains constant flux, resulting in a magnetic force field that increases somewhat with decreasing magnetic gap X. The force increase is moderate even as X tends to zero. The transient response of the servo system under these conditions is a damped sinusoid in X, except that a very low-rate mechanical spring may fail to overcome the slightly destabilizing effect of magnetic force variation with gap, so that divergence to full-open or full-close is possible. The other feedback loops, dependent on sampled coil current and on the integral of duty cycle, may be used to provide an approximation of velocity damping, provide a stabilizing spring-like magnetic force, and provide long-term re-biasing of flux to drive X to a value in equilibrium with a target duty cycle. As with the circuits of FIGS. 8 and 9, excessive feedback gains involving sampled current and/or duty cycle result in loss of stability.

The "PID" signals (of Proportional, Integral, and Derivative feedbacks) added to the dynamics of the basic flux servo circuit (described above) include the duty cycle integral (a sort of integral feedback of position error), plus the value of sample current (generating a stabilizing magnetic spring rate) and the time-derivative of sampled current, providing limited levels of approximate velocity damping. The proportional feedback of the current signal via resistor 1066 may be set to zero by setting the resistance of 1066 to infinity (i.e. open). If the mechanical spring rate encountered by the solenoid armature is low, then the relatively small change of magnetic force with respect to solenoid position at constant flux may be sufficiently large, and destabilizing, to overcome the stabilization of the mechanical spring. In that case, stability can be achieved by proportional feedback of the drive current signal via resistor 1066. The polarity of this feedback would appear to be regenerative, since an increase in the current signal from 1064 via 1066 drives the comparator output low, which via the inversion of NAND gate 1082 drives FET 1085 on, which tends to further increase current. Consider, however, the tendency of current, in the short term, to be driven by magnetic gap width X, so that reducing X drives current down and increasing X drives current up. Further, with a weak or approximately constant-force spring, a more or less constant magnetic force demands a lower current at a lower gap X and a higher current at a higher gap X. One can say that the proportional current feedback via 1066 rebiases this equilibrium relationship so that at lower current, indicating reduced gap X, current is driven still lower than it would have been without feedback via 1066, thus reducing the magnetic force of attraction and making X tend to increase. Conversely, a higher current, indicating increased X, causes current to be driven even higher, increasing magnetic attraction and tending to close X. A little bit of feedback across 1066 thus acts like a stabilizing mechanical spring, and both simulation and experiment with the closed-loop circuit confirms that soft landing with a nearly constant-force mechanical spring is made possible, using the circuit of FIG. 10, by the inclusion of a limited amount of proportional current feedback. Other forms of feedback around the loop, principally the degenerative feedback adjusting current to stabilize magnetic flux, give rise to overall circuit stability. If too much proportional current feedback is generated, the regenerative aspect of this feedback loop manifests itself as ringing responses and, at excessive "spring-rate" gain, instability. Similarly, if too much "velocity" feedback is generated via the band-limited current differentiation via resistor 1077, then the damping effect is progressively lost with further increases in "velocity" feedback until stability is lost. The approximations of a circuit like that of FIG. 10, and specifically the errors in those approximations, set boundaries to the feedback levels that can be employed to good effect. Within stable boundaries, however, the circuit of FIG. 10 and similar earlier circuits are economical and effective.

Consider finally events accompanying the setting of "OPEN" on 1011 and 1010 to a high logic level. "OPEN" is normally kept low until soft landing and stable hovering are accomplished, with "OFF" being held low. In certain applications it is desirable to re-open a nearly closed solenoid smoothly, somewhat slowly, and under servo control. One reason is to reduce the noise thump of opening. Another reason is to allow a solenoid-driven fluid control valve to close somewhat slowly to avoid fluid cavitation. When "OPEN" goes high with a nearly closed solenoid, the action of NOR gate 1012 is to inhibit the duty cycle feedback path that established an equilibrium gap X, forcing the duty cycle signal on 1014 to remain low. This leaves the bias current from resistor 1002 unbalanced by a duty cycle. The servo circuit will behave as if the magnetic gap X had shrunk to zero and will respond with a progressive increase in the target signal for magnetic flux. More particularly, the negative signal via resistor 1002 will be inverted on integration to produce a positive-going ramp on 1044. As the feedback loop responds, the primary effect is to produce a negative-going ramp in magnetic flux, which via coil 1007 and follower output signal 1024 will generate a positive current through 1026 offsetting the negative current through 1002. The "target" for magnetic flux is thus driven toward zero in a linear ramp, with some modification caused by the action of the sampled current feedback paths. The immediate effect of switching "OPEN" to a high state is to drive the comparator output on 1081 high a larger fraction of the time, which will reduce the "on" duty cycle of FET 1085 and thus initiate a re-opening of the solenoid gap. Feedback derived from sense coil 1007 will balance the open-loop tendency and result in a smooth and progressive reduction in solenoid magnetic force and a corresponding smooth opening. The re-opening rate can be decreased by connecting a resistor between node 1010 and node 1037, thus causing the high logic level on 1010 to partially offset the negative bias current via resistor 1002. The re-opening rate can similarly be increased by inverting the signal on 1010 and applying that inverted signal via a resistor to node 1037. Without such modification, the rate re-opening under servo control will correlate with the rate time constant set for integral feedback response to pulse duty cycle.

FIG. 11 shows signal waveforms associated with the operation of the circuit of FIG. 10. The chart at 1100 is a multitrace graph against a horizontal scale in milliseconds, extending, e.g., for 90 milliseconds from beginning to end, as indicated by labels. Progressing from bottom to top trace, trace 1110 and labeled "Vd" is the drive logic level seen at 1083 of FIG. 10. Trace 1120 is current "I" flowing through the drive coil, but not directly measured in the circuit of FIG.

10. Trace 1130 is "Is," or sampled I, appearing at node 1064 of FIG. 10. The derivative current signal of trace 1140, labeled "dIs/dt," appears at 1075 of FIG. 10, except with a polarity inversion in the circuit compared with trace 1140. Note that trace 1140 is clipped for four positive spikes early in the trace, and the spikes go higher than the graph shows. The true velocity trace 1150 is labeled "dX/dt." It is seen that trace 1140 bears little resemblance to true velocity until the magnetic gap is well on the way to closure, after which time trace 1140 is a reasonable approximation for velocity and thus an aid in damping of solenoid motion. Trace 1150 shows gap X, which is seen to exhibit mild overshoot and ringing. An decrease in circuit "velocity" damping results in a greater ringing amplitude, but an increase in damping feedback also increases the ringing amplitude, with a high-frequency wobble showing up. Trace 1170 shows the induced voltage signal "Vi" whose inverse appears at node 1024 of FIG. 10. The time integral of 1170 is trace 1180, "Phi," which does not appear as a separate signal in the FIG. 10 circuit.

Examining circuit operation, an initial bias from the DAC at the inverting comparator input drives Vd high. Until Vd spikes low, there is no sampled current feedback on traces 1130 and 1140. After a few milliseconds, the increase in flux Phi on trace 1180 causes Vd to spike low, but this spike is reversed, and Vd is driven immediately high again, by the feedback paths involving sampled current, traces 1130 and 1140. During this "launch" phase, the flux target is driven regeneratively upward and the drive pulse on 1110 continues with little interruption. The regenerative feedback eventually runs its course and the system proceeds into a "trajectory" phase with Vd low and the combination of magnetic and kinetic energies carrying the solenoid shuttle toward magnetic closure. The rebound from maximum closure brings the corrective feedback processes into play, resulting in a time varying pulse duty cycle on Vd and a settling of the system. If the DAC bias is set higher, the solenoid bumps at full closure, while a lower DAC bias causes the solenoid to undershoot, well short of full closure, and pull closed more gradually with a substantial increase in energy consumption. The traces shown represent roughly the minimum energy setting for the DAC bias. It is possible to adjust the circuit parameters for less pulse duty cycle integral feedback and more sampled current feedback, resulting in closure with little or no overshoot and no continued ringing. When the system is adjusted this way, it has a very narrow margin of stability when load forces are varied, and small errors in setting the DAC bias, either too high or too low, result in instability and chatter of the solenoid. The adjustments illustrated in FIG. 11 are for comparatively robust performance, but with the compromise of poorer settling than for the fast-settling parameters. A dynamic computer simulation of servo operation, as was used for the traces of FIGS. 1, 2, 3, 4, and 11, is an almost indispensable design tool for making this circuit work, given the many nonlinear parameter interactions that must be explored. Actual circuit performance has correlated very well with simulated performance. The equations from which the simulation was developed appear earlier in this writeup.

Log Domain Servo Oscillator

Figure 12:
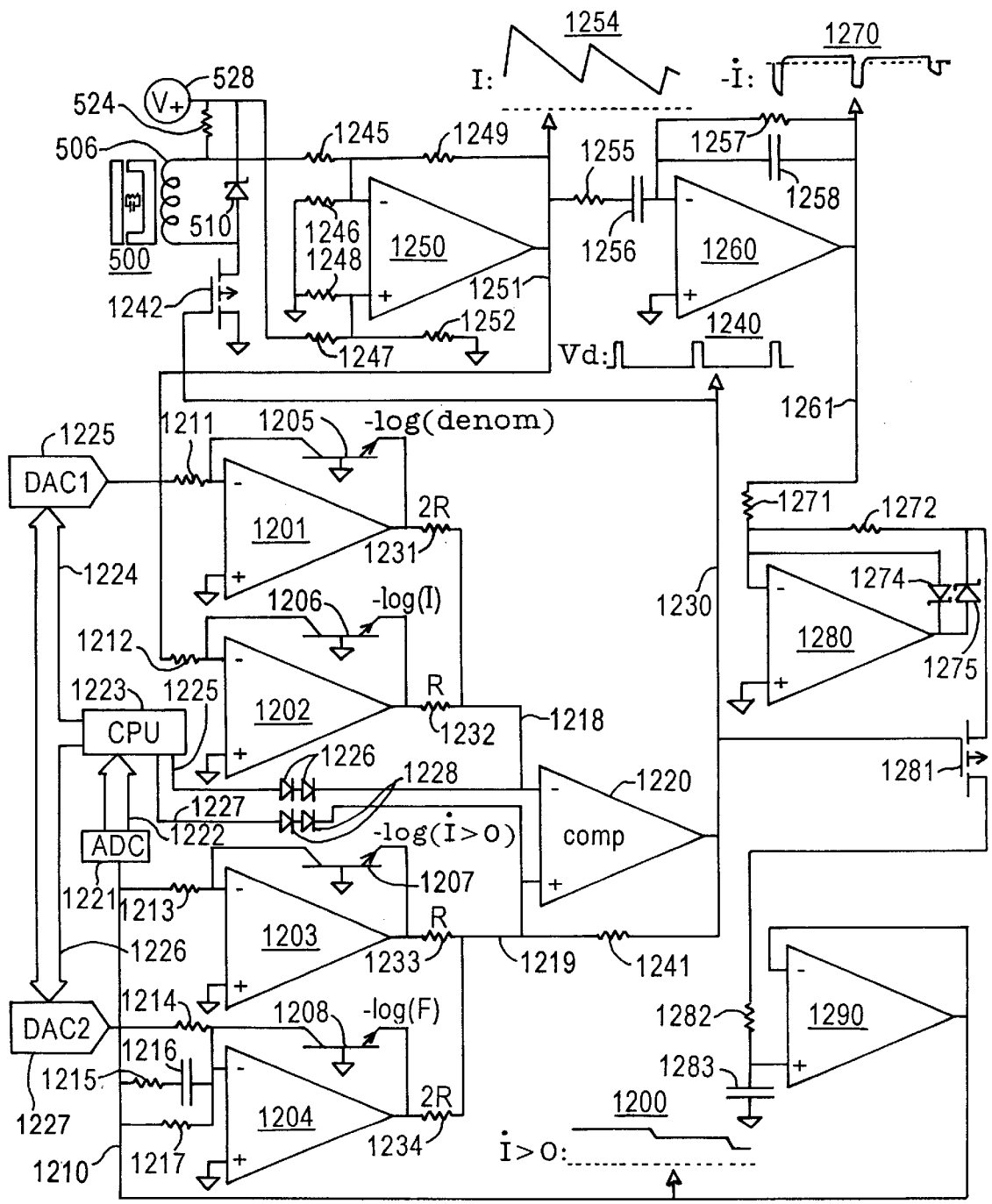
FIG. 12 illustrates a nonlinear oscillating controller circuit that infers armature position from sampled current slope and computes inequalities involving a ratio and a square-law function in the log domain.
Figure 13A:
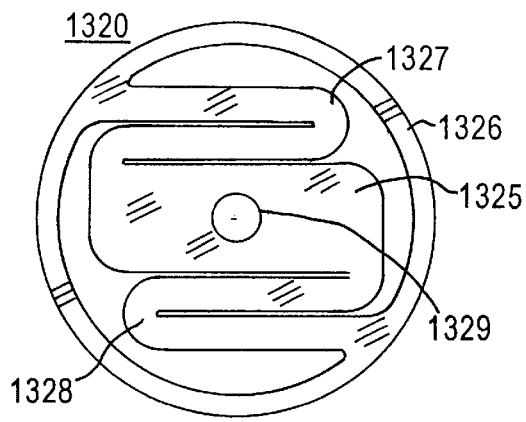
FIGS. 13A–13D illustrate perspective cutaway mechanical drawing of a pot core solenoid with flat spring suspension, in unenergized and energized positions.
Figure 13B:
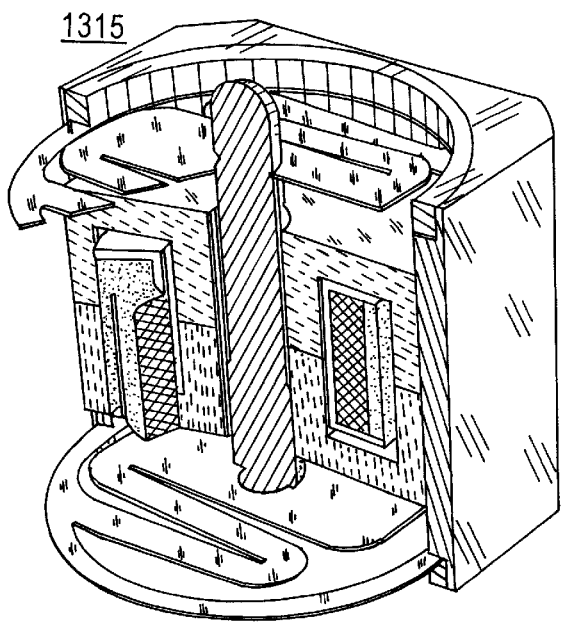
Figure 13C:
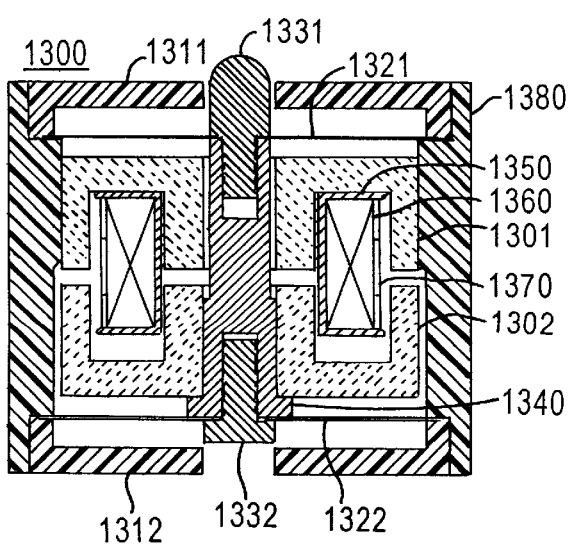
Figure 13D:
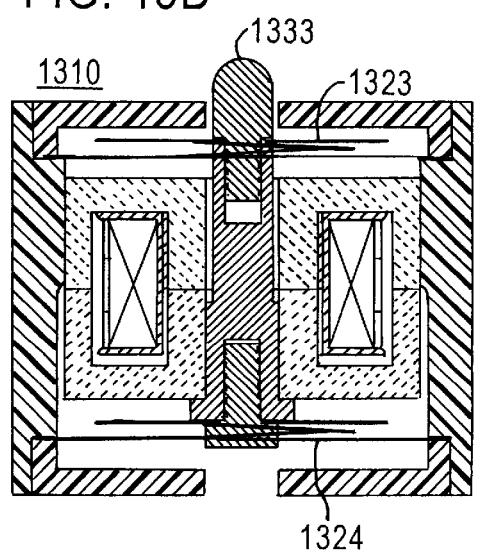

FIG. 12 illustrates how analog computation in the log domain substantially simplifies the hardware for a functional equivalent of the circuit of FIG. 6 while incorporating the advantages of the oscillatory approach of FIGS. 6 and beyond. The FIG. 12 circuit maintains an absolute position reference via AC inductance measurement. Thus, the circuit takes control quickly from any starting position and initial conditions, exhibiting better settling and more robust behavior than was possible with the approximations of the circuit of FIG. 10. Not counting the ping and current source functions of that earlier circuit, the circuit of FIG. 12 requires somewhat more electronic hardware. This circuit relies entirely on current sensing and uses no sense coil. Solenoid 500 is like that of FIG. 5 in its mechanical configuration, except that there is no sense coil shown or used in the FIG. 12 circuit. The drive transistor is 1242, an enhancement mode FET like those shown in earlier circuits, connecting to ground at the source and from the drain to the bottom of drive winding 506, with the gate signal coming from node 1230, the drive logic signal called "Vd" and whose waveform is illustrated at 1240. Positive voltage supply 528, labeled "V+," connects via current sense resistor 524 to the top of winding 506 and to resistor 1245, at the inverting input of balanced differential amplifier 1250. The positive supply at 528 also connects to resistor 1247 at the non-inverting input of 1250. Shottky barrier diode 510 provides a current-recirculation path from the bottom of 500 and the drain of 1242, on the anode side, up to positive supply 528 on the cathode side. At differential amplifier 1250, matched resistors 1245 and 1247 form voltage dividers with matched resistors 1246 and 1248, which connect respectively between the inverting and non-inverting inputs of 1250 and ground on the opposite side of the resistors. Since the common mode voltage coming into the differential amplifier approaches the positive supply voltage and may exceed the input range of the operational amplifier, this voltage division brings the common mode signal at the amplifier inputs to a lower level. Feedback resistor 1249 from the amplifier output on node 1251 to the inverting input is counterbalanced by matched resistor 1252 from the non-inverting input to ground, thus preserving the balance for differential amplification. The current waveform on node 1251 is illustrated by trace 1254, labeled "I:" and showing an exaggerated sawtooth waveform of current as it fluctuates with voltage switching. The zero current level is indicated by a dotted baseline below the trace. The amplitude of this kind of high-frequency sawtooth fluctuation in current is too small to show up in a trace like 1120 of FIG. 11. Band-limited differentiation amplifier 1260 emphasizes the switching-frequency AC component of current, using input capacitor 1256 and band-limiting resistor 1255 to the inverting input of 1260, and parallel scaling resistor 1257 and band-limiting capacitor 1258 in the feedback path from the output on node 1261. The non-inverting input of 1260 is returned to ground. The band limiting of the amplifier may in many instances be only a matter of maintaining stability while pushing for the broadest practical differentiation bandwidth. An alternative approach to differentiation is to use, in addition to the current sense resistor, a small current-sense inductor or a current-sense transformer with low mutual inductance between primary and secondary, so that the transformer output voltage buffered at high impedance represents the time derivative of current. Whatever the differentiation method, the differentiated waveform is illustrated by trace 1270 and labeled "–I:" where the dot above the "I" designates time differentiation. The dotted line running through the solid trace is the zero line. The negative spikes of trace 1270 vary in amplitude very nearly in proportion to effective magnetic gap X, since they vary in proportion to a fixed supply voltage multiplied by reciprocal inductance, which is known to be a measure of X. The effect of coil current is to reduce the magnitude of the negative spikes slightly, and more or less in proportion to X, so that the outcome as perturbed by resistive voltage loss remains nearly proportional to X. This AC approximation of X, based on current slope, is a better measure of position than is winding current, as was used, e.g., in the FIG. 10 circuit. Amplifier 1280 and associated components function as an operational rectifier and inverter for the signal on node 1261. Specifically, 1261 couples to input resistor 1271 to the inverting input of 1280, whose non-inverting input is grounded. There are two feedback paths from the output to the inverting input: via shottky diode 1274 going anode to cathode from inverting input to output and clamping the op amp output of a small negative peak; and via oppositely directed shottky diode 1275 from the output (on the anode side) to series resistor 1272 (on the cathode side), which resistor in turn connects to the inverting input. The signal at the junction of diode 1275 and resistor 1272 is the half-wave-rectified and inverted, originally negative spikes from 1261. Feedback action effectively cancels the diode drop offset at the junction of 1275 and 1272, which node is connected to the source of FET 1281. The gate of 1281 goes high, turning the FET on, when current is ramping up on waveform 1254 and when waveform 1270 is spiking negative. Conduction from source to drain charges sample/hold capacitor 1283, whose opposite terminal is grounded, with resistor 1282 between 1283 and the drain of 1281 providing enough band limiting and resistive impedance to maintain stability of amplifier 1280. Non-inverting buffer amplifier 1290 connects, at its non-inverting input, to the junction of 1282 and 1283, with the output on node 1210 feeding back to the inverting input. The sampled output on 1210 is illustrated by waveform 1200, labeled "İ>0:" because it represents current slope sampled when that slope is positive and stored with the current slope input is negative. This signal also approximates effective magnetic gap X. The signal is used in two ways. First, proportional and derivative signals for position and velocity feedback are controlled by resistor 1217 (proportional term) and capacitor 1216 (derivative term), with resistor 1215 in series with 1216 limiting the bandwidth of differentiation. The series/parallel components just described connect between node 1210 and the inverting input of log amplifier 1204, whose non-inverting input is grounded. An additional summing signal comes from digital/analog converter 1227, labeled "DAC2," via input resistor 1214 to the inverting op amp input. The DAC2 signal represents an effective integral feedback correction, based not on a single shot of the solenoid but on the performance over recent operations, interpreted by software to give the correction. The sum of the three input currents to the inverting input of 1204 is intended to be always positive, and this sum current is drawn by the collector of NPN transistor 1208, whose base is grounded and whose emitter connects to the op amp output, forming a traditional logarithmic amplifier topology with a negative log signal at the output, which is labeled "−log(F)" since it varies as the "target parameter" or target force of the servomechanism, the output of the "outer loop" feedback circuit and target of the "inner loop" feedback circuit described in the "OBJECTS OF THE INVENTION" and "SUMMARY OF THE INVENTION" sections. The positive current slope parameter on 1210 is reused at resistor 1213 to the inverting input of log amp 1203, which uses NPN transistor 1207 in analogous fashion to 1208 of the earlier log amp, generating a signal labeled "−log(İ>0)." The signal on 1210 also connects to the input of analog/digital converter 1221, labeled "ADC," whose output on bus 1222 provides input to the computer 1223, labeled "CPU." On the balancing side from log amps 1203 and 1204, amp 1202 balances 1203, and amp 1201 balances 1204. The input to 1201 comes from digital/analog converter 1225, labeled "DAC 1," via input resistor 1211, while NPN transistor 1205 is matched to and thermally coupled to 1208 for a balanced log comparison. The output from 1201 is labeled "−log (denom)" and represents the dynamically fixed but reprogrammable denominator of the log balance equation. Log amp 1202 is driven by the current signal from 1250 via node 1251 to input resistor 1212, while NPN transistor 1206 is a match for transistor 1207 for the balanced log comparison. The output of 1202 is labeled "−log(I)" in represents the current term in the balance equation.

Magnetic force $F_m$ varies roughly according to the equation: $F_m$/denom=$(I/X)^2$, where gap X is approximated by the signal "İ>0," and denom is a denominator scaling constant. This magnetic force should match the target force F appearing in logarithmic scaling on the output of 1204. Setting $F_m$=F and multiplying through the X-squared denominator yields the expression:

$$F \cdot X^2 = \text{denom} \cdot I^2$$

Taking the log of both sides of this equation and substituting İ>0 for X yields:

$$\log(F) + 2 \cdot \log(\dot{I}>0) = \log(\text{denom}) + 2 \cdot \log(I)$$

The factors of 1 and 2 for linear and square terms are provided by the ratios of resistors 1232 and 1233 from amps 1202 and 1203, labeled "R" for resistance R, and resistors 1231 and 1234 from amps 1201 and 1204, labeled "2R" for double the resistance at 2R, giving therefore half the weighting of the terms associated with the one-times resistance R. The sides of 1231 and 1232 away from the log amps join at node 1218, connecting to the inverting input of comparator 1220, while the sides of 1233 and 1234 away from the log amps join at node 1219, connecting to the non-inverting input of comparator 1220. The output of 1220 on node 1230 feeds back via large resistor 1241 to give a small regenerative feedback to the non-inverting comparator input, giving clean switching between high and low states of the drive signal on 1230, indicated by trace 1240 labeled "Vd:" and representing the variable-duty-cycle drive pulse train going to the gate of FET 1242. The log comparison imbalance thus generates an oscillation at variable duty cycle that dynamically balances the equations and causes the square of flux, generating force, to track the PID motion equation very tightly after a typical initial period of slewing when a circuit is first activated. Completing the circuit, computer 1223 provides output on bus 1224 to set the digital/analog converters 1225 and 1227. Two single-bit digital output from 1223 on lines 1225 and 1227 couple via two pairs of series-connected diodes, 1226 for the pair from 1225, and 1228 for the pair from 1227. Current can flow in the anode-to-cathode direction through pair 1226 from 1225 to 1218 and the inverting input of 1220, so that a high logic level on 1225 will overcome the forward bias threshold of the diodes and push the inverting input positive, forcing the comparator output low. Similarly, a high logic level on 1227 will force the non-inverting comparator input positive, forcing the comparator output high. Thus, computer 1223 can force the initial launch of the solenoid. A potential problem arises if the feedback circuit, under slewing conditions, keeps Vd low, and the drive transistor turned off, for too long, for then the sampling of the position sense signal on 1210 is interrupted. A train of short pulses from computer output 1227 can enforce a minimum frequency of sampling updates, keeping the feedback loop closed.

Pot Core Solenoid with Flat Spring Suspension

FIG. 13 illustrates the mechanical configuration of a solenoid based on a standard ferrite pot core and a flat spring suspension that holds very precise parallel alignment of the pot core pole faces. Ferrites have the desirable property of high resistivity, avoiding the confusing effects of eddy currents that present problems to servo control. Powdered iron cores are also useful, as are cores built of thin laminations of tape, whereas solid iron solenoid cores present eddy current problems. Where magnetic force is to be maximized in a small space, the higher saturation flux of metallic iron is desirable, but where efficiency is sought, oversizing a solenoid core yields good efficiency and provides a good setting for ferrite use.

FIG. 13 shows the flat spring of the design in plan view at 1320 on the upper left, the solenoid assembly in elevation section in open and closed positions at 1300 and 1310 on the bottom left and right, and in cutaway perspective, also in closed position, at 1315 on the upper right. The core halves, labeled in view 1300, are stator 1301 and armature 1302, the stator bonded into cylindrical housing 1380 and the armature clearing inside 1380 while bonding to core 1340. The cores are illustrated with a gap at 1300, and in the energized, fully closed position at 1310. The suspension for the solenoid uses two identical flat springs, illustrated at 1320 and consisting of an outer ring 1326 for mounting in a housing, an inner rectangle 1325 with a center hole 1329 for shaft mounting, and two "staircase" sections 1327 and 1328 placed symmetrically on either side of region 1325. Each "staircase" section consists of two parallel strips which both terminate on the same side, e.g. in the case of 1327, terminating on the left into 1326 and 1325, while the two strips join each other at the "stairway landing," e.g. on the right in 1327. Axial displacement of 1325 relative to 1326 causes the two "stairway" sections to form S-shaped sloping curves (relative to a flat in-plane reference) while the cosine-factor shortening of the flat projection of the sloping "stairway" sections causes the "stairway landing" section at the junction of the two strips to pull in, while the ends of the paired strips make attachment to sections 1326 and 1325 following pure axial motions. The staircase shape just described is viewed in 1310, specifically at views 1323 and 1324 of the springs viewed edge-on flat at 1321 and 1322. Perspective view 1315 aids in visualizing the bend of spring 1324 in three dimensions. Observe that screw cap 1331 of view 1300 is seen pushed further upward in 1333 of view 1310, providing thrust actuation to an external load. An extension from screw cap 1332 could be provided for pull actuation. When the spring is not too extended beyond flat, it has very high rigidity against in-plane movement of the center relative to the perimeter, while compliance to axial motion can be made comparatively high and quite linear.

Observe that all the bending in the spring described here is "planar" or "cylindrical," meaning that local curvature is always tangent to some cylinder whose axis is parallel to the original flat plane. This is in contrast to a flat spiral spring, which is forced to twist with large axial perturbations unless each loop of the spiral makes a full 360 degree arc (or multiple 360 degree arcs) between inner and outer attachments. A thin strip of metal is much stiffer in torsion and in-plane bending than in cylindrical bending. In a flat spiral spring, the initial bending with small departures from a flat plane takes the form of cylindrical bending, since that is the "path of least resistance." At large axial perturbations, as the cosine of the slope of the spiral arms becomes significantly less than 1.0, the center section of a spiral spring is forced to rotate, which in combination with the axial displacement results in twisting and in-plane bending of the flat spring. The overall result is a nonlinear increase in axial force. By comparison, the spring illustrated here does not tend to rotate with axial displacement and has a significantly larger linear range than a comparable spiral spring.

Screw cap 1332 clamps the inside of the lower spring 1322 to core 1340, while lower housing cap 1312 clamps the perimeter of 1322 to the lower inside of outer housing 1380. Similarly, screw cap 1331 clamps the inside of upper spring 1321 to core 1340, while upper housing cap 1311 clamps the perimeter of 1321 to the upper inside of outer housing 1380. Rigid parallel alignment of the pot core halves is important, since the slope between the mating surfaces results in an asymmetric concentration of magnetic flux and force, accentuating the departure from parallel alignment if the guide is not rigid. To establish precise parallelism at closure, one method is to allow for some slop at the outer perimeters of the springs, then to fill the outer clamp areas with adhesive, then to force the core halves together so that they are necessarily parallel, and finally to cure the adhesive (e.g., using ultraviolet curing adhesive), fixing the springs in their intended final positions as the core halves mate.

The windings for the solenoid are indicated in views 1300 and 1310 by schematic "X" shapes for winding cross-sections, with thick inner winding 1360 and thin outer winding 1370 filling bobbin 1350. View 1315 shows the cut ends of the wires. The thick winding would typically be the drive winding, and the thin winding the sense winding, if a sense winding is required by the servo circuit chosen. View 1315 does not show certain details, e.g., the threading of end caps 1331 and 1332 into central shaft 1340, the three components appearing as a single cutaway object in view 1315. Note that end caps 1311 and 1312 of view 1300 are shown with an annular center section cut out for view 1315.

Volume-Control Pump Using Solenoid Actuation and Measurement

Figure 14:
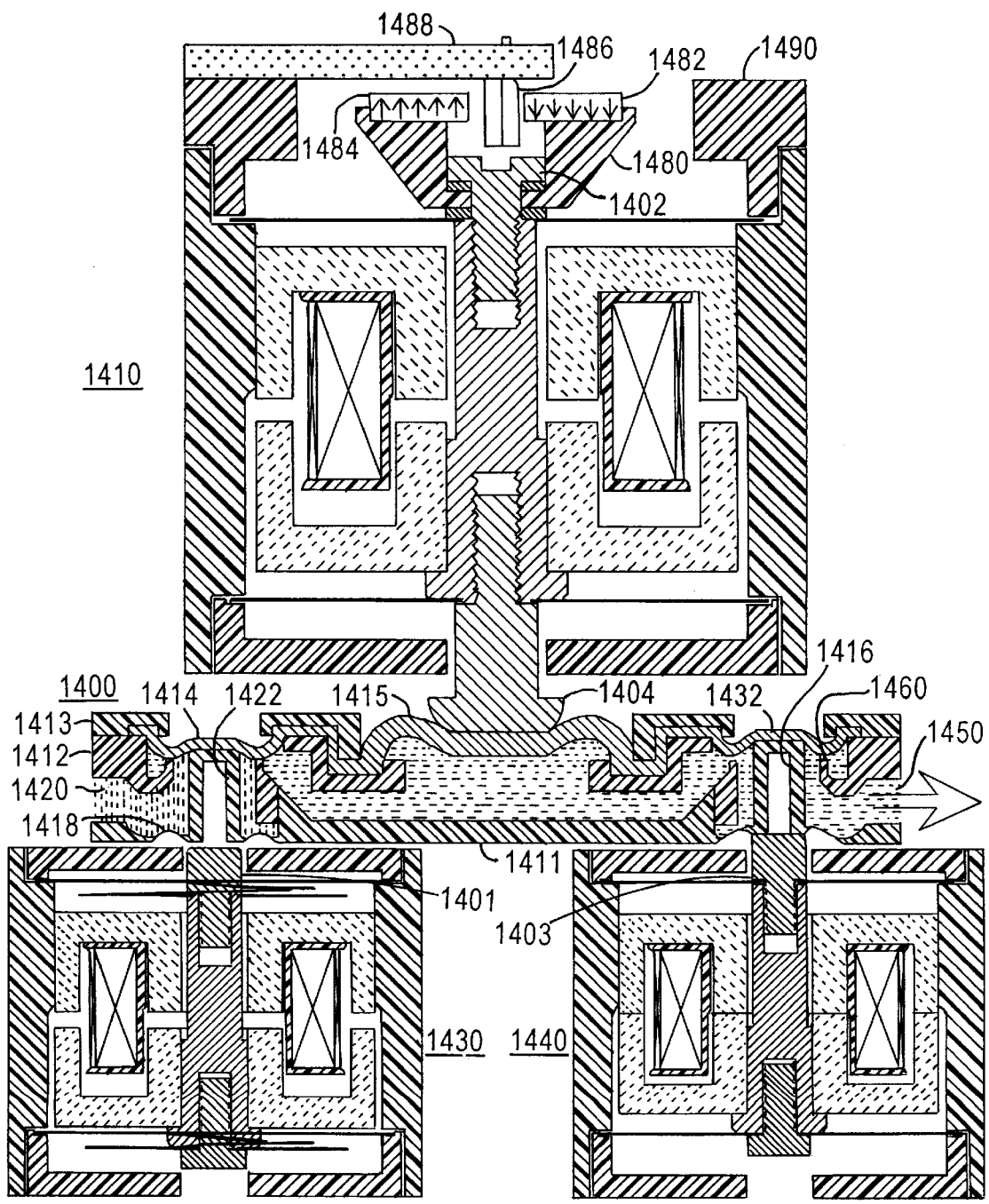
FIG. 14 is an elevation section mechanical drawing of a fluid pumping and volume measurement system using a fluid cassette interfaced to two valve actuation solenoids and a solenoid for combined pumping, volume measurement, and bubble detection.

FIG. 14 illustrates a complete fluid pumping and precision volume control system based on three servo-controlled solenoids: one solenoid each for inlet and outlet valving, and one solenoid for pump actuation and measurement of volume and volumetric compliance. The compliance measurement is useful for quantitative detection of bubbles in the pumped fluid.

The inlet valve solenoid at 1430 and the outlet valve solenoid at 1440 are like the solenoid illustrated in FIG. 13 except for two things: the actuation ends that were shown at 1331 and 1333 have been flattened at the tips of equivalent end caps 1401 and 1403 to lie flush with the top housing surface in the unenergized or retracted position, as shown on the left with 1401 of assembly 1430, and the suspension springs are preloaded differently, so that the spring are flat and relaxed with the solenoid is closed, as discussed below. Like 1333, 1403 is shown in the energized and fully extended position. The pump solenoid at 1410 is a scaled-up version of the valve solenoids, except for modifications to act as a modified pull solenoid, the modification being a suspension bias to push less, rather than pull, when energized. Screw and cap 1402, the counterpart of 1401 and 1403 of the valve solenoids, is used in 1410 to retain the flat spring at its end of the suspension, and to hold magnet holder 1480, which as described earlier (in relation to FIG. 9A) retains magnets 1482 and 1484. Those magnets work in conjunction with Hall effect device 1486 as a displacement sensor, as discussed. Cap 1404, the counterpart of 1332 of FIG. 13, extends into a foot that pushes on a rubber dome 1415, which is part of larger molded rubber component that includes valve domes 1414 and 1432. In its relaxed shape, this dome has a nearly hemispheric shape, but when cassette 1400 is loaded into place between the actuator solenoids, the dome is compressed by 1404 as shown.

The pumping and fluid metering action to be described below is similar to the operation of the invention described in Applicant's U.S. Pat. No. 5,624,409, "Variable Pulse Dynamic Fluid Flow Controller," sharing with that invention the use of valve timing synchronized to the natural periodicity of fluid flow into and out of a container having fluid volume compliance, so that flow can be maximized in a resonant pumping mode, or controlled in very small-volume fluid pulses utilizing a combination of valve timing and fluid inertia to give a non-linear flow regulation affording a very wide dynamic range of delivered pulse volumes. The operation described here shares the fluid volume measurement function described in U.S. Pat. No. 5,624,409, except that in the invention described here, the measurement device doubles as the actuation device, i.e. the solenoid, in an active pump. The system of U.S. Pat. No. 5,624,409 was conceived as a passive metering device reliant on fluid motive force from a pressurized fluid source, unlike the active system described here.

When solenoid 1410 retracts, pulling foot 1404 back from the position drawn, the preload in the rubber dome generates a negative fluid pressure in the fluid beneath the dome, here shown as continuous through the outlet valve area on the right, around 1416, and continuous with the exiting fluid indicated at 1450 (fluid connections to the right of 1450 not being shown). Thus, in an inlet stroke, the valve on the right is closed and the valve on the left, around 1422, is opened, 1410 is energized, 1404 retracts and relieves the downward force on 1415, dome 1415 responds by expanding upward toward its original molded shaped and generates a negative pressure underneath, drawing fluid in from the inlet fluid at 1420 (fluid connections to the left of 1420 not being shown). Typically 1404 retracts faster than inlet fluid can follow, and the pump solenoid soft-lands under servo control and holds near closure fluid comes through the inlet to fill in under dome 1415 and allow that dome to catch up with foot 1404. With optimum timing, the valve around 1422 closes just as the kinetic energy of incoming fluid has paid out fully in fluid volume overshoot and flow has come to a complete halt. One timing method causes 1410 to be de-energized a few milliseconds before the inward fluid flow through the inlet valve has come to a halt, at which time 1410 is retracted with its magnetic gap as close as practical to full closure and mechanical contact, i.e. hovering under servo control at a minimal gap. The springs in 1410 at this point resemble the springs illustrated for solenoid views 1440, 1310, and 1315. As the current and magnetic field decay in 1410, the decay of magnetic force ceases to counterbalance the downward spring force, so that foot 1404 would be inclined to start dropping. With proper timing in relation to the momentum of incoming fluid, however, the buildup of fluid pressure under dome 1415 will roughly counterbalance the increase in downward force on 1404, so that as fluid flow comes to a halt, fluid pressure will reach its maximum in balance with the suspension springs of 1410, and 1404 will barely move during the final decay of solenoid current and synchronized buildup of fluid pressure. The drive to 1430 is removed in anticipation of a slightly delayed mechanical response bring about fluid shutoff at just about the moment when fluid flow stops and would reverse if the valve were to remain open.

Bubble detection can proceed at the end of a fluid fill stroke, when both valves are closed, by at least two distinct approaches. By a "static" approach, a high impedance solenoid current source circuit, such as is illustrated in FIG. 10 around amplifier 1090 and transistor 1099, is used to halt the decay of solenoid current and hold current at a steady level, resulting in some magnetic closure force, reduced force on foot 1014 (as compared with the zero-current force), and therefore reduced initial fluid pressure under dome 1415. A ping measurement then determines the effective magnetic gap X of 1410. Solenoid current is then altered, e.g. reduced to zero, and a second ping measurement determines the new position X at the new force and fluid pressure. The change in X from the one measurement to the next, for a change of force that is readily calculated from the current levels and ping frequencies, is a measure of compliance of dome 1415 and the fluid underneath. With bubble-free fluid, there will be a normal, low compliance associated with stretch in the rubber dome, which by design is relatively thick and whose unsupported annular area outside the contact of 1415 is, by design, roughly the surface of revolution of a circular arc, thus describing a slice out of the top of a circular torroid, a shape that tends not to be deformed by fluid pressure. If bubbles are present in the fluid, the compliance of the dome will be measurably increased, indicating the approximate total bubble volume. By a "dynamic" bubble detection approach, solenoid drive winding current in 1410 is forced rapidly to zero at the end of the fluid inlet cycle, e.g. by use of a zener diode "braking" circuit such as is illustrated in FIG. 10 and described earlier in relation to the operations of optical switch 1088 and series diodes 1097 and 1091, the latter being the zener diode. The sudden removal of solenoid current causes solenoid foot 1404 to fall into the fluid filled cushion of dome 1415. The dynamics of the resulting short drop and bounce provide a clear indication of gas bubbles captured in the liquid chamber. With no bubbles, the dome will compress comparatively little, causing the solenoid to rebound quickly into a comparatively high frequency transient oscillation. Bubbles will allow the dome to compress more and rebound more slowly into a lower-frequency transient. Detection of the transient can be observed in various ways. If the Hall effect motion sensor is implemented as drawn in FIG. 14, digital sampling of the Hall sensor output will record the transient for analysis. Another approach is the dynamic analysis of an inductor-capacitor ping transient, using a circuit like that of FIG. 10. By opening switch 1088 to bring the zener braking into play, and more or less simultaneously closing switch 1087 to bring ping capacitor 1063 into play, current will stop and a ringing transient will occur starting just as the downward spring force on 1404 reaches its maximum with the removal of opposing magnetic attraction. The transient bounce behavior of the solenoid will be reflected as a frequency modulation in the electromagnetic ringing response of the solenoid inductor-capacitor circuit. This oscillation may be monitored via ADC interface 1040 of FIG. 10.

Once inlet fluid is captured under dome 1415 and ping measurements have performed any needed bubble checking and determined a resting position measurement of X and, by calibration, the associated fluid volume, then fluid can be released via the valve around 1416 and through the port at 1450 to delivery tubing and a delivery site not shown. As described in Applicant's U.S. Pat. No. 5,624,409, fluid can be released in small pulses or in a maximum-volume bolus, with the outlet valve opening timed to last for approximately on half the natural oscillation period of the outlet path, taking account of fluid inertia and compliance particularly of the volume under 1415 coupled with the spring suspension of 1410. Depending on tubing length and diameter and the nature of the fluid-receiving load, there may be significant overshoot to the expulsion of fluid from under 1415. FIG. 14 illustrates an unloaded solenoid position of 1410 that would be observed at the end of a resonant half-cycle fluid expulsion, when the suction generated by fluid overshoot has pulled a negative pressure under 1415 and caused that dome almost to break contact with foot 1404, leaving the suspension springs in 1410 fully unloaded and flat, as drawn. Under most operating conditions, foot 1404 will be pushed upward to some degree by a combination of elastic forces in dome 1415 and fluid pressure beneath 1415, with the metal spring suspension providing a counterbalancing downward force. It is helpful to consider dome 1415, with its spring rate and preload, as an integral component of the mechanical suspension of 1410. Thus, at equilibrium with zero fluid pressure, 1404 is pushed upward somewhat from the position illustrated and a preload in the flat metal springs of 1410 is balanced against an opposing preload in the rubber of dome 1415.

Examining fluid cassette 1400 in more detail, small rubber dome 1414 on the left is similar to dome 1415 except that its convex surface faces inward to the contained fluid, as is the case with similar dome 1432 on the right. The three domes are clamped between upper plastic housing pieces 1413 and 1412, which are continuous across the top of the cassette from the far left to the far right, even though holes in the plastic lying at the plane of the elevation section view cause the sections of upper housing to appear to be discontinuous. The different hatching pattern on 1413 and 1412 shows which parts viewed in section belong to which whole piece of plastic. Observe that piece 1412 forms a circular ridge coming up under the annular bulge in dome 1414, and similarly under dome 1432. The right hand circular ridge is seen to be separated from dome 1432 at the gap indicated by 1460, and around that perimeter. Thus, the right hand valve is shown open. All fluid contiguous with 1420 is hatched with vertical dashes, while fluid contiguous with 1450 through the opened outlet valve is hatched with horizontal dashes. Observe that this outlet fluid is continuous around the outer perimeter of dome 1414, being seen in an only apparently isolated area just below and to the left of 1414. Bottom plastic piece 1411 of cassette 1400 is bonded to 1412 out of the section plane of the figure and, in the viewed section, just below the inside edges of the circular valve ridges, supporting the ridges at the part of their perimeter where a gap in 1412 allows fluid flow to communicate from the outer perimeters of domes 1414 and 1432 into the central fluid reservoir under dome 1415. A valve actuation linkage is seen formed in piece 1411 at pusher cylinder 1422, which is held up against dome 1414 by force exerted from cap 1401 of the inlet valve solenoid. The thin curving annulus 1418 makes a flexible rolling seal for permitting axial motion of plug 1422 while maintaining a fluid seal. This flexing seal is comparable to the shape found around the perimeters of audio loudspeaker cones. On the right, cylinder 1416 is seen pushed up by actuator cap 1403, and the deformation of the flexible seal around the bottom of 1416 is evident by comparison with 1418. The upward thrust of 1416 is seen to unseat the ring of contact between dome 1432 and the circular valve ridge formed in piece 1412, opening the valve. The valves are held closed by preload in the rubber of dome areas 1414 and 1432, pushing down on the circular ridges. Thrust cylinders 1422 and 1416 are always pushing upward when the cassette is loaded in contact with the valve actuators, as indicated by the stretching of the flat spring in solenoid 1430. Energizing a valve solenoid adds magnetic force, increasing that upward thrust and caving the dome center sufficiently to cause an annular opening around the circular ridge seal. When the cassette is removed from contact with the valve actuators, cylinders 1422 and 1416 are pushed down by rubber domes 1414 and 1432 until, at maximum extension, the rolling seal sections at 1418 and the comparable section on the outlet side are stretched into conical surfaces extending down, with little preload remaining in the valve domes. Thus, it is seen that coupling the cassette to the valve actuators moves the valve domes to a shape, in dynamic balance with the valve actuator spring, partway toward opening, so that a relatively small magnetic thrust force and small motion suffice to open a valve. The first fraction of the powered solenoid thrust, e.g. the first third, stretches the dome, while the second fraction of travel opens the valve. The gap opened up, e.g. at 1460, is less than the second fraction of solenoid travel, e.g. half of that second fraction, so that by this example, a total valve thrust of 0.024 inches would initiate valve opening after 0.008 inches, and over the next 0.016 inches of actuator travel the valve gap would open by 0.008 inches, quite sufficient for flow in a medical disposable.

The effect of fluid pressures on valve operation in cassette 1400 is a significant issue for smooth operation without sudden closure and cavitation. The effective displacement areas subject to force from fluid pressure are preferably matched between flex area 1418 and fluid-exposed dome area 1414, and comparably for the flex area opposing dome 1432. Dividing pressure effects into differential pressure effects, related to the pressure difference across a valve, and common mode pressure effects, related to the average of the pressures on either side of a valve, the intent of this design is to minimize the effect of common mode pressure. An increase in common mode pressure pushes down on cylinder 1422 via pressure exerted on 1418, but the pressure partially unloads the dome force whereby 1414 pushes down on 1422. Thus, a change in common mode fluid pressure has only a minor effect on actuator position. When a valve, e.g. the inlet valve, is closed, the displacement area on the inner annulus of 1414 is less than the displacement area at the same pressure on 1418, so that a positive increase in inlet fluid pressure from 1420 would tend to push 1422 down, keeping the valve closed. A negative pressure communicated from the volume under dome 1415 would reduce the upward force on 1414, again tending to close the valve. Thus, a differential pressure going positive to negative from inlet to pump chamber tends to close the inlet valve, and conversely, an outward-directed pressure differential tends to open the inlet valve. The valve can thus be compared to a fluid diode with a relatively low forward cracking pressure and a much higher cracking pressure, associated with the total positive pressure tending to cave dome 1414 in and cause the dome to lose contact with thrust cylinder 1422. If the inlet valve is thrust open by solenoid actuation and begins to close in the presence of fluid flow, it will tend to slam shut abruptly as an increasing pressure differential across the closing valve drives the valve toward further closure. This regenerative closure action is absent for flow in the opposite direction, from pump chamber to source, since the developing pressure differential across the valve tends to keep the valve open. The outlet valve performs similarly, tending to close smoothly, providing a continuous braking action to outward fluid flow as solenoid actuator force is reduced. Recalling the response of the servo circuit of FIG. 10 to the control signal "OPEN" at 1011, it is seen that a ramped reduction of electromagnetic force on solenoid 1440, generated when logic level "OPEN" goes high, will result in a smooth throttling of fluid flow, avoiding waterhammer and cavitation effects with the dome valve discussed here (as contrasted, e.g., with a tube pinch valve, which tends to self-close abruptly.) In intended operation of the fluid flow control system of FIG. 14, using control strategies described in detail in Applicant's U.S. Pat. No. 5,624,409, a common operating procedure is as follows: 1) perform a ping measurement on 1410 to determine initial fluid volume in the pump chamber; 2) apply power to pump actuator 1410, initiating a decrease in fluid pressure in the pumping chamber below dome 1415; 3) possibly before or possibly after step 2 in temporal sequence, depending on response delays, apply power to valve actuator 1430, so that valve opening will commence at about the time that pumping chamber pressure drops before inlet pressure; 4) allow actuator 1410 to approach magnetic closure under servo control; 5) allow enough time for fluid flow acceleration and deceleration that dome 1415 begins to catch up with foot 1404; 6) remove power from 1410 just in time to prevent fluid momentum from causing this actuation solenoid to be bumped closed, which would otherwise cause an audible click; 7) possibly before or possibly after step 6 in temporal sequence, depending on response delays, remove power from 1430 early enough that fluid closure will be reached just as flow through the valve is reversing; 8) perform a ping measurement with 1410 to compute fluid volume, subtracting the volume from step 1 in order to update the long-range cumulative estimate of delivered volume; 9) energize valve actuator 1440 for a predetermined pulse interval, allowing some fluid to exit the pumping chamber; 10) repeat the ping measurement of remaining fluid volume, compute the delivered volume, and determine a correction for a subsequent outlet valve pulse, if called for; 11) repeat steps 9 and 10 zero or more times, to complete the fluid delivery cycle.

The sequence just described is modified according to desired fluid delivery rate and current progress relative to the time-varying target for total delivered fluid. Long-term cumulative volume is always based on volume difference from just before to just after an inlet stroke, so that uncertainties of long-term drift in the volume estimation are minimized. For a high delivery rate, a maximum volume intake is followed by a maximum volume delivery, each with a flow pulse timed to the natural half-period of oscillatory flow on the inlet or outlet side (unless, e.g., the outlet flow dynamics are more than critically damped, in which case the "ideal" outlet flow pulse interval is less well defined.) For a lower delivery rate, the outlet flow pulse is interrupted by valve closure in early to mid course, before a maximum volume has been delivered, and the fluid energy available from the pump chamber, amounting to spring energy stored in the suspension of 1410, is paid out over two or more pulses. It is in this form of operation that smooth release of the valve actuator, and inherently smooth, non-regenerative action of the fluid valve, are essential to quiet operation without cavitation bubbles.

In addition to the operating modes just described, a "firehose" operating mode is possible with the hardware of FIG. 14. Ideally the inlet fluid connection from 1420 has a low impedance, both low resistance and low fluid inertia, so that fluid can be drawn in quick pulses. The outlet connection from 1450 typically has a much higher impedance, including the substantial inertia of fluid in a long tube. Consequently, the natural period for fluid oscillation involving inertia and the spring rate of the pumping chamber is much slower for the outlet side than for the inlet of the pump system described here. Firehose mode pumping begins with a fill pulse, as described in steps 1 through 7 above. The outlet valve is then opened and maintained open continuously. As the pump chamber begins to be depleted and fluid pressure is dropping, refill steps 1 through 7 are repeated while outlet flow is ongoing. With sufficient momentum in the outlet line, the negative pressure spikes to pull more fluid into the pump chamber will not last long enough to halt the outlet flow, so that continuous flow will be maintained as the inlet and pump valves cyclically recharge the pump chamber. Volume cannot be tracked as accurately in this mode, since inlet and outlet flow overlap in time. Volume can be estimated from the dynamics of pumping performance. In typical medical infusion applications, volumetric measurement and control are of secondary importance when a maximum rate delivery mode is invoked.

Low Power Hovering/Levitation Servo Using Permanent Magnets

Figure 15:
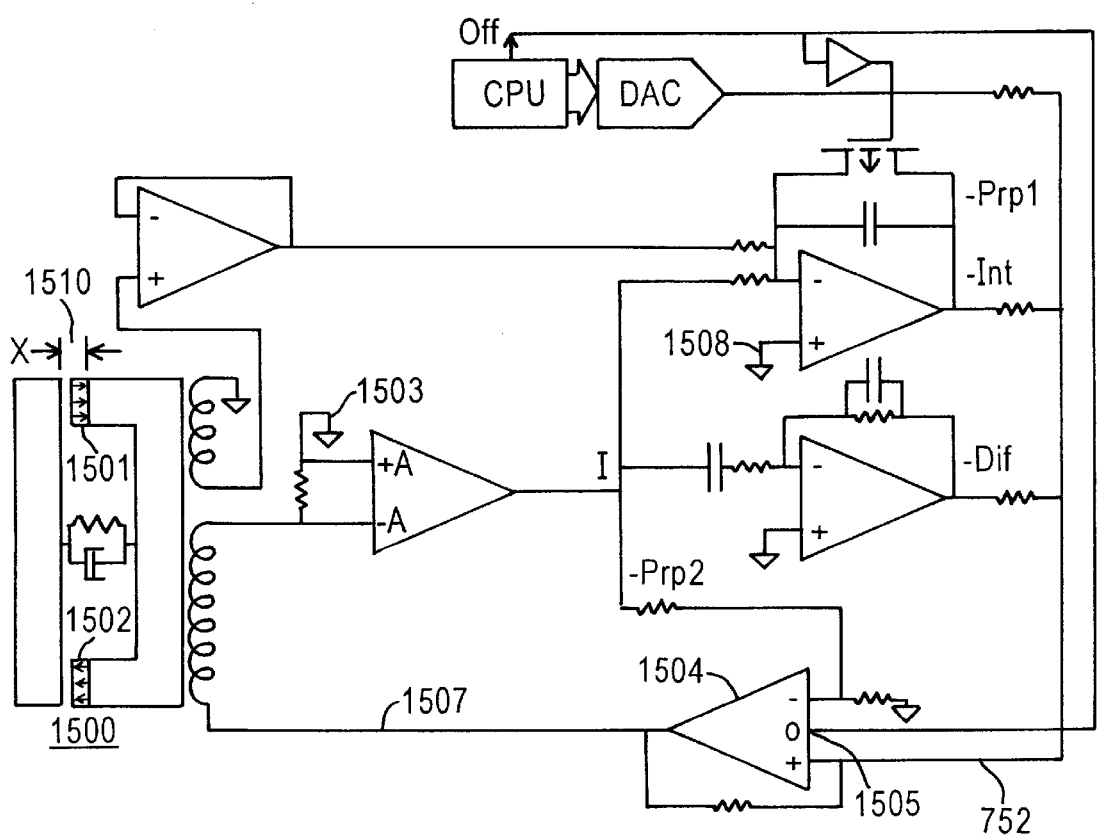
FIG. 15 illustrates a circuit similar to FIG. 9 except driving a solenoid with permanent magnets for hovering or levitation at near-zero power consumption, and with the switching amplifier modified for bipolar operation.

FIG. 15 illustrates a modification of FIG. 9 to use permanent magnets for maintaining solenoid position hovering near closure, exerting continuous magnetic force with near-zero power consumption. A single-point hanging levitation system could share the same electronic configuration. A two-point or multi-point levitation system could use two or multiple copies of the electronics, one for each independent degree of freedom of the suspension. The comparator 790, NOR gate 720, and switching transistor 730 inherited by FIG. 9 from FIG. 7 are replaced in FIG. 15 by power amplifier 1504, whose output stage is designed for a switching output voltage able to swing very close to either the positive or the negative supply rail. Amp 1504 is designed to be turned off when the center input 1505 between the inverting and non-inverting inputs, labeled "0," is driven high by the "Off" signal 752 originating in FIG. 7. This shutoff function parallels the NOR gating function first introduced in FIG. 7 at 720. The bipolar amplifier output is required so that line 1507 to the drive coil can go on either side of the ground reference provided on the other side of the coil, at 1503, which in FIG. 9 was a positive power supply connection. A current sense resistor and associated differential amplifier are as in FIG. 9.

The primary difference between the system of FIG. 15 and that of FIG. 9 is the inclusion in solenoid assembly 1500 of permanent magnets at 1501 and 1502, on the pole faces where the magnetic flux loop closes. These magnets are symbolized by small arrows in the direction of poling. As far as dynamic inductance is concerned, permanent magnet material has a relative permeability (compared to vacuum) generally between 1.0 and 1.20 (excepting for Alnico magnets, whose relative permeability is much higher), so the effective dynamic inductance gap X is drawn at 1510 to include most of the thickness of the permanent magnet material, as if that material behaved inductively almost like air. The other effect of the magnet material is to add the equivalent of a DC bias current flowing through the drive coil. If this equivalent bias current is called "Io" as in 862 of FIGS. 8 and 9, then a sensed current of zero at the sense resistor and differential amplifier will be equivalent to a current of Io in the earlier context. Thus, the bias potential to the integrator non-inverting input at 1508 is set to zero, i.e. ground potential, instead of Io as at 862 of the earlier circuit. With these modifications, the control circuit seeks out the gap X for which magnetic force is in balance with mechanical load force at zero average output current. At circuit equilibrium, for symmetric positive and negative supply voltages the output from 1504 on 1507 will be a square wave at 50% duty cycle. The current will resemble a triangle wave fluctuating about a zero average, and most of the supply current drawn during part of a conduction cycle from a given supply (positive or negative) will be pumped back into that supply by inductive action over another part of the conduction cycle. Thus, the power drawn for maintaining hovering or levitation will be the low power necessary to keep the electronic circuit "alive," to overcome AC magnetic losses and transistor losses associated with switching and the maintenance of a low level current ripple, and to provide perturbations in magnetic force for correcting position errors.

The increased value of effective gap X arising from the inclusion of permanent magnets implies that more coil current must be used to vary the magnetic field than would be required if the permanent magnet material were filled with a high-permeability transformer-type of material. If the major power requirement is for static holding, then using a permanent magnet to offset DC electric power is well worth the sacrifice in AC efficiency. In a magnetic propulsion system to be explained below, however, large AC field variations are employed to effect propulsion, as the steady DC work of lifting is taken over by permanent magnets. To minimize AC power consumption in such an application, the permanent magnet material should be configured, in the geometry, to be thin and spread out over a wide area, so as to offer a low dynamic reluctance to the magnetic path, where reluctance varies as the ratio of length along the magnetic path divided by area. This geometric proportioning implies that the permanent magnet material will operate at a low permeance coefficient, which is equivalent to saying that the material will experience a high steady demagnetizing H-field. The factor for increased AC current needed to generate a given AC field strength, due to the addition of permanent magnet material, is given very roughly by 1+Pc, where Pc is the steady permeance coefficient at which the permanent magnet operates in the magnetic circuit. The highest energy product for a permanent magnet is obtained at a Pc of about 1.0, implying a doubling of AC current and a quadrupling of AC power for a given AC flux excitation, compared to operation with no permanent magnet. Most permanent magnets are operate at a Pc greater than 1, but in contexts to be described for magnetic levitation and propulsion, values of Pc of 0.5 or less are desirable. While a low Pc implies a high steady demagnetizing H-field, the application of AC coil power will cause higher peaks in the demagnetizing H-field, driving the net flux in the permanent magnet material dynamically to nearly zero. The material chosen for such an application must necessarily have a high coercive force so that the material will not be depoled by the stresses of operation. Furthermore, for a relatively thin layer of permanent magnet material to be effective at generating a field bias, the material must have a high poling strength, which amounts to saying that the residual B-field, Br, needs to be high. The highest available energy-product Neodymium Iron Boron magnet materials have high Br, exceeding 1 Tesla, but not a high enough coercive force to operate at very low permeance coefficients, with additional AC field variation, without significant loss of strength. Formulations optimizing high coercive force are to be sought for good performance under the conditions described. The amount of material required will exceed the minimum that would merely produced the needed lifting force over a given gap, if the design is further optimized for efficient AC performance. These expense compromises will, however, pay off richly in achievement of a very efficient lifting and propulsive magnetic motor, as will be seen.

Note that the modifications to the circuit of FIG. 9 for inclusion of permanent magnets apply similarly to modifications to the circuit of FIG. 12. One need only provide for bipolar current drive, set the target gap to an estimate of the zero-current gap, and effect integral feedback through the computer interface to dynamically re-bias the system parameters to achieve the zero-current gap. An analog integrator can also replace the microprocessor loop.

Servo for Symmetric Landing

The servo systems described above control one axis of motion. The inherent instability of magnetic alignment has been noted, and a spring suspension system for rigid alignment control has been described. One can correct the alignment of an object by the same techniques used to control position, sometimes with simplifications over the general servo control problem. Consider a solenoid fabricated from standard "E-I" core parts, where the E-core is the stator and the lighter I-core is the armature, drawn to the E-core. As the I approaches the E, any tilt placing one end of the I closer to the E than the other end will cause a concentration of magnetic flux across the narrower gap. For small alignment errors and no core saturation, the destabilizing magnetic/mechanical spring rate is given roughly by the total force of attraction between the E and the I, multiplied by the cube of the distance between the centers of the center and end mating surfaces of the E, and divided by the square of the average gap. This destabilization can overcome very stiff suspensions near closure. Magnetic alignment correction becomes more precise as the gap becomes smaller, with no singularity in the servo loop as the gap approaches zero if the total magnetic force is also under control.

Consider an E-core with two pairs of windings: a force drive and force sense winding wound around the center prong of the E, and an alignment drive and alignment sense winding on each end prong of the E, the end windings being wired in series so that current flow is in the opposite rotation sense at either end, as with current going around a figure-8 loop. Thus, after interconnecting the alignment windings, one has a pair of drive leads and a pair of sense leads coming back to the electronic controller, as with an ordinary drive and sense winding. The signal from the sense winding represents the rate of change of flux imbalance between the ends of the E, and the time integral of that signal represents the total flux imbalance. Merely shorting the asymmetry drive winding causes an electromechanical damping of the kind of rotation of the I relative to the E that generates unequal gaps, while shorting a superconductive figure-8 winding around the ends of the E would almost cancel the destabilizing torsional force. The circuit of FIG. 15 can be used in a symmetry-maintaining servo, accomplishing roughly the function of a superconductive loop, and more. In FIG. 15, the feedback signal component "−Prp1" originating from integration of the sense coil output voltage accomplishes roughly what a superconductive figure-8 winding would do: to generate a steady current in response to a change in magnetic flux, whose current direction is such as to cancel that change in flux. While this function fights the basic instability, the damping differentiation loop aids fast settling, and the integration of the current signal provides the feedback that drives any residual asymmetry completely to zero: only with a flux balance will no current be required to prevent armature rotation.

If conditions at the start of gap closure are nominally symmetric, i.e. when the initial asymmetry is small and unpredictable, then the best guess for the DAC output in FIG. 15 is zero. Thus, the DAC and its output resistor may be eliminated for most symmetry applications.

While a circuit of the topology of FIG. 15, or simpler, can be used to correct angular misalignment about one axis, two such circuits can correct angular misalignment about two axes, bringing two solenoid components together completely flat. Consider replacing the straight cross-piece of an I core with a "+" shape, and replacing the E core with a "+" having four square prongs extending from the tips of the "+" shape, like two E-core shapes on their backs, perpendicular and superimposed. A pair of symmetry servos can accomplish parallel hovering and "four-point landing" as mentioned early in this paper.

System for Levitation and Linear Propulsion

The principles illustrated above find potential applications in heavyweight lifting, e.g., of a levitated monorail car suspended below a track. When a long object is suspended from a narrow rail, a two-variable suspension servo is required, to keep the car up and to keep it level from front to back. To provide fore and aft propulsive thrust and braking, the shape of the lower surface of the track is modified to include periodic waves of vertical ripple, varying the height of the track with variation in longitudinal position. Waves of variation in magnetic field strength are generated within electromagnets and their associated control modules arrayed along the length of the car, those waves being caused to travel backwards along the car at a velocity that synchronizes the waves that travel with respect to the car to the stationary vertical ripples in the track, so that a given portion of the track sees a relatively constant magnetic field strength during the passage of the car. Control of the phase and amplitude of the waves in magnetic field strength with respect to the waves of vertical ripple in the track will result in control of thrust or braking.

Figure 16:
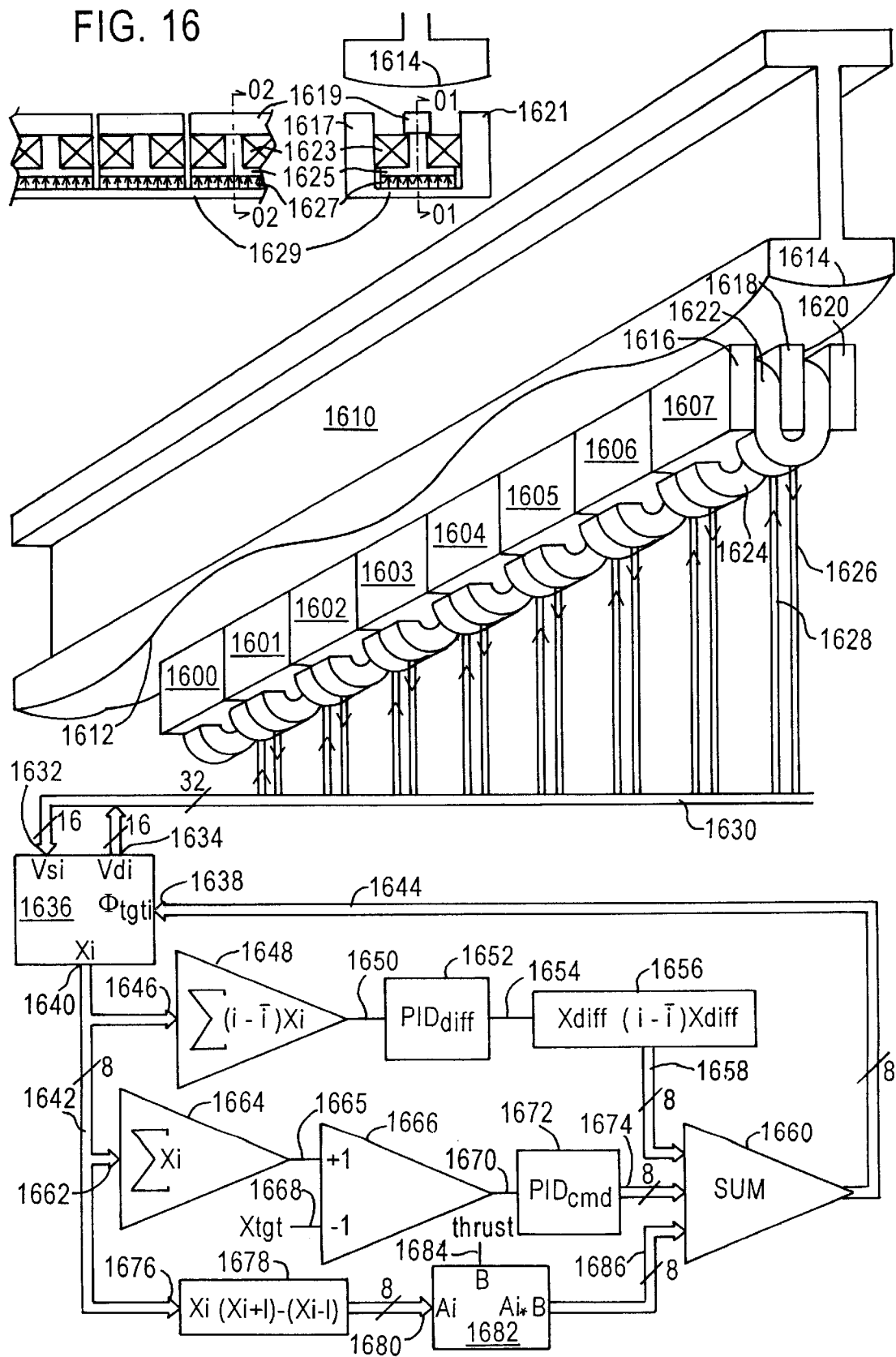
FIG. 16 illustrates a servo system for two-point magnetic levitation and propulsion of a monorail car suspended below a track.

The suspension problem can be approached as two independent servos for the ends of the car, or as a levitation servo for common mode control and a symmetry servo for differential mode control. In either case, individual electromagnetic control and actuation modules, receiving individual flux-target inputs and providing individual position-indicating outputs (or current-indicating outputs, since current required to achieve a given magnetic flux is related to position, or magnetic gap), are controlled as groupings of inputs and outputs. Separate groupings control different degrees of freedom of the motion of the car, e.g., vertical height, fore and aft pitch angle error, and thrust or braking force. A generalized "position" signal associated with a degree of freedom of the motion of the car is represented as a weighted average or weighted sum over a grouping of control and actuation modules. Weighted sums applicable to the geometry of the suspension drawn near the top of FIG. 16 are: a set of similar positive weightings to indicate vertical height; a set of weightings varying from positive at one end of the row of actuation modules to negative at the opposite end of the row, to indicate fore and aft pitch angle error; and two sets of weightings varying periodically between positive and negative values, matched to the wavelength of the periodic vertical ripple along the longitudinal dimension of the track and differing in phase relative to the track ripple by 90 degrees, to indicate the sine and cosine components of position of the modules relative to the track ripple. (The circuit schematic of the lower part of FIG. 16 implements a slightly simpler thrust approach, based on track slope measurements between pairs of modules straddling a given module, rather than on a sine/cosine reduction across the entire set of modules.) Associated with a given weighted sum of position-indicating signals relating to a given control degree of freedom, is a set of servo output signals associated with the same degree of freedom. In the case of magnetic wave generation for thrust or braking, differing components of an output signal set will generally contain different phase information. Outputs to control a positioning or alignment degree of freedom will generally represent separate weighting factors of a single scalar value, that scalar being the input weighted sum. The geometric pattern of output weightings typically resembles the pattern of input weightings, e.g., equal input and output weightings for lift, or weightings varying linearly with position for pitch angle control.

With active control of elevation and pitch, the degrees of freedom of lateral translation, yaw, and roll come to be regulated passively. If the fore and aft suspension magnets tend to self-center laterally because of their geometry, then lateral translation and yaw will be passively stable. For an object hanging below a track, gravity controls roll. For high speed operation of a rail car in wind and rounding corners, very effective damping of roll (i.e. of swinging below the rail) can be provided by active aerodynamic fins. Fore/aft position is not controlled in the static sense, being the direction of travel, but thrust and braking may be controlled by synchronization of traveling waves of magnetic flux to the waves of vertical height along the longitudinal dimension of the track, as explained above.

To minimize magnetic losses due to hysteresis and eddy currents in the track as the levitated system moves at high speed, the lifting electromagnets preferably generate fields laterally across the track, rather than fore and aft. The lifting electromagnets should abut each other so that their fields merge into a fairly uniform field over a substantial length of track, ideally over the entire length of the magnetic lifting system. The electromagnets cannot readily merge their fields "seamlessly" along the length of the car (although geometries of permanent and soft magnetic materials could greatly smooth the field), for some magnetic separation is required to isolate the different actuation signal strengths of the different magnets. The magnetic field induced in any part of the track goes from zero to a maximum and back to zero just once during the passage of the levitated car. The slight separation of the magnet sections will inevitably cause some ripple in field strength in a given part of the track during passage of the car, but large fluctuations and total field reversals are to be avoided.

If the magnetic flux were to travel longitudinally in the track, rather than laterally, then one of two undesirable situations would arise. If there were no flux reversals in a part of the track during the passage of the car, that would imply that all the magnet poles on one end of the car are North, while the poles on the other end of the car are South poles. Then a cross-section perpendicular to the track length of track would have to support the entire magnetic flux that lifts the car, as must the cross-section of the magnetic flux return path through the levitation system on the car. If the magnetic poles on top of the car were to alternate between North and South some number of times along the length of the car, this would cut down on the cumulative buildup of longitudinal flux in the track but would also generate flux reversals in any given portion of the track during the passage of the car. Avoiding the horns of this dilemma, FIG. 16 illustrates a suspension and propulsion system that induces primarily vertical and lateral magnetic fields in the track. The illustrated design offers several advantages. First, the design minimizes the track volume transmitting flux. Second, by avoiding a left-right magnetic dipole and using instead using a symmetric dipole pair as illustrated, with flux traveling from center to left and right, the design achieves a magnetic quadrupole, whose magnetic field has a much shorter range into the environment than a dipole field. Third, the design minimizes temporal flux variation in any portion of the track as the car passes, thus making it practical to fabricate the track from ordinary solid iron or steel, without laminations to inhibit eddy currents and without special alloying or heat treatment to minimize magnetic hysteresis. While AC magnetic variation is minimized in the track, magnetic variation is quite high in the motor magnets, whose fields must be varied in synchronization with vertical ripples in the track to produce thrust and braking. By design, demanding specifications for magnetic performance are moved away from the massive track investment toward a much smaller investment in motor materials.

Returning to FIG. 16, a row of eight magnet sections, 1600, 1601, 1602, 1603, 1604, 1605, 1606, and 1607, is shown levitated below track 1610 and aligned to that track. The track itself has the form of an I-beam whose attracting bottom surface is modified by a lateral convex rounding and longitudinal sinusoidal rippling, the rounding to allow for banking in turns and the rippling to be used for propulsion. That rippling is seen in the sinusoidal curvature of the track edge represented by line 1612. The illustration shows four magnet sections per wavelength of ripple in the track, implying a four-phase propulsion motor. A practical minimum of about three magnet sections per wavelength is desirable for smooth three-phase propulsion with low vibration, while a higher longitudinal subdivision of the motor magnets per track wavelength results in less ripple of the magnetic field induced in any given portion of the track as the levitating system passes by. Each magnet section in the four-phase propulsion system illustrated consists of a ferromagnetic core piece and a winding, as labeled for the components of section 1607. The end of the core is seen as rectangular parts 1616 on the left, 1618 in the middle, and 1620 on the right. These three parts are joined by a bridge across the bottom middle region 1607, between the downward bending lobes of the winding seen on the forward lobe side at 1622 (viewed in perspective as nearer the viewer) and on the aft lobe side at 1624, which abuts the forward lobe of the adjacent section at 1606. Middle core piece 1618 forms one magnet pole (north or south) while outer sections 1616 and 1620 form the opposite pole (south or north). The winding is seen to loop around the center section to produce this magnetic polarity differential, while the winding is bent down in the forward and aft lobes to allow for an unbroken surface along the top core area of 1618. The downward bending of the winding also allows each center section to abut its neighbor or neighbors on the ends. The abutting core sections do not actually touch, but are separated slightly either in the middle or at the outsides or both, to inhibit longitudinal flow of magnetic flux, for two reasons: to inhibit longitudinal "sloshing" of magnetic flux toward regions of narrower magnetic gap with track 1610; and to avoid magnetic short-circuiting of the independent coil drive sections, for pitch control and for generating propulsive magnetic waves. Preferably, the separation gaps between core sections are small enough, compared to the gap between the cores and track 1610, that the gaps cause only minor traveling discontinuities in the field strength induced in the track, while the gaps are also large enough to avoid excessive unwanted longitudinal conduction of magnetic flux.

While the motor sections 1600 through 1607 have been described as if lacking, permanent magnet components, permanent magnets are readily integrated into the motor sections, thereby permitting cancellation of the DC component of electric current needed in the drive windings. An alternative motor section geometry is illustrated in the upper-left region of FIG. 16, in the longitudinal elevation section indicated at 01—01 by the dashed line with end arrows of the upper right of the two cross sections and actually viewed on the upper right, and in the lateral elevation section indicated at 02—02 by the dashed line with end arrows of the upper left of the two cross sections and actually viewed on the upper right. Curved lower track surface 1614 is the same for both portions of the diagram and is therefore numbered the same, while the details of the motor section in two views on the upper left are different. The side lobes 1616 and 1620 of the core viewed in perspective are replaced by lobes 1617 and 1621 of a U-shaped channel whose relatively thin bottom section is seen at 1629 in both section views. Bridging from the bottom of the outer U-channel to the center section is a thin flat rectangular permanent magnet 1627, poled upward across the thin dimension as indicated by arrows. Following principles described above with reference to FIG. 15, this magnet has a low ratio of length (along the poling direction) to area, and operates at a low permeance coefficient, with the result that the increment in AC magnetic reluctance is kept low, in order to improve efficiency for generating propulsive magnetic waves traveling along the row of motor sections. Soft ferromagnetic component 1625 is seen to have a broad flat rectangular bottom for gathering flux from the permanent magnet and concentrating that flux into an ascending cylindrical section, around which is placed winding 1623, a simple spool full of wire as contrasted with the more complicated shape with bent-down lobes at 1622 and 1624. The flux from the top of the cylindrical portion of 1625 couples into rectangular center pole piece 1619, in which the flux spreads out longitudinally before bridging vertically up to surface 1614 and completing the magnetic circuit by bridging vertically back down into the sides of channel 1621. Observe the gaps between 1619 and its longitudinal neighbor on the left, and similarly for the neighbors to the left and the right of the comparable unlabeled motor section viewed in the middle of the group of three in longitudinal section. This gap is to retard unwanted leakage of flux between longitudinal motor sections. A gap is seen on the lateral left and right sides of magnetic conductor piece 1625, this gap intended to prevent excessive short-circuiting of the permanent magnet flux to the lower part of 1621, since the desired DC flux path is up through the winding and to bar 1619.

Calculations for practical vertical gaps to a suspending track (e.g., fluctuating between one and three centimeters) and a practical longitudinal wavelength (e.g., for 250 mile/hour propulsion with a track ripple wavelength on the order of 50 centimeters) and for a practical passenger car weight loading (e.g., on the order of 1000 pounds per longitudinal foot of the suspension system) indicate that the flux density bridging from the top of a component like bar 1619 to a component like surface 1614 of 1610, should be a comparatively small fraction of the saturation flux for iron, i.e. a comparatively small fraction of two Teslas. At higher flux densities, the concentration of force becomes so great as to demand a lateral width of a motor yoke piece such as 1629 that is not much larger (or even smaller) than the desired vertical gap to the track. For such a narrow lateral dimension, there is an excessive lateral leakage of flux, e.g., from 1619 directly across to 1617 and 1621, without much flux bridging vertically across to surface 1614 and through part of 1610. To prevent lateral short-circuiting of flux without generation of lift, the lateral width of the motor cannot be too small in relation to the vertical gap, and by implication, the upper surfaces of the motor need to operated at flux densities well below the saturation of iron. For maximum efficiency of a drive coil generating vertical lift corrections and propulsion, the center of the coil should be made as small as possible, so that the average circumference per winding is minimized. It therefore pays to concentrate the flux from the broad flat bottom magnet of the figure up into a small cylinder of magnetic material through the winding center before the flux spreads out again at the top for travel across the vertical magnetic gap to the track. The cross-section of the winding core should be made as small as possible, short of driving the peak flux density up to the saturation level of the material. By making the best system use of the permanent magnet material at a low permeance coefficient and of the winding core operated close to saturation, electromagnetic propulsive efficiencies of a system like that described here can be brought well above 80% and even well above 90%, dependent strongly on system requirements such as the thrust/lift ratio.

While a propulsion system may bear no relationship to the levitating suspension system, it is advantageous to share the two subsystems in a single magnetic assembly, as now described. Let the bottom surface of the suspending rail include a periodic vertical ripple along the track length, as drawn, e.g., with a wavelength of one-half meter and a peak amplitude of one centimeter with an average suspension gap of two centimeters, thus allowing a one centimeter minimum clearance at the ripple crests. (The ripple need not be smooth, but could consist of fine or coarse steps in track height, although coarse steps would generate more vibration harmonics in a motor than would a smooth ripple.) For control purposes, subdivide the signals associated with the magnetic actuation sections 1600 through 1607 into three functional groupings: a common mode grouping, with equal signal weighting and equal actuation to all the sections, for control of vertical height; a differential mode grouping, for a progression from negative to positive signal weighting and a similar progression for proportioning of actuation, for control of pitch; and a wave grouping, scaled to the ripple wavelength of the track, for generating traveling magnetic waves that engage the ripples in the track and generate propulsion. The wave grouping can divide the track wavelength by an integer, e.g., quarter wavelength for a four-phase propulsion system, though the electronics indicated in FIG. 16 do not depend on a fixed or integer relationship between track wavelength and motor section spacing. To produce forward propulsion, a given magnet section is energized to reinforce the permanent field, and thus increase the magnetic attraction, when the magnetic gap to the track is closing, and conversely, the section is energized with the reverse polarity to buck the permanent field, and thus reduce attraction, when the gap is opening. Since the force vector from a magnet to the track tilts forward when the gap is closing and backward when the gap is opening, a synchronized variation in magnetic force can emphasize the forward-tilting lift force vector or, with a polarity reversal, emphasize the backward-tilting lift force vector, resulting in thrust or braking. The AC variation in magnetic flux for a given motor section can be synchronized to the slope of the effective magnetic gap X to the track, based on a difference in inductive measurements comparing the motor sections on either side of a given motor section, as illustrated at the bottom of FIG. 16. As mentioned above, an approach working with all actuators simultaneously reduces gap data to time-varying spatial sine and cosine components, which are fed back to drive windings with appropriate phase and amplitude for desired thrust or braking.

The electronic schematic shown in the lower portion of FIG. 16 illustrates how the three groupings work. Function block 1636, repeated eight times for the index "i" running from 0 to 7, receives induced voltage sense signals Vsi at 1632, generates drive voltages Vdi at 1634, generates effective magnetic gap output signals Xi at 1640, and receives inputs $\Phi$tgti for flux servo control targets at 1638. The principles for producing such control modules are found in the earlier embodiment descriptions of this Specification, allowing for various combinations of approaches using current sensing and induced voltage sensing, as well as allowing for well known methods of auxiliary sensing such as the use of Hall effect devices. Block 1636 implements the "inner" fast control loop that varies switching regulator output voltage to cause measured magnetic flux to track a target value of flux with mininimal phase delay. The operation of this loop is interpreted, e.g., as described with reference to the circuit of FIG. 12, to generate a signal indicating the effective magnetic gap X, which is an output of 1636 used as a sense variable in the slower outer loops for levitating suspension, controlling average height and longitudinal tilt. Gap X is also used for synchronization of propulsive magnetic waves. The connection between motor sections 1600 through 1607 and 1636 is via drive winding wire pairs like 1628 from 1607, via sense winding pairs like 1626 from 1607, all communicating via 32-wire bus or cable 1630, which splits into two 16-wire buses or cables for the eight wire pairs providing the eight sense inputs Vsi at 1632 and eight drive outputs Vdi at 1634. Below 1636 in the diagram, eight-wide buses at 1642, 1644, 1686, a674, and 1658, and at bus connections 1646, 1662, 1676, 1680, and 1638, carry signals for the eight channels operating motor modules 1600 through 1607. The circuit modules drawn represent groupings of eight similar or identical circuits, one for each motor module. The three rows of modules below and to the right of 1636 represent feedback paths for the three groupings of sensors, going from top to bottom, for differential mode, for common mode, and for periodic wave grouping to generate thrust.

Examining first the differential mode or tilt-control outer feedback loop, position information Xi from 1636 communicates via output 1640 on bus 1642 to input 1646 into summing module 1648, which produces a single channel or scalar output on 1650 representing a weighted sum of the eight inputs. The weighting factor for each input is the input index minus the average of the set of eight indices, a factor whose values are −3.5, −2.5, −1.5, −0.5, 0.5, 1.5, 2.5, and 3.5, factors varying in proportion to the distance of a given module center from the center of the group of eight. The output on 1650 enters module 1652, labeled "PIDdiff" and generating the Proportional, Integral, Differential transfer function for closing the servo loop in its differential mode for tilt control. The output of 1652 via 1654 to module 1656, called Xdiff at 1656, generates a set of eight proportioned drive outputs with the same eight relative weighting factors used in module 1648, the outputs emerging via bus 1658 and connecting to an input of "SUM" module 1660. The differential mode signal, summed with other signals on each of the eight output leads from 1660 via bus 1644, provides eight-wide input 1638 to module 1636, this input setting the set of target magnetic fluxes for the inner servo loop. Thus, a distribution of fluxes and magnetic forces is produced that dynamically corrects errors in levitating tilt.

The common mode levitation feedback path operates similarly to the differential mode path just described, but lacks the separate channel weighting factors. The Xi signals on bus 1642 communicate via input 1662 with summing module 1664, whose scalar output on 1665 varies in proportion to the effective magnetic gap X averaged over index "i" for the eight actuation modules. Unity difference amplifier 1666 accepts the 1665 signal as an input with +1 weighting and subtracts from this a target X, "Xtgt" on input wire 1668 and with −1 weighting as labeled. The difference or error-X signal from 1666 on 1670 connects to common-mode PIDcmd transfer function module 1672, whose operation is comparable to differential mode module 1652. The resulting output on eight-wide bus 1674 is eight identical signals going into SUM module 1660 to sum with comparable differential and propulsion wave signals for output bus 1644 back to 1636.

The propulsion wave feedback path takes the Xi signal on 1642 to input 1676 into differencing module 1678, whose normal operating mode is give, on output line i, the difference between $Xi+1$ and $Xi-1$, i.e. an indication of the slope of effective magnetic gap X at module i as indicated by a signal difference between the adjacent modules fore and aft of module i. The exception not indicated in the labeling of 1678 is for end modules, where the slope estimate is based on an extrapolation from one side only rather than both sides. On can, for example, look at a signal difference one period down the row from the end, or the negative of a signal difference a half period down the row, to estimate the slope at an end module. The slope signals emerge from 1678 on a bus terminating at input 1680 to variable gain module 1682, where each input Ai from the bus at 1680 is multiplied by thrust coefficient B from input 1684, generating the eight gain-controlled signals $Ai*B$ on 1686 to the input of SUM module 1660. One polarity of gain produces a positive magnetic thrust, while an opposite gain polarity produces negative thrust, resulting in regenerative magnetic braking. The three eight-wide bus inputs to 1660 give a single eight-wide output on 1644 to provide the eight target fluxes for the eight inner-loop magnetic servo circuits collectively controlled by the three outer-loop servos.

An alternative approach to actuator position sense and flux control weightings, for the thrust/braking degree of freedom, was mentioned above, namely, two sets of periodic sinusoidal and cosinusoidal weightings of position sense and flux control, extending over the entire set of control modules. A sinusoidal set of position weightings then drives a cosinusoidal set of flux control weightings, and a cosinusoidal set of position weightings drives a negative sinusoidal set of flux control weightings (as the derivative of the sine is the cosine and the derivative of the cosine is the negative sine), so that waves of field strength variation along the row of electromagnets are synchronized to slope variations in vertical height of the track in order to produce fore and aft actuation forces for thrust and braking.

In addition to the phase-shifted weighted output signals for producing thrust and braking, electromagnetic power can be conserved if the magnetic flux of individual electromagnetic modules is not forced to remain constant, but instead is allowed to vary inversely as the effective time-varying gap (called X or Xeff throughout this Specification) for variations associated with track ripple. In effect, individual control modules should be operated to correct collective errors in height and fore/aft pitch angle, but should not be operated to minimize flux variations tending to occur in individual modules, in the absence of corrective application of AC coil power, due to track ripple. Thus, a two-phase controller generating waves in flux strength, traveling along a row of electromagnetic modules, can be caused to generate in-phase waves in target flux that minimize corresponding in-phase waves of coil current (allowing the field to vary as it depends passively on the interaction of pennanent magnets and a time-varying flux gap, as if the drive windings were absent or open-circuited), while simultaneously generating quadrature-phase waves in target flux to generate desired thrust or braking forces. Alternatively, to minimize power squandered on unnecessary compensation for traveling waves of flux strength caused by track ripple, individual electromagnet control modules can be cross-coupled with neighbors so that flux perturbations of certain wavelengths do not cause either corrective current actuation or passively induced currents that would be impeded by electrical resistance and thus cause the kind of damping and energy loss associated with shorting the windings of pennanent-magnet motors. The action of such cross-coupling must then be reconciled with control to produce intentional actively-driven waves of magnetic field strength for generation of thrust and braking.

It is noted that the wavelength and amplitude of vertical track ripple might be varied along the track length, e.g., to give a greater slope amplitude in regions where large forces will be required for accelerating and decelerating near a stop, or for generating extra thrust to climb grades in the track, or to give a lesser slope amplitude in regions where less thrust or braking is required and where power losses are reduced by a reduction in track ripple slope. If the track is designed for variable ripple wavelength, then the control system over thrust and braking must be capable of adapting its groupings and weightings of control modules in order to adapt to changing track ripple wavelengths. Microprocessor control and DSP (Digital Signal Processor) control components are appropriate tools for implementation of such adaptive control over multiple modules.

Finally, various examples from prior art, e.g., Morishita (U.S. Pat. No. 5,477,788), teach a suspension system of springs and dampers to decouple the considerable inertia of the car from the lesser inertia of the levitation magnets. Control problems arise when individual electromagnets are independently suspended. A simpler system attaches all the electromagnets lifting a car to a single rigid frame, which in turn is decoupled from the car by a spring suspension. A mechanical suspension allows the lifting magnetic modules more easily to follow irregularities in the track, allowing the path of the car to be corrected more smoothly and slowly through the suspension. It is recognized that the control system must prevent modules from "fighting" one another "trying" to achieve some unachievable motion, e.g., as prevented by coupling of the modules to a rigid frame. In the scheme illustrated and discussed with reference to FIG. 16, the control for each individual magnet is not a full levitation system, but rather a force-control or flux-control system, responsive to a sum of signal inputs from a group controller. The outputs from this controller are designed to operate on the allowed degrees of freedom of the system, e.g., vertical motion, pitch angle, and forward motion, without exciting useless patterns of actuation. As described above, specific correction is made to prevent individual modules from responding to the intentionally built-in track ripple with an energy-wasting actuation pattern to maintain constant flux with the varying gap. With a suspension system (not shown in FIG. 16), the control system described herein gains the advantage of following track irregularities with less correction power. Excursion limit components such as rollers or skids, known in the art, are incorporated in the instant invention, while a mechanical suspension permits the levitation magnets to follow larger track irregularities before the limit components come into play.

In the suspension and control systems described earlier, control of magnetic flux has been preferred to control of current in the inner control loop of a motion control servo, since actuation force is more linearly related to flux (roughly as a square law of flux) than to current (roughly as the square of a ratio of current to inductance). Control of current, like control of flux, shares the advantage over voltage control of generating low phase lag in the servo loop. In the case of multiple magnetic actuators controlling a lesser number of degrees of freedom of a car, and where corrective actuation of modules to compensate for track ripple is undesired, a controller approach is to have individual magnet modules cause current to track a target current, as opposed to causing flux to track a target flux. Magnetic flux information is provided, e.g. from sense coils or Hall effect sensors, by the separate modules, but flux control is achieved at the level of groupings of actuators, rather than for individual actuators. At a higher tier of the system, translational and rotational motion is controlled via control of groupings of flux at an intermediate tier. Thus, a three tier control system controls current and measures flux at the module level, controls patterns of flux and/or force at the intermediate level, and controls position and rotation at the highest level. Such a control system directly avoids wasteful current responses to track ripple at the level of individual modules, whereas a two-tier system with flux control at the lower tier relies on corrective compensation going from the group controller to the individual modules.

Servo for Automotive Valve System

The systems described for solenoid control with soft landing can be applied to the control of automotive valves, resulting in the complete elimination of the cam shaft and mechanical valve lifters. With an automotive valve, one needs quick acceleration and deceleration of the valve, closure of the valve with a minimum of impact, and significant holding force for both open and closed positions. For tight servo control at closure, an advantageous solenoid configuration is normally open, held by spring bias, with mechanical valve closure taking place at a very small magnetic gap, where servo control is at its best precision. The nonlinear control systems of either FIG. 7 or FIG. 12 will be preferable to the more approximate "economy" methods for the better control afforded. As provided with the FIG. 12 system, the servo will need dynamic rebiasing under the rapidly changing load conditions associated with changing engine speed and power, and the associated accelerations and dynamic gas flow pressures acting on the valve. A valve may, under dynamically changing conditions, fall initially slightly short of closure, or impact slightly, without damage, as long as small errors are detected and corrected in subsequent operations without allowing operating errors to become large. The magnet core should support high flux for a high acceleration capability, as required at high engine RPMs, indicating a metal core, either powder or fine laminations (or metal tape), as opposed to ferrites. For efficient cruising at moderate speeds, an engine control computer may idle one or more individual cylinders by cutting off fuel intake and holding the exhaust valve continuously open, allowing the idled cylinder to breathe with no compression, by analogy to the operation of early gasoline engines lacking a throttle and operating by pulses of full power alternating with multiple idling revolutions with an open exhaust valve. In the modern setting, operating cylinders will be subject to continuous power control by fuel injection, while other cylinders can remain idled until needed to meet an increased power demand.

We claim:

1. A system for controlling an electromagnetic solenoid including an armature and one or more windings, the system comprising:

a. measurement means couplable to said solenoid for obtaining a position measurement of said armature;

b. means for setting a target flux associated with said solenoid as a function of said measurement; and c. means for maintaining a solenoid magnetic flux associated with operation of said solenoid near said target, said means including a circuit arrangement which detects an oscillatory slope of a current supplied to the one or more windings, which develops a ratio based on the amount of current being supplied to the one or more windings and the oscillatory slope, and which controls the amount of current with respect to the ratio.

2. The system of claim 1, wherein said means for maintaining said solenoid magnetic flux includes amplifier means for controlling an electric current in at least one of said one or more windings.

3. The system of claim 2, wherein said means for obtaining said position measurement includes means for inferring an approximate ratio of said electric current to said solenoid magnetic flux.

4. The system of claim 3, wherein said approximate ratio is based on a sum of a constant plus a first linear term relating to said electric current plus a second linear term relating to said solenoid magnetic flux.

5. The system of claim 3, wherein said approximate ratio is based on a sum of a constant plus a first linear term relating to said electric current.

6. The system of claim 2 wherein said amplifier means includes a switching amplifier coupled to at least one of said one or more windings.

7. The system of claim 6, wherein said switching amplifier includes a voltage-switching output stage and a comparator input stage, said comparator input stage responding to an error difference between said solenoid magnetic flux and said target to produce an oscillation of variable duty cycle, said variable duty cycle causing said error difference to cross frequently through zero.

8. The system of claim 1, wherein said means for setting said target includes means for determining a magnetic force acting on said armature.

9. The system of claim 3, wherein said means for determining said magnetic force is part of servo means for controlling a position of said armature.

10. The system of claim 8, further comprising derivative control means, responsive to a rate of change in said position measurement, to generate a damping variation in said magnetic force.

11. The system of claim 8, further comprising integral control means, responsive to a persistent error in said position measurement, to generate an accumulating corrective variation in said magnetic force.

12. The system of claim 1, further comprising:

a. means for measuring from at least one of said one or more windings an induced voltage indicative of a time derivative of said solenoid magnetic flux;

b. means for measuring net variations in said solenoid magnetic flux by way of time integration of said induced voltage; and, c. means for ensuring that said net variations in said solenoid magnetic flux substantially match said target.

13. The system of claim 12, further comprising:

a. means for determining time-integral measures of said current through said one or more windings;

b. means for determining sums of said time integral measures and said net variations; and c. means for ensuring that said sums substantially match said target.

14. The system of claim 1, wherein said means for determining said measurement of said position includes a sensor separable from said solenoid.

15. The system of claim 14, wherein said sensor includes a hall-effect sensor.

16. The system of claim 1, wherein said means for maintaining said solenoid magnetic flux includes a hall-effect sensor.

17. A system for controlling an electromagnetic solenoid including an armature and one or more windings, the system comprising:
 a. means for detecting an oscillatory slope of an electric current in at least one of said one or more windings; and
 b. control means, responsive to said oscillatory slope and to a ratio of the current divided by the oscillatory slope, for controlling the electric current and for said ratio to vary as a function of the oscillatory slope.

18. The system of claim 17 wherein said control means comprises amplifier means for controlling the electric current in at least one of said one or more windings.

19. The system of claim 17, wherein said control means includes means responsive to a transfer function of said oscillatory slope, wherein the transfer function includes at least one of: a proportional term, a time-integral term, and a band-limited derivative term.

20. The system of claim 17, wherein said control means includes means for causing the square of said ratio to vary in proportion to a transfer function of said oscillatory slope.

21. The system of claim 17 further comprising:
 a. means for generating a difference of weighted sums of logarithms of the current, the magnetic flux, the oscillatory slope, and a bias signal of said control means; and
 b. means for controlling the current in response to the signal difference varying as a function of the weighted sums of the logarithms.

22. A solenoid having a core of a material which minimizes core loss at a predetermined frequency comprising:
 a. a drive coil;
 b. an armature capable of movement within said drive coil;
 c. a yoke coupled to said drive coil, wherein said yoke is positioned in relation to said armature such that there is at least one air gap between said yoke and said armature; and
 d. control means including a drive coil controller coupled to said drive coil, wherein said control means regulates movement of said armature within said drive coil based upon measurements of current and an oscillatory characteristic of the current from said drive coil.

23. The solenoid as claimed in claim 22, wherein said control means includes means for measuring a position of said armature and delivering to said drive coil controller said armature position measurement.

24. The solenoid as claimed in claim 22, wherein said control means includes means for measuring a magnetic flux of said drive coil and deriving from said magnetic flux a position measurement of said armature for delivery to said drive coil controller.

25. The solenoid as claimed in claim 22, further comprising a sense coil proximate to said drive coil, wherein said sense coil is used to independently determine said position measurement of said armature.

26. The solenoid as claimed in claim 25, wherein said control means includes a voltage-switching amplifier coupled to said drive coil for controlling movement of said armature.

27. The solenoid as claimed in claim 25, wherein said control means includes a first servo control loop means for determination of position of said armature, and a second servo control loop means related to a determination of force for regulating a drive pulse transmitted by said drive coil controller.

28. The solenoid as claimed in claim 25, wherein said first servo control loop means is coupled to said second servo control loop means.

29. A solenoid comprising:
 a drive coil;
 an armature capable of movement within said drive coil;
 a yoke coupled to said drive coil, wherein said yoke is positioned in relation to said armature such that there is at least one air gap between said yoke and said armature;
 control means including a drive coil controller coupled to said drive coil, wherein said control means regulates movement of said armature within said drive coil based upon electrical measurements from said drive coil; and
 launch control means for computing and initiating drive coil signals for movement of said armature with minimal electrical power consumption.

30. The solenoid as claimed in claim 29, wherein said launch control means further includes a comparator designed to compare a position of said armature with a set of pre-defined armature positions so as to define a termination operation of said drive coil.

31. The solenoid as claimed in claim 30, including means for identifying a starting position of said armature and internal calibration means.

32. The solenoid as claimed in claim 31, wherein said solenoid is a pump actuator and wherein the solenoid is controlled by a circuit which identifies, based on the position of the armature, the content of the fluid being pumped by the pump.

33. The solenoid as claimed in claim 31 further comprising means for delivering a drive pulse to said drive coil sufficient to force near closure of said gap between said armature and said yoke.

34. The solenoid as claimed in claim 33, further comprising means for delivering a secondary drive pulse to said drive coil to force movement of said armature from near closure to complete closure.

35. The solenoid as claimed in claim 34, further comprising means for delivering a holding signal to said drive coil to maintain complete closure of said armature until delivery of a stop-holding signal.

36. The solenoid as claimed in claim 22, wherein said armature and said yoke have a design based on a pot core.

37. A method for controlling the duration of a drive pulse transmitted to a drive coil of a solenoid having an armature and a yoke so as to move said armature to a prescribed position, said method comprising the steps of:
 a. supplying a drive pulse to said drive coil for movement of said armature in relation to said yoke;
 b. determining a signal sensitive to movement of said armature;
 c. defining as a function of time a threshold for said signal sensitive to said movement;
 d. comparing said signal with said threshold; and
 e. terminating said drive pulse either when said signal substantially corresponds with said threshold, or when a predefined time limit is reached.

38. The method as claimed in claim 37 further comprising the step of coupling a sense coil to said yoke for determining said signal.

39. The method as claimed in claim 38, wherein the step of determining said signal includes the step of measuring a magnetic flux of said solenoid.

40. The method as claimed in claim 39 further comprising the step of determining an initial position of said armature prior to initiating said drive pulse by transmitting a probe pulse to said drive coil and sensing with said sense coil said magnetic flux of said solenoid.

41. The method as claimed in claim 4, wherein said initial position is determined from a ratio of a current through said drive coil and said magnetic flux measured by said sense coil.

42. The method as claimed in claim 41 further comprising the step of introducing a plurality of pre-defined threshold drive pulses based upon measured characteristics of said solenoid so as to define variable armature travel conditions.

43. The method as claimed in claim 38 further comprising the step of determining a minimum holding current to be supplied to said drive coil so as to maintain said armature in a fixed position.

44. The method as claimed in claim 37, wherein the step of determining said signal includes the step of measuring a current through said drive coil.

45. A solenoid comprising:

a drive coil;

an armature capable of movement within said drive coil;

control means including a drive coil controller coupled to said drive coil, wherein said control means regulates movement of said armature within said drive coil based upon electrical measurements from said drive coil; and wherein said solenoid is a reciprocating pump actuator which drives the pump, said solenoid further comprising means for identifying pre-loading of said armature through actuation of said drive coil.

46. The solenoid as claimed in claim 45, wherein the pump has a diaphragm which is flexed by a member rigid with the armature and which further comprises an inlet valve and an outlet valve which respectively control the inflow and outflow of fluid into a chamber which is in part formed by the diaphragm.

47. The solenoid as claimed in claim 46, wherein the solenoid is, when energized, arranged to pull the rigid member back away from the diaphragm against the bias of springs which are included in the solenoid and allow the diaphragm to expand in a direction which allows a volume of a variable volume chamber which is in part defined by the diaphragm, to increase.

48. The solenoid as claimed in claim 47, wherein the rigid member is withdrawn faster than the diaphragm expands and the amount of compliance which is sensed in the diaphragm by monitoring displacement characteristics of the rigid member when the rigid member is allowed to re-engage the diaphragm, is used as a parameter for determining the presence and/or amount of gaseous fluid which is entrained in a liquid fluid being pumped by the pump.

* * * * *